(12) United States Patent
Yamazaki et al.

(10) Patent No.: US 7,833,845 B2
(45) Date of Patent: Nov. 16, 2010

(54) MANUFACTURING METHOD OF SEMICONDUCTOR DEVICE

(75) Inventors: Shunpei Yamazaki, Setagaya (JP); Sachiaki Teduka, Atsugi (JP); Satoshi Toriumi, Ebina (JP); Makoto Furuno, Atsugi (JP); Yasuhiro Jinbo, Atsugi (JP); Koji Dairiki, Atsugi (JP); Hideaki Kuwabara, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 183 days.

(21) Appl. No.: 12/222,547

(22) Filed: Aug. 12, 2008

(65) Prior Publication Data

US 2009/0047761 A1 Feb. 19, 2009

(30) Foreign Application Priority Data

Aug. 17, 2007 (JP) ............................ 2007-213102

(51) Int. Cl.
*H01L 21/00* (2006.01)
*H01L 21/84* (2006.01)

(52) U.S. Cl. ...................... 438/149; 438/30; 438/96; 438/680; 257/E21.17; 257/E21.32; 257/E21.051; 257/E21.058; 257/E21.077; 257/E21.189; 257/E21.229; 257/E21.267; 257/E21.4; 257/E21.324; 257/E21.411; 257/E21.527

(58) Field of Classification Search ............... 438/149, 438/30, 31, 96, 97, 474, 475, 311, 142, 135, 438/680, 687, 688, 469, 513, 509, 905, 706; 257/E21.17, 51, 58, 77, 189, 229, 267, 32, 257/324, 4, 411, 527
See application file for complete search history.

(56) References Cited

U.S. PATENT DOCUMENTS

| | | | | |
|---|---|---|---|---|
| 4,265,991 A | * | 5/1981 | Hirai et al. | 430/64 |
| 4,409,134 A | * | 10/1983 | Yamazaki | 252/501.1 |
| 4,605,941 A | * | 8/1986 | Ovshinsky et al. | 430/84 |
| 5,571,571 A | | 11/1996 | Musaka et al. | |
| 5,591,987 A | | 1/1997 | Yamazaki et al. | |
| 6,607,790 B1 | | 8/2003 | Musaka | |

FOREIGN PATENT DOCUMENTS

JP 06-326026 11/1994
JP 07-254592 10/1995

* cited by examiner

*Primary Examiner*—David Nhu
(74) *Attorney, Agent, or Firm*—Eric J. Robinson; Robinson Intellectual Property Law Office, P.C.

(57) ABSTRACT

An object is to provide a manufacturing method of a microcrystalline semiconductor film with favorable quality over a large-area substrate. After forming a gate insulating film over a gate electrode, in order to improve quality of a microcrystalline semiconductor film formed in an initial stage, glow discharge plasma is generated by supplying high-frequency powers with different frequencies, and a lower part of the film near an interface with the gate insulating film is formed under a first film formation condition, which is low in film formation rate but results in a good quality film. Thereafter, an upper part of the film is deposited under a second film formation condition with higher film formation rate, and further, a buffer layer is stacked on the microcrystalline semiconductor film.

21 Claims, 39 Drawing Sheets

FIG. 39

| | flow rate of SiH4 | flow rate of H2 | film formation pressure | power source frequency | RF Power | electrode interval | Incubation Time | Growth Rate(Depo Rate) | distribution of film thickness |
|---|---|---|---|---|---|---|---|---|---|
| < measure > | [sccm] | [sccm] | [Pa] | [MHz] | [W] | [mm] | [min] | [nm/min] | [±%] |
| example 1 | 4 | 400 | 100 | 60 | 15 | 20 | 0.7 | 2.8 | 1.3 |
| example 2 | 4 | 400 | 100 | 13.56 | 80 | 30 | 0.4 | 4.8 | 1.3 |
| sample 1 | 4 | 400 | 100 | 13.56/60 | 60/20 | 30 | 0.8 | 6.3 | 1.8 |
| sample 2 | 4 | 400 | 100 | 13.56/60 | 40/40 | 30 | 0.3 | 5.5 | 2.1 |
| sample 3 | 4 | 400 | 100 | 13.56/60 | 20/60 | 30 | 0.0 | 3.6 | 1.7 |
| example 3 | 4 | 400 | 100 | 60 | 80 | 30 | 0.6 | 3.3 | 3.1 |

MANUFACTURING METHOD OF SEMICONDUCTOR DEVICE

This application is based on Japanese Patent Application serial no. 2007-213102 filed with Japan Patent Office on Aug. 17, 2007, the entire contents of which are hereby incorporated by reference.

BACKGROUND OF THE INVENTION

1. Field of the Invention

The present invention relates to a semiconductor device including a circuit, which is formed using a thin film transistor (hereinafter referred to as a TFT), and a manufacturing method thereof. For example, the present invention relates to an electronic device provided with, as a component, an electro-optical device typified by a liquid crystal display panel or a light-emitting display device having an organic light-emitting element.

Note that in this specification, a semiconductor device refers to all types of devices which can function by utilizing semiconductor characteristics. An electro-optical device, a semiconductor circuit, and an electronic device are all included in the category of the semiconductor device.

2. Description of the Related Art

In recent years, a technique for forming thin film transistors (TFTs) using a semiconductor thin film (a thickness of several tens of nm to several hundred nm) formed over a substrate having an insulating surface has been attracting attention. Thin film transistors have been widely applied to electronic devices such as ICs and electro-optical devices, and their development especially as switching elements in image display devices has been accelerated.

A thin film transistor using an amorphous semiconductor film, a thin film transistor using a polycrystalline semiconductor film, and the like are used as switching elements in image display devices.

In the case of the thin film transistor using an amorphous semiconductor film, an amorphous semiconductor film such as a hydrogenated amorphous silicon film is used; therefore, there is limitation on the process temperature, and heating at a temperature of greater than or equal to 400° C. at which hydrogen is detached from the film, intense laser beam irradiation by which surface roughness occurs due to hydrogen in the film, and the like are not performed. The hydrogenated amorphous silicon film is an amorphous silicon film whose electric characteristics are improved by bonding of hydrogen to dangling bonds and disappearance of the dangling bonds as a result.

Further, as a method of forming a polycrystalline semiconductor film such as a polysilicon film, a technique that includes the following steps is known: dehydrogenation treatment for reducing a hydrogen concentration is performed in advance to an amorphous silicon film so that the surface thereof can be prevented from getting rough, a pulsed excimer laser beam is processed into a linear shape by an optical system, and the dehydrogenated amorphous silicon film is scanned and irradiated with the linear laser beam so as to be crystallized.

The thin film transistor using a polycrystalline semiconductor film has advantages in that its mobility is two or more orders of magnitude greater than that of the thin film transistor using an amorphous semiconductor film and a pixel portion of a display device and peripheral driver circuits thereof can be formed over the same substrate. However, the process is more complex because of crystallization of a semiconductor film, compared to the case of using an amorphous semiconductor film; accordingly, there are problems in that the yield is decreased and the cost is increased.

The present applicant has disclosed an FET (field effect transistor) in which a channel formation region is formed of a semiconductor having a mixture of a crystalline structure and a noncrystalline structure in Patent Document 1 (U.S. Pat. No. 5,591,987).

In addition, as switching elements in image display devices, a thin film transistor using a microcrystalline semiconductor film has been used (Patent Document 2: Japanese Published Patent Application No. H4-242724 and Patent Document 3: Japanese Published Patent Application No. 2005-49832).

As a conventional method of manufacturing the above thin film transistor, a technique is known in which an amorphous silicon film is formed over a gate insulating film, a metal film is formed over the amorphous silicon film, and the metal film is irradiated with a diode laser beam so that the amorphous silicon film is changed into a microcrystalline silicon film (Non-Patent Document 1: Toshiaki Arai, et al., SID'07 Digest, 2007, pp. 1370-1373). According to this method, the metal film formed over the amorphous silicon film is to convert light energy of the diode laser beam into thermal energy, and the metal film needs to be removed later for completion of a thin film transistor. That is, this is a method in which the amorphous silicon film is heated only by conduction heating from the metal film to form the microcrystalline silicon film.

Other than the method of forming a microcrystalline semiconductor film by irradiating amorphous silicon with laser light, there is a method of forming a microcrystalline semiconductor film by a plasma CVD method. As a manufacturing method of a microcrystalline silicon film by a plasma CVD method, an invention is disclosed in which a frequency in a VHF (very high frequency) band that is 30 MHz or higher is used (Patent Document 4: Japanese Patent No. 3201492)

SUMMARY OF THE INVENTION

Liquid crystal panels are manufactured by processing a plurality of panels over a large-area glass substrate, which is called a mother glass, and then dividing them into panels with sizes that match sizes of television screens and computer screens. This is to reduce the cost per one panel, by taking out a plurality of panels form one mother glass. In the market for liquid crystal television sets, the screen size (panel size) is being rapidly increased and the retail price is being rapidly reduced. In order to improve productivity while accommodating these screen size increase and price reduction, size increase of the mother glass has been underway in recent years.

A typical size of a glass substrate around 1991, which is called the first generation, was 300 mm×400 mm. Thereafter, the size of the mother glass increased in the following manner: the second generation (400 mm×500 mm), the third generation (550 mm×650 mm), the fourth generation (730 mm×920 mm), the fifth generation (1000 mm×1200 mm), the sixth generation (2450 mm×1850 mm), the seventh generation (1870 mm×2200 mm), the eighth generation (2000 mm×2400 mm), the ninth generation (2450 mm×3050 mm), the tenth generation (2850 mm×3050 mm), and so on.

In this manner, when the mother glass, in other words a glass substrate is increased in size, the area of an electrode of a plasma CVD apparatus for forming a microcrystalline silicon film over the glass substrate also increases in size. In this case, when the substrate size is larger than a size around the sixth generation, the size of the electrode of the plasma CVD apparatus becomes close to a wavelength of a frequency of a high frequency power source. For example, a wavelength is 1100 mm when a power source frequency is 27 MHz; the wavelength is 500 mm when the power source frequency is 60 MHz; and the wavelength is 250 mm when the power source frequency is 120 MHz.

In such cases, the effect of a surface standing wave becomes very pronounced and the plasma density distribution in a reaction chamber of the plasma CVD apparatus becomes uneven. Consequently, a problem such as degradation of quality or unevenness of thickness of a thin film formed over the glass substrate occurs.

In view of such problems, an object of the present invention is to provide a manufacturing method of a microcrystalline semiconductor film by which a highly even microcrystalline semiconductor film is formed over large-are glass substrate. Another object is to provide a manufacturing method of a microcrystalline semiconductor film by which formation of a microcrystalline semiconductor film is performed efficiently. Further, another object is to provide a manufacturing method of a semiconductor device that has a higher electron field-effect mobility and a lower off-current value than a TFT using an amorphous silicon film. Still further, an object is to provide a manufacturing method of a semiconductor device that has higher reliability than a TFT that mainly uses an amorphous silicon film for a channel-forming region.

When manufacturing a thin film transistor including a microcrystalline semiconductor film over a large-area glass substrate, in order to improve quality and evenness of a semiconductor region that is formed in the initial stage of film formation, a microcrystalline semiconductor film is formed by generating glow discharge plasma by supplying two or more kinds of high-frequency powers with different frequencies. Further, a gate insulating film or the like is also formed by generating glow discharge plasma by supplying two or more kinds of high-frequency powers with different frequencies.

A first high-frequency power is power in a frequency band in which an effect of a surface standing wave is not exhibited and a high frequency of about 10 m or longer is applied as the wavelength, and then a second high-frequency power with a shorter wavelength is applied to the first high-frequency power. By superposed application of high-frequency powers with different frequencies (different wavelengths) to an electrode of a plasma CVD apparatus, density of plasma is increased and plasma is made to be even so that the effect of a surface standing wave does not occur.

Further, in forming a microcrystalline semiconductor film, a process is made to be suited for mass production by improving film formation rate by varying a film formation condition in multiple steps. For example, to improve the quality of the semiconductor region formed in the initial stage of film formation, a gate insulating film is formed over a gate electrode, and then a lower part of the microcrystalline semiconductor film near an interface with the gate insulating film is formed under a first film formation condition, which is low in film formation rate but results in a good quality film. Then, an upper part of the microcrystalline silicon film is deposited under a second film formation condition, which is high in film formation rate.

In order to reduce residual gas of oxygen, $H_2O$, or the like inside a vacuum chamber (reaction vessel) as much as possible in advance before film formation, the first film formation condition that is low in film formation rate but results in a good quality film is as follows. The ultimate minimum pressure is reduced to an ultra-high vacuum (UHV) region of $1\times10^{-10}$ to $1\times10^{-7}$ Torr (over about $1\times10^{-8}$ Pa and less than or equal to $1\times10^{-5}$ Pa), a source gas with high purity is introduced, and a substrate temperature during film formation is in a range of higher than or equal to 100° C. and lower than 300° C. Further, high-frequency power that does not exhibit an effect of surface standing wave and high-frequency power in the VHF band are both applied to form plasma. In other words, by superposed application, incubation time can be reduced significantly or can be eliminated, and evenness of film quality can be improved. In formation of a microcrystalline semiconductor film, sometimes a phenomenon occurs in which the film thickness of the microcrystalline semiconductor film does not increase along with the start of film formation, but for a while the film does not grow much at all, and then the rate of film growth suddenly increases after a certain amount of time has passed. This time between the start of film formation and the start of effective film growth is called "incubation time," and although this incubation time is short, there is a possibility of causing unevenness in film quality. Further, when there is such incubation time at the start of deposition of a film, there is a possibility that throughput of a process is reduced.

An aspect of the present invention disclosed in this specification is a manufacturing method of a semiconductor device including the following steps. A gate electrode is formed over a glass substrate having an insulating surface, an insulating film is formed over the gate electrode, the glass substrate is introduced into a vacuum chamber, and a source gas is introduced into the vacuum chamber. Then, in the vacuum chamber, a lower part of a microcrystalline semiconductor film is formed under a first film formation condition in which glow discharge plasma is generated by superposed application of a first high-frequency power having a frequency with a wavelength of 10 m or longer and a second high-frequency power having a frequency with a wavelength of shorter than 10 m, to an electrode that generates glow discharge plasma. Further, in the same vacuum chamber, an upper part of the microcrystalline semiconductor film is deposited under a second film formation condition in which at least one of substrate temperature, power, frequency, flow rate of source gas, and degree of vacuum is different from that under the first condition. Furthermore, a buffer layer is formed over the microcrystalline semiconductor film.

In the lower part of the microcrystalline semiconductor film obtained under the first film formation condition, the oxygen concentration is $1\times10^{17}$/cm or less. In formation of a microcrystalline semiconductor film, oxygen inhibits crystallization and may possibly act as a donor if it is taken in by a silicon film; therefore, oxygen is an impurity that should especially be reduced. The quality of the lower part of the microcrystalline semiconductor film obtained under the first film formation condition contributes to increase in on-current and improvement in electron field-effect mobility of a TFT that is formed later.

Further, it is preferable that before forming the microcrystalline semiconductor film, the vacuum chamber is baked (200° C. to 300° C.) in advance to remove a residual gas mainly containing moisture, which exists inside the vacuum chamber, so that the inside of the vacuum chamber has a pressure environment with a degree of vacuum that is in an ultra-high vacuum region. Furthermore, an inner wall of the vacuum chamber may also be heated (50° C. to 300° C.) during formation of the microcrystalline semiconductor film to promote a film formation reaction.

In addition, it is acceptable as long as a film formation rate under the second film formation condition is higher than that of the first film formation condition. For example, a flow ratio of silane gas to hydrogen gas is changed and the concentration of hydrogen may be reduced within a range that allows formation of the microcrystalline silicon film. Alternatively, the film formation rate under the second film formation condition may be increased by having a substrate temperature that is higher that that under the first film formation condition, for example, a substrate temperature of 300° C. or higher. Further alternatively, the film formation rate may be increased by having a larger power under the second film formation condition than that under the first film formation condition. Still alternatively, the film formation rate may be increased by adjusting an evacuation valve such as a conductance valve of the vacuum chamber so that the degree of vacuum under the second film formation condition is different from that under the first film formation condition.

Further, under the second film formation condition with a higher film formation rate than the first film formation condition, by supplying high-frequency power in the VHF band in pulses, abnormal growth of a powder body in a gas phase during film formation can be prevented. To suppress growth of the powder body, it is necessary to consider the mean residence time of a gas molecule, and oscillation frequency of a pulse may be about 1 to 100 kHz.

Furthermore, under the second film formation condition with a higher film formation rate than the first film formation condition, the inner wall of the vacuum chamber in which the microcrystalline semiconductor film is formed may be heated at a higher temperature than the substrate temperature, to form the microcrystal semiconductor film. If the substrate temperature under the first film formation condition is 100° C., by the inner wall of the vacuum chamber being at 150° C., the microcrystalline semiconductor film may be formed efficiently over a substrate surface with a lower temperature than the inner wall of the chamber.

Further, after the vacuum chamber is vacuum evacuated so that the atmosphere inside the vacuum chamber has a degree of vacuum that is over $1\times10^{-8}$ Pa and less than or equal to $1\times10^{-5}$ Pa, it is preferable that the inside of the vacuum chamber has an environment with a reduced residual oxygen concentration before introducing a substrate. The residual oxygen concentration may be reduced by introducing hydrogen gas or a rare gas to generate plasma, to remove a residual gas mainly containing moisture, which exists inside the vacuum chamber.

In addition, after the vacuum chamber is vacuum evacuated so that an atmosphere inside the vacuum chamber has a degree of vacuum that is over $1\times10^{-8}$ Pa and less than or equal to $1\times10^{-5}$ Pa, oxygen in the vacuum chamber may be reduced further before introducing the substrate by feeding silane gas into the vacuum chamber to react with residual oxygen in the vacuum chamber, to produce silicon oxide. Further, in order to prevent a metal element such as aluminum from entering during formation of the microcrystalline semiconductor film, before introducing the substrate, silane gas may be fed into the vacuum chamber in advance to generate plasma for performing a treatment to form a film on the inner wall (also called a "precoating treatment").

Because the film formation rate is low under the first film formation condition, when a film thickness is made to be thick in particular, film formation time becomes long; consequently, an impurity such as oxygen is easily mixed into the film. Accordingly, by sufficiently reducing oxygen and moisture in the vacuum chamber in this manner before introducing the substrate, an impurity such as oxygen is barely mixed into the film even when the film formation time is long, and this is important in terms of improving the quality of a microcrystalline silicon film that is formed later.

Further, after introducing the substrate and before forming the microcrystalline silicon film, in order to remove adsorbed water that is on the substrate, a rare gas plasma treatment such as argon plasma treatment, and a hydrogen plasma treatment may be performed to reduce the oxygen concentration in the microcrystalline to $1\times10^{17}$/cm or lower.

In this manner, sufficiently reducing oxygen and moisture that the substrate has after introducing the substrate is important in terms of improving the quality of the microcrystalline silicon film to be formed later.

Further, by changing from the first film formation condition of the initial stage of film formation (a first film formation period) to the second film formation condition of a later stage of film formation (a second film formation period) with a high film formation rate, a microcrystal is formed in the initial stage. Consequently, in the later stage, a high quality microcrystalline silicon film can be deposited with the microcrystal obtained in the initial stage as a nucleus. Furthermore, by forming the microcrystal in advance in the initial stage, the film formation rate in the later stage of film formation can be made to be high.

Compared to the amount of time it takes to obtain a desired film thickness by film formation under the first film formation condition alone, without changing the film formation condition along the way, the desired film thickness can be obtained in a shorter amount of time by performing film formation under the second film formation condition after film formation under the first film formation condition, in the same chamber. If the amount of time it takes to obtain the desired film thickness can be shortened, film formation can be performed with barely any impurity such as oxygen mixing into the microcrystalline silicon film. Further, when the film thickness of the microcrystalline silicon film is made to be thin by film formation under the first film formation condition alone, without changing the film formation condition along the way, there is a possibility that an effect of a buffer layer stacked later becomes significant and reduce the electron field-effect mobility of a thin film transistor.

In addition, since the microcrystalline silicon film obtained under the first film formation condition easily reacts to oxygen, by changing the film formation condition to the second film formation condition with a higher film formation rate along the way during film formation, the film near an interface with a gate insulating film can be protected. The quality of this microcrystalline silicon film obtained under the second film formation condition contributes to reduction of an off-current of a TFT that is formed later.

Such a microcrystalline silicon film obtained by varying the film formation condition in two steps includes at least column-like crystals and an oxygen concentration in the film is less than or equal to $1\times10^{17}$/cm. The total thickness of the microcrystalline silicon film obtained by varying the film formation condition in two steps is in the range of 5 nm to 100 nm, preferably, 10 nm to 30 nm.

If an initial film formation condition is a condition under which a high quality microcrystalline silicon film is formed, the microcrystalline silicon film is not limited to being formed under a film formation condition varied in two steps, and may be formed under a film formation condition that is varied in three or more steps. A continuous change in the film formation condition means that a level is changed continuously per unit time. For example, when the average flow rate of a source gas (such as a silane gas) which is introduced to a chamber is increased with time and a relation between the gas flow rate and time is plotted on a graph (a graph in which the vertical axis indicates a gas flow rate and the horizontal axis indicates time), the relation is represented by an upward straight line or an upward curve. Alternatively, when the flow rate of a silane gas or the like which is introduced to a chamber is fixed or increased, the average flow rate of another gas (such as hydrogen or a rare gas) is decreased with time, and when a relation between the flow rate of the other gas and time is plotted on a graph, the relation is represented by a downward straight line or a downward curve. The continuous change in film formation condition means that a film is formed over one substrate by changing film formation conditions at least without exposing the substrate to air.

The above microcrystalline silicon film is more sensitive to oxygen than an amorphous silicon film, and thus, it is preferably protected by stacking a buffer layer thereover which does not include crystal grains, without exposure to air. The buffer layer is formed in a vacuum chamber which is different from the one used for forming a microcrystalline silicon film, with a substrate temperature that is higher than that under the first and second film formation conditions, for example, greater than or equal to 300° C. and less than 400° C. It is effective that substrate temperature in formation of the buffer layer is higher than that under the first and second film formation conditions. This is because the microcrystalline silicon film can be annealed in formation of the buffer layer, resulting in no increase in the number of manufacturing steps, and the quality of the microcrystalline silicon film can be improved. By annealing of the microcrystalline silicon film in formation of the buffer layer, variation in TFT characteristics (such as variation in threshold voltage) in a reliability test in which voltage application is repeatedly performed can be suppressed, and reliability of the TFT can be improved. The buffer layer is formed with a thickness of 100 nm to 400 nm, preferably, 200 nm to 300 nm. In addition, the buffer layer is formed with an amorphous silicon film with higher defect density than the microcrystalline silicon film. By use of the amorphous silicon film with higher defect density for the buffer layer, off-current of a TFT which is formed later can be reduced.

The microcrystalline silicon film tends to have n-type conductivity by mixture of impurities; therefore, it is preferable that the film formation condition be adjusted. For example, a very small amount of a trimethyl boron gas or the like is added to the source gas, so that the microcrystalline silicon film becomes i-type. By addition of a very small amount of a trimethyl boron gas or the like to the source gas which includes mainly a silane gas and a hydrogen gas, threshold voltage of a thin film transistor can be controlled.

In this specification, the microcrystalline semiconductor film is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and column-like or needle-like crystals with a grain size of 0.5 nm to 20 nm grown in the direction of a normal line with respect to the surface of the substrate. In addition, a microcrystalline semiconductor and a non-single crystalline semiconductor are mixed. Microcrystalline silicon, which is a typical example of a microcrystalline semiconductor, has a Raman spectrum which is shifted to a lower wave number side than 520.5 $cm^{-1}$ that is a feature of single crystalline silicon. That is, the peak of a Raman spectrum of microcrystalline silicon is within the range 480 $cm^{-1}$ (that is a feature of amorphous silicon) to 520.5 $cm^{-1}$ (that is a feature of single crystalline silicon). In addition, microcrystalline silicon is made to contain hydrogen or halogen of at least greater than or equal to 1 at. % for termination of dangling bonds. Moreover, microcrystalline silicon is made to contain a rare gas element such as helium, argon, krypton, or neon to further enhance its lattice distortion, whereby stability is increased and a favorable microcrystalline semiconductor film can be obtained. Such a microcrystalline semiconductor film is disclosed in, for example, U.S. Pat. No. 4,409,134.

The buffer layer may also be formed in the same vacuum chamber as that for forming the microcrystalline silicon film, although throughput is reduced when a plurality of large-are substrates are treated. When the buffer layer is formed in the same vacuum chamber, an interface between the layers can be formed without being contaminated by a contaminating impurity that is floating around, which is caused when the substrate is transferred; thus, variation in characteristics of the thin film transistor can be reduced. Because a large-area glass substrate takes more time in transferring compared to a small substrate, there is more of a possibility of a contaminating impurity attaching; therefore, it is useful to form in the same vacuum chamber.

In addition, a source electrode and a drain electrode are formed over the buffer layer, and a groove is formed in the buffer layer in order to decrease a leak current between the source electrode and the drain electrode.

A semiconductor film containing an n-type impurity element ($n^+$layer) is provided between the buffer layer and the source and drain electrodes. The buffer layer is provided between the $n^+$layer and the microcrystalline silicon film so as to prevent contact therebetween. Therefore, the $n^+$layer, the buffer layer, and the microcrystalline silicon film are stacked below the source electrode. In a similar manner, the $n^+$layer, the buffer layer, and the microcrystalline silicon film are stacked below the drain electrode. With such a layered structure and a large thickness of the buffer layer, withstand voltage of the thin film transistor can be improved. Further, with a large thickness of the buffer layer, a groove can be formed in a part of the buffer layer without exposing the microcrystalline silicon film which is easily oxidized.

After the above manufacturing process, a semiconductor film containing an n-type impurity element is formed over the buffer layer, source and drain electrodes are formed over the semiconductor film containing the n-type impurity element, the semiconductor film containing the n-type impurity element is etched to form source and drain regions, and a part of the buffer layer is etched and removed such that regions overlapping the source and drain regions are left remaining, to form a thin film transistor.

In the thin film transistor which is obtained as described above, when it is turned on, a region near an interface with the gate insulating film in the microcrystalline silicon film with high quality which is formed under the first film formation condition serves as a channel formation region. When the thin film transistor is turned off, a groove which is obtained by etching a part of the buffer layer serves as a path where a very small amount of a leak current flows. Accordingly, compared to a conventional thin film transistor including a single amorphous silicon layer or a conventional thin film transistor including a single microcrystalline silicon layer, a ratio of off-current and on-current can be increased and switching characteristics are favorable, which lead to improvement in contrast of a display panel.

By generating plasma through supplying high-frequency power that does not exhibit an effect of surface standing wave and high-frequency power in the VHF band in accordance with a manufacturing method of the present invention, a semiconductor device using an even and good quality microcrystalline semiconductor film as a channel-forming region can be manufactured over a large-area glass substrate with a long side that has a length of 2000 mm. A thin film transistor that is obtained can have an electron field-effect mobility that is greater than 1 and less than or equal to 50. Therefore, a thin film transistor using the microcrystalline semiconductor film which is obtained according to the manufacturing method of the present invention has a current-voltage characteristic represented by a curve with a steep slope in a rising portion, has an excellent response as a switching element, and can be operated at high speed.

A light-emitting device using the thin film transistor that is obtained according to the manufacturing method of the present invention can suppress variation in threshold voltage of thin film transistors, which leads to improvement in reliability.

In addition, a liquid crystal display device using the thin film transistor which is obtained according to the manufacturing method of the present invention can increase field-effect mobility and thus can increase a driving frequency of a driver circuit. Since he driver circuit can be operated at high speed, a frame frequency can be quadruplicated or black frame insertion can be realized

BRIEF DESCRIPTION OF DRAWINGS

In the following drawings:

FIG. 39 is a table that shows experiment results of film formation performed by superposing high-frequency powers with different frequencies on each other.

DETAILED DESCRIPTION OF THE INVENTION

Embodiment Mode

Embodiment modes of the present invention will be described below. Note that the present invention can be implemented in various modes, and it is easily understood by those skilled in the art that modes and details thereof can be modified in various ways without departing from the spirit and the scope of the present invention. Therefore, the present invention should not be interpreted as being limited to the following description of the embodiment modes.

Embodiment Mode 1

Figure 4:
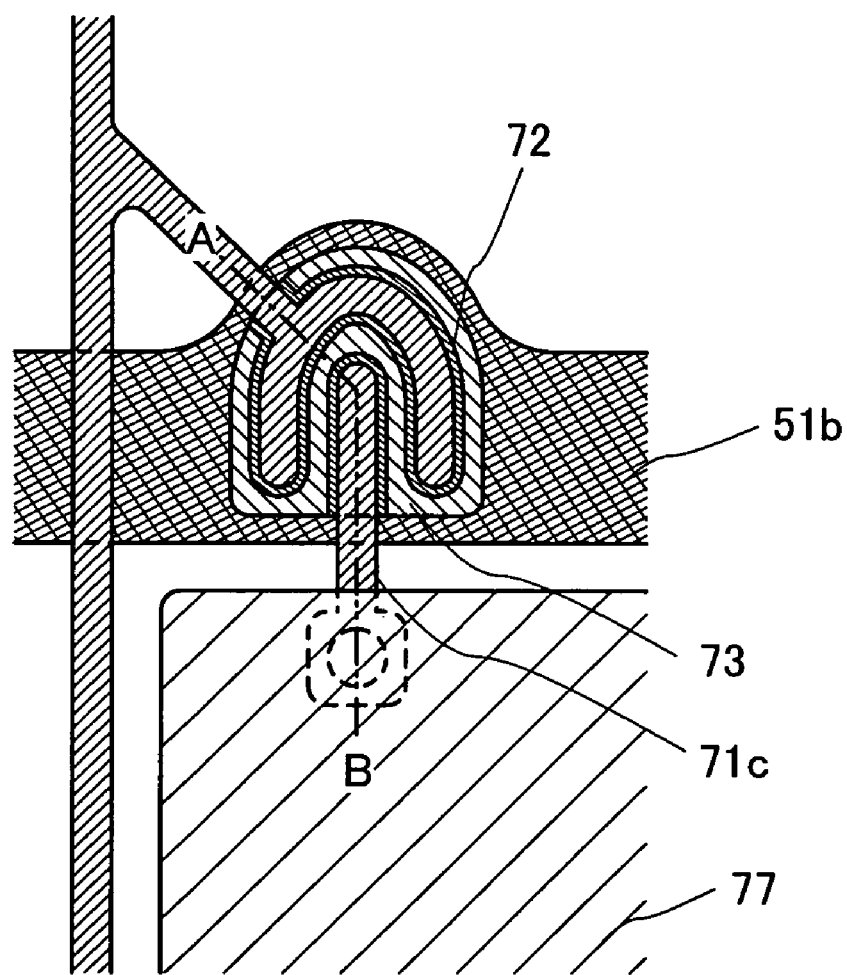
FIG. 4 is a top view describing a manufacturing method of the present invention.
Figure 5:
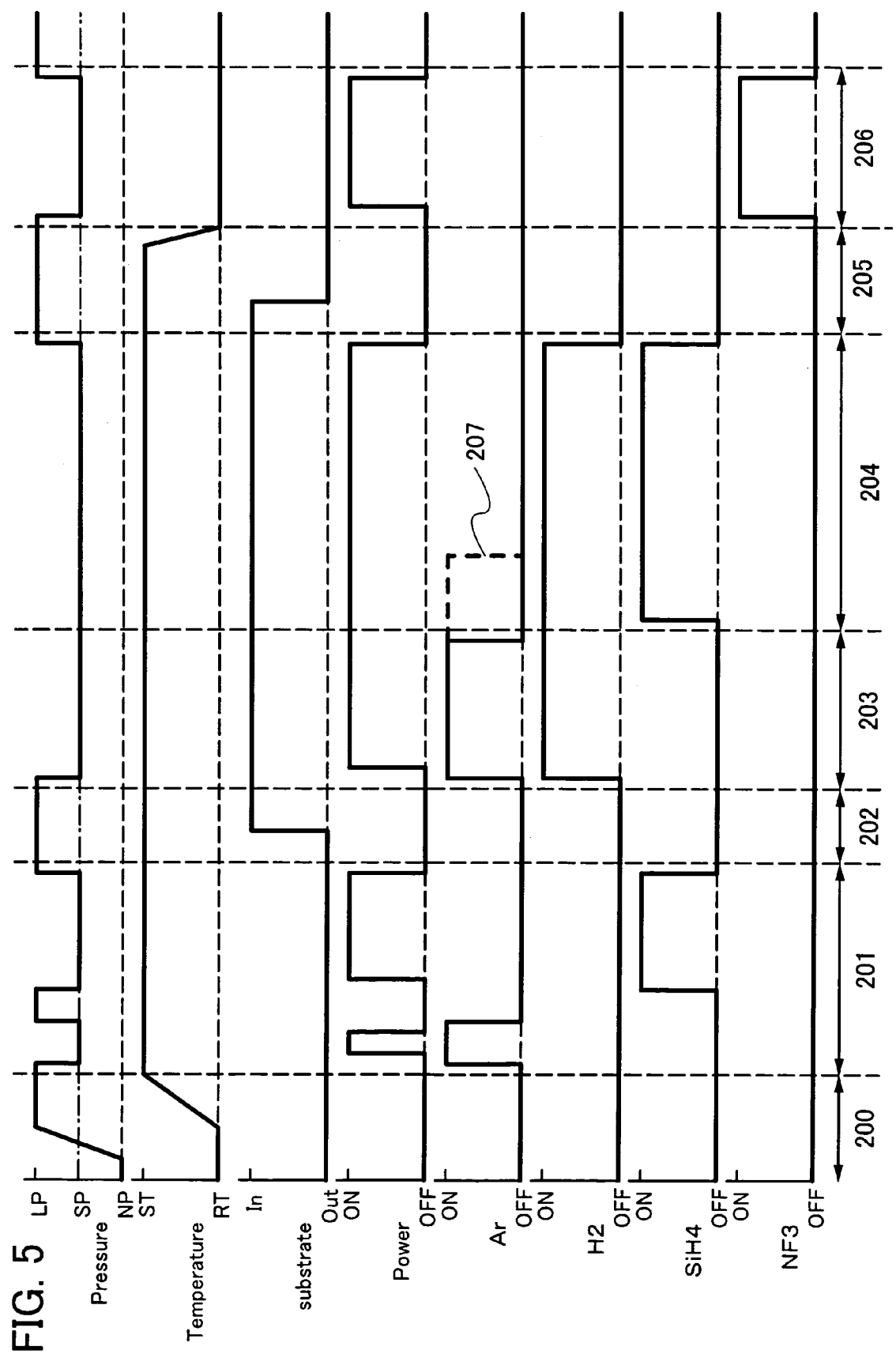
FIG. 5 diagram showing an example of a time chart describing a process for forming a microcrystalline silicon film.
Figure 6:
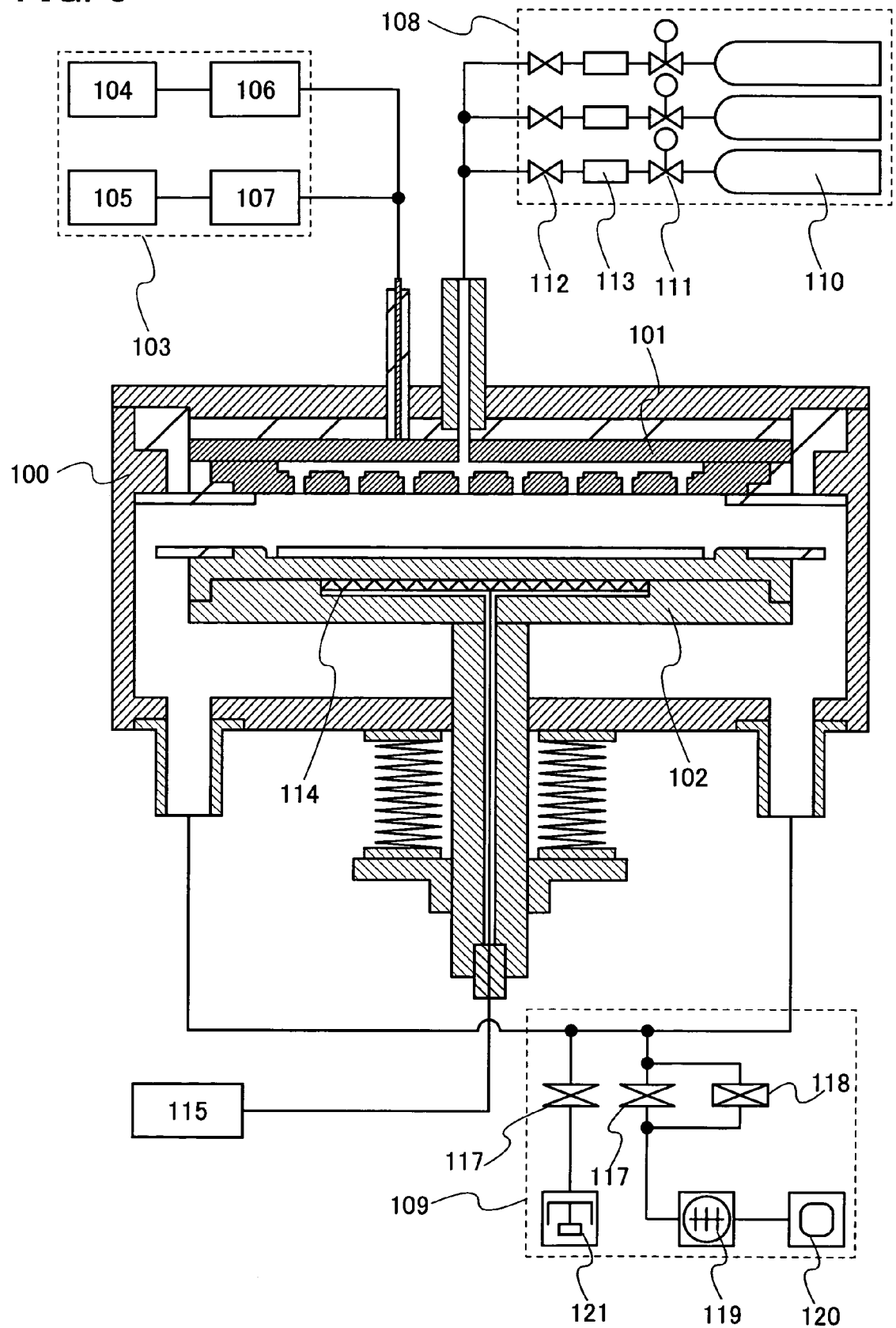
FIG. 6 is a diagram describing a structure of a reaction chamber in which a plurality of types of high-frequency powers are applied to one electrode.

In this embodiment mode, a manufacturing process of a thin film transistor used for a liquid crystal display device is described with reference to FIGS. 1A to 1D, FIGS. 2A to 2D, FIGS. 3A to 3C, FIG. 4, FIG. 5, and FIG. 6. FIGS. 1A to 1D, FIGS. 2A to 2D, and FIGS. 3A to 3C are cross-sectional views showing a manufacturing process of a thin film transistor, and FIG. 4 is a top view showing a connection region of a thin film transistor and a pixel electrode in a single pixel. Further, FIG. 5 is a timing chart showing a formation method of a microcrystalline silicon film, and FIG. 6 is a cross-sectional view showing a structural example of a plasma CVD apparatus capable of generating glow discharge plasma by supplying two or more kinds of high-frequency powers with different frequencies.

An n-channel thin film transistor having a microcrystalline semiconductor film is more suitable for use in a driver circuit than a p-channel thin film transistor having a microcrystalline semiconductor film, because the n-channel one has a higher electron field-effect mobility. It is desired that all thin film transistors formed over the same substrate have the same polarity, in order to reduce the number of steps. Here, description is made using an n-channel thin film transistor.

Figure 1A:
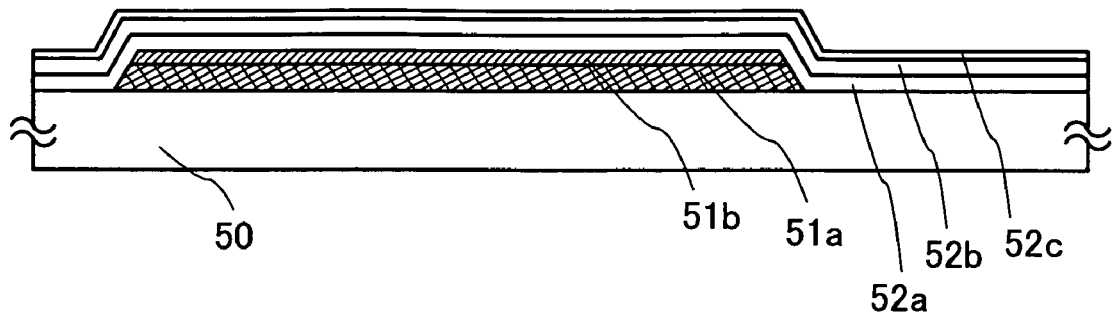
FIGS. 1A to 1D are cross-sectional views describing a manufacturing method of the present invention.

As illustrated in FIG. 1A, a gate electrode is formed over a substrate 50. As the substrate 50, any of the following substrates can be used: non-alkaline glass substrates made of barium borosilicate glass, aluminoborosilicate glass, aluminosilicate glass, and the like by a fusion method or a float method. When the substrate 50 is mother glass, the substrate may have any of the following sizes: the first generation (300 mm×400 mm), the second generation (400 mm×500 mm), the third generation (550 mm×650 mm), the fourth generation (730 mm×920 mm), the fifth generation (1000 mm×1200 mm), the sixth generation (2450 mm×1850 mm), the seventh generation (1870 mm×2200 mm), the eighth generation (2000 mm×2400 mm), the ninth generation (2450 mm×3050 mm), the tenth generation (2850 mm×3050 mm), and the like.

The gate electrode is formed using a metal material such as titanium, molybdenum, chromium, tantalum, tungsten, or aluminum or an alloy material thereof. The gate electrode can be formed in such a manner that a conductive film is formed over the substrate 50 by a sputtering method, a vacuum evaporation method, or a CVD method; a mask is formed over the conductive film by a photolithography technique or an inkjet method; and the conductive film is etched using the mask. Alternatively, the gate electrode can be formed by depositing a conductive nanopaste of silver, gold, copper, or the like using an inkjet method, and then baking the nanopaste. Note that, as barrier metal which improves adhesion of the gate electrode and prevents diffusion to a base, a nitride film of the above-mentioned metal material may be provided between the substrate 50 and the gate electrode. Here, the gate electrode is formed by etching of the stack of conductive films formed over the substrate 50 with use of a resist mask formed using a first photomask.

As a specific example of a gate electrode structure, a molybdenum film that becomes a second conductive layer 51b may be stacked over an aluminum film that becomes a first conductive layer 51a, to have a structure that prevents hillock and electromigration that are typical phenomena of aluminum. Since this embodiment mode describes an example of manufacturing a display device with a large display screen by use of a substrate with a large area, the gate electrode is formed by stacking the first conductive layer 51a made of aluminum, which has low electrical resistance, and the second conductive layer 51b, which has higher heat resistance than the first conductive layer 51a. Alternatively, the gate electrode may have a three-layer structure in which an aluminum film is sandwiched between molybdenum films. As other examples of the gate electrode structure, a stacked-layer structure in which a molybdenum film is stacked over a copper film, a stacked-layer structure in which a titanium nitride film is stacked over a copper film, and a stacked-layer structure in which a tantalum nitride film is stacked over a copper film, can be given.

Note that, because a semiconductor film and a wiring are to be formed over the gate electrode, it is desired that the gate electrode be processed so as to have tapered end portions in order to prevent disconnection. In addition, although not shown, in this step, a wiring connected to the gate electrode can also be formed at the same time.

Next, gate insulating films 52a, 52b, and 52c are formed in this order over the second conductive layer 51b, which is an upper layer of the gate electrode.

Each of the gate insulating films 52a, 52b, and 52c can be formed of a silicon oxide film, a silicon nitride film, a silicon oxynitride film, or a silicon nitride oxide film, by a CVD method, a sputtering method, or the like. In order to prevent an interlayer short-circuit caused by a pinhole or the like formed in the gate insulating films, it is preferable to form plural layers using different insulating layers. Here, a mode is described in which a silicon nitride film, a silicon oxynitride film, and a silicon nitride film are stacked in this order as the gate insulating films 52a, 52b, and 52c, respectively.

Note that a silicon oxynitride film is a film that contains more oxygen than nitrogen, and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film is a film that contains more nitrogen than oxygen, and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

Film thickness of each of a first layer and a second layer of the gate insulating films is to be thicker than 50 nm. The first layer of the gate insulating films is preferably a silicon nitride film or a silicon nitride oxide film, in order to prevent diffusion of an impurity (such as an alkali metal) from the substrate. Further, the first layer of the gate insulating films can prevent oxidation of the gate electrode and can also prevent hillock in the case of using aluminum for the gate electrode. A third layer of the gate insulating films that comes into contact with a microcrystalline semiconductor film is to have a thickness that is more than 0 nm and less than or equal to 5 nm, desirably about 1 nm. The third layer of the gate insulating films is provided to improve adhesion with the microcrystalline semiconductor film. Furthermore, by providing a silicon nitride film as the third layer of the gate insulating films, oxidation of the microcrystalline semiconductor film by a heat treatment or laser irradiation that is later performed can be prevented. For example, when an insulating film containing a high amount of oxygen is in contact with a microcrystalline film and a heat treatment is performed, there is a possibility of the microcrystalline film becoming oxidized.

Further, it is preferable that the gate insulating films are formed by using a microwave plasma CVD apparatus with a frequency of 1 GHz. A silicon oxynitride film and a silicon nitride oxide film formed with a microwave plasma CVD apparatus have high withstand voltage, and can improve reliability of a thin film transistor.

In this embodiment mode, it is preferable to perform a base pretreatment by a rare gas plasma treatment, a hydrogen plasma treatment, or a combination of both, and then perform a film formation treatment. Further, it is preferable that the inside of a reaction chamber is coated with a thin film that is of the same kind as the gate insulating films in advance. This is so that a metal impurity or the like in the inner wall of the reaction chamber does not mix into the gate insulating films.

A silicon hydride gas such as silane and a gas containing oxygen or nitrogen are used as reaction gases. Glow discharge plasma is generated by application of high-frequency powers in an HF band (3 MHz to 30 MHz, typically 13.56 MHz) and the VHF band (30 MHz to 300 MHz) that are superposed on each other. By application of high-frequency powers in different frequency bands, plasma density can be increased as well as improve internal uniformity of plasma density in a substrate. A film formation temperature of the gate insulating film is preferably 200° C. to 400° C., and a dense insulating film with high withstand voltage can be formed by an increase in plasma density. A cross-sectional view up through this step is shown in FIG. 1A.

Although here, the gate insulating films employ a three-layer structure, a single layer of a silicon nitride film may be used in the case where a thin film transistor is used for a switching element of a liquid crystal display device, in which AC driving is performed.

After forming the gate insulating films, the substrate is transported without exposure to air, and a microcrystalline semiconductor film 53 is preferably formed in a vacuum chamber that is different from a vacuum chamber for forming the gate insulating films.

A procedure for forming the microcrystalline semiconductor film 53 is described below also with reference to FIG. 5. FIG. 5 shows the procedure starting from a step where vacuum evacuation 200 is performed in the reaction chamber that is under atmospheric pressure. Then, the following treatments are shown in chronological order: precoating 201, substrate installation 202, base pretreatment 203, film formation treatment 204, substrate removal 205, and cleaning 206. Note that the procedure is not limited to performing vacuum evacuation starting from atmospheric pressure, and it is preferable to maintain the reaction chamber under a certain degree of vacuum at all times in terms of mass production as well as in terms of reducing the ultimate vacuum in a short time.

In this embodiment mode, ultrahigh vacuum evacuation is performed in order to ensure a higher degree of vacuum than $10^{-5}$ Pa in the vacuum chamber before substrate installation. This step corresponds to vacuum evacuation 200 in FIG. 5. In the case of performing such ultrahigh vacuum evacuation, it is preferable to use a turbo-molecular pump and a cryopump. Evacuation is performed with the turbo-molecular pump, and vacuum evacuation is performed with the cryopump. It is also preferable to perform a heating treatment in the reaction chamber and perform a degassing treatment to the inner wall. In addition, a heater for heating the substrate is also operated to stabilize temperature. A heating temperature of the substrate is 100° C. to 300° C., preferably 120° C. to 220° C.

Next, precoating 201 is performed before substrate installation, and a silicon film is formed as an inner wall coating film. In precoating 201, after removing a gas (an atmospheric component such as hydrogen and nitrogen or an etching gas used in cleaning the reaction chamber) that is attached to the inner wall of the reaction chamber by generating plasma by introducing hydrogen or a rare gas, silane gas is introduced to generate plasma. Since silane gas reacts with oxygen, moisture, and the like, by introducing silane gas and generating silane plasma, oxygen and moisture in the reaction chamber can be removed. Further, by performing precoating 201, a metal element of a member constituting the reaction chamber can be prevented from entering the microcrystalline silicon film as an impurity. In other words, by covering the inside of the reaction chamber with silicon, the inside of the reaction chamber can be prevented from being etched by plasma, and the impurity concentration of the microcrystalline silicon film formed later can be reduced. Precoating 201 includes a treatment in which the inner wall of the reaction chamber is covered with a film that is of the same kind as a film to be deposited over the substrate.

After precoating 201, substrate installation 202 is performed. The substrate to which the microcrystalline silicon film is to be deposited is kept in a load chamber that is vacuum evacuated; therefore, the degree of vacuum in the reaction chamber is not degraded much even if the substrate is installed.

Next, base pretreatment 203 is performed. It is preferable that base pretreatment 203 is performed since it is a treatment that is particularly effective in the case of forming a microcrystalline silicon film. In the case of forming a microcrystalline silicon film over a glass substrate surface, an insulating film surface, or an amorphous silicon surface by a plasma CVD method, there is a possibility that an amorphous layer is formed in an initial stage of deposition due to an impurity or lattice mismatch. In order to reduce the thickness of this amorphous layer as much as possible, or to get rid of it if possible, it is preferable to perform base pretreatment 203. As base pretreatment 203, a rare gas plasma treatment, a hydrogen plasma treatment, or a combination of both is preferably performed. For the rare gas plasma treatment, it is preferable that a rare gas element with a large mass number such as argon, krypton, or xenon is used. This is so that an impurity such as oxygen, moisture, an organic substance, or a metal element that is attached to the surface is removed by a sputtering effect. The hydrogen plasma treatment is effective in that by hydrogen radicals, the above impurity that is adsorbed to the surface is removed, and a clean film formation surface is formed by an etching effect with respect to the insulating film or the amorphous silicon film. Further, by performing both the rare gas plasma treatment and the hydrogen plasma treatment, an effect of promoting growth of microcrystal nucleus can be expected.

In terms of promoting growth of microcrystal nucleus, it is effective to supply a rare gas such as argon continuously in the initial stage of forming the microcrystalline silicon film, as shown by a broken line 207 in FIG. 5.

Next, film formation treatment 204 for forming the microcrystalline silicon film is performed after base pretreatment 203. In this embodiment mode, a lower part of the microcrystalline silicon film near an interface with the gate insulating film is formed under a first film formation condition, which is low in film formation rate but results in a good quality film, and then an upper part of the microcrystalline silicon film is deposited under a second film formation condition, which is high in film formation rate. For example, film formation is performed under the first film formation condition which is superposed application of two types of high-frequency powers in different frequency bands, and then formation of a microcrystalline semiconductor film is continued after switching to the second film formation condition which is application of a third high-frequency power of 3 MHz to 30 MHz, and not superposed application. Alternatively, film formation is performed under the first film formation condition which is superposed application of the first high-frequency power and the second high-frequency power which has more power than the first high-frequency power, and then formation of a microcrystalline semiconductor film is continued after switching to the second film formation condition which is superposed application of a third high-frequency power which has more power than the first high-frequency power and a forth high-frequency power which has less power than the third high-frequency power. Note that the third high-frequency power has the same frequency as the first high-frequency power and the forth high-frequency power has the same frequency as the second high-frequency power.

Figure 7:
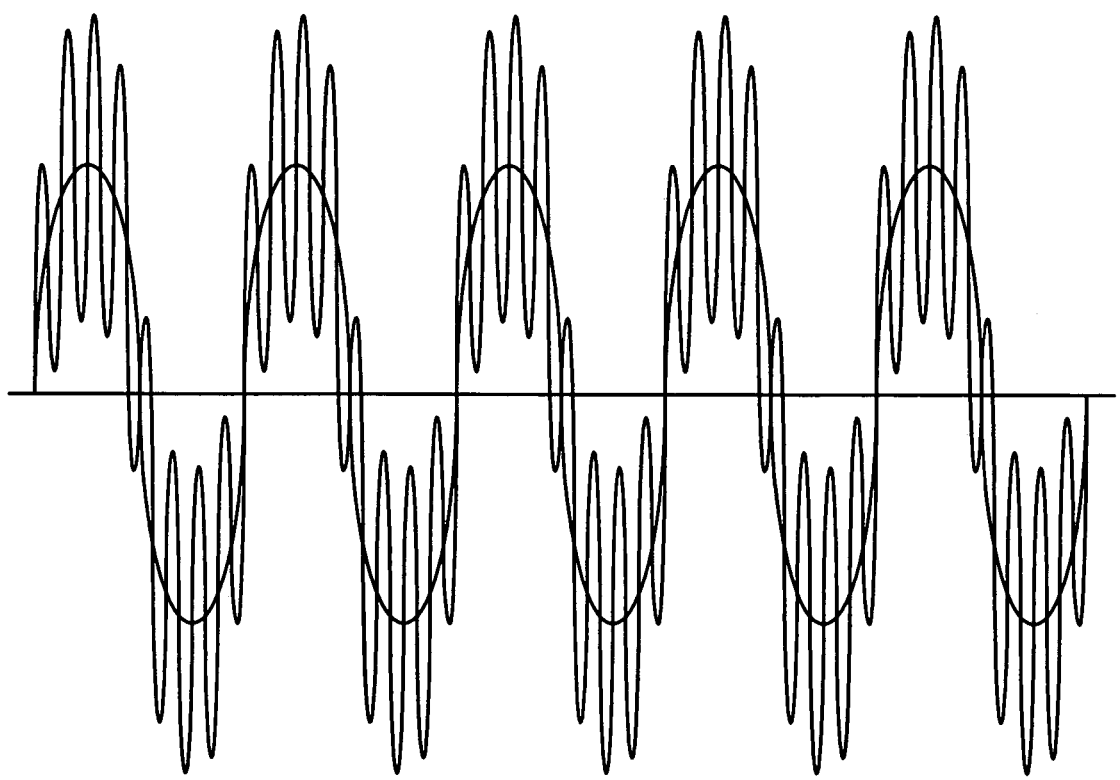
FIG. 7 is a pattern diagram showing an example of a waveform in the case of superposing high-frequency power of a first high-frequency power source and high-frequency power of a second high-frequency power source on each other.

There are no particular limitations as long as the film formation rate of the second film formation condition is higher than that of the first film formation condition. In this embodiment mode, a plasma CVD apparatus that utilizes glow discharge plasma that is generated by application of a high-frequency power in the HF band (3 MHz to 30 MHz, typically 13.56 MHz) and a high-frequency power in the VHF band (30 MHz to about 300 MHz) that are superposed on each other is used. FIG. 7 shows an example of a waveform in the case of superposing the high-frequency power in the HF band and the high-frequency power in the VHF band on each other.

The microcrystalline silicon film can be typically formed by generating plasma by diluting a silicon hydride such as $SiH_4$, $Si_2H_6$, or the like with hydrogen. Further, in addition to silicon hydride and hydrogen, one kind or plural kinds of rare gas elements selected from helium, argon, krypton, and neon can be used for dilution to form the microcrystalline semiconductor film. The flow ratio of hydrogen to silicon hydride in these cases is 12:1 to 1000:1, preferably 50:1 to 200:1, and more preferably 100:1. Note that instead of silicon hydride, $SiH_2Cl_2$, $SiHCl_3$, $SiCl_4$, $SiF_4$, or the like can be used.

Further, in the case of adding helium to a source gas, since helium has an ionization energy of 24.5 eV that is the largest among all gases, and has a metastable state in the level of about 20 eV that is a little lower than the ionization energy, only the difference of about 4 eV is necessary for ionization while keeping discharge. Therefore, the discharge starting voltage also shows the lowest value among all gases. Because of such characteristics, helium can maintain plasma with stability. Further, since helium can form even plasma, even if an area of a substrate to which a microcrystalline silicon film is deposited is large, helium has an effect of making plasma density to be even.

Further, an energy band width may be adjusted to 1.5 eV to 2.4 eV or 0.9 eV to 1.1 eV by mixing a hydride of carbon such as $CH_4$ or $C_2H_6$, a germanium hydride such as $GeH_4$ or $GeF_4$, or a germanium fluoride into a gas such as silane. By adding carbon or germanium to silicon, the temperature characteristic of a TFT can be changed.

Here, in the first film formation condition, silane is diluted with more than 100 times, but less than or equal to 2000 times of hydrogen and/or a rare gas, and a heating temperature of a substrate is 100° C. or higher and lower than 300° C., preferably 120° C. or higher and 220° C. or lower. In order to promote growth of microcrystalline silicon, film formation is preferably performed at 120° C. or higher and 220° C. or lower.

Figure 1B:
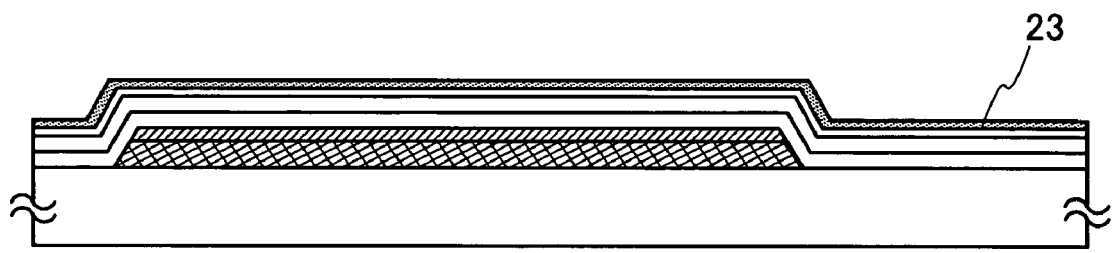

A cross-sectional view up through the step under the first film formation condition is shown in FIG. 1B. Over the gate insulating film 52c, a microcrystalline semiconductor film 23 is formed, which is formed with low film formation rate but has good quality. The quality of this microcrystalline semiconductor film 23 obtained under the first film formation condition contributes to increasing the on-current and improving the electron field-effect mobility of a TFT that is formed later; therefore, it is important to sufficiently reduce an oxygen concentration in the film to an oxygen concentration of $1 \times 10^{17}$/cm or less. Further, by the above procedure, not only the concentration of oxygen that mixes into the microcrystalline semiconductor film is reduced, but those of nitrogen and carbon can also be reduced; therefore, the microcrystalline semiconductor film becoming an n-type can be prevented.

Figure 1C:
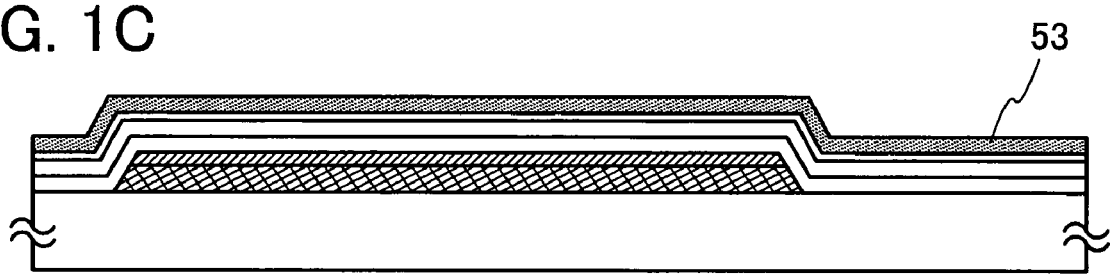

Next, film formation rate is changed from that of the first film formation condition to that of the second film formation condition, to form a microcrystalline semiconductor film 53. A cross-sectional view of this stage is shown in FIG. 1C. The film thickness of the microcrystalline semiconductor film 53 may be 50 nm to 500 nm (preferably 100 nm to 250 nm). Note that in this embodiment mode, formation time of the microcrystalline semiconductor film 53 includes a first film formation period in which film formation is performed under the first film formation condition, and a second film formation period in which film formation is performed under the second film formation condition. Note that although films formed under the first and second film formation conditions could be called a first microcrystalline semiconductor film and a second microcrystalline semiconductor film, respectively, it is difficult to identify a clear interface between the first microcrystalline semiconductor film and the second microcrystalline semiconductor film after film formation. Accordingly, here, a stacked layer film obtained by changing the condition during film formation is referred to as a microcrystalline semiconductor film.

Figure 8:
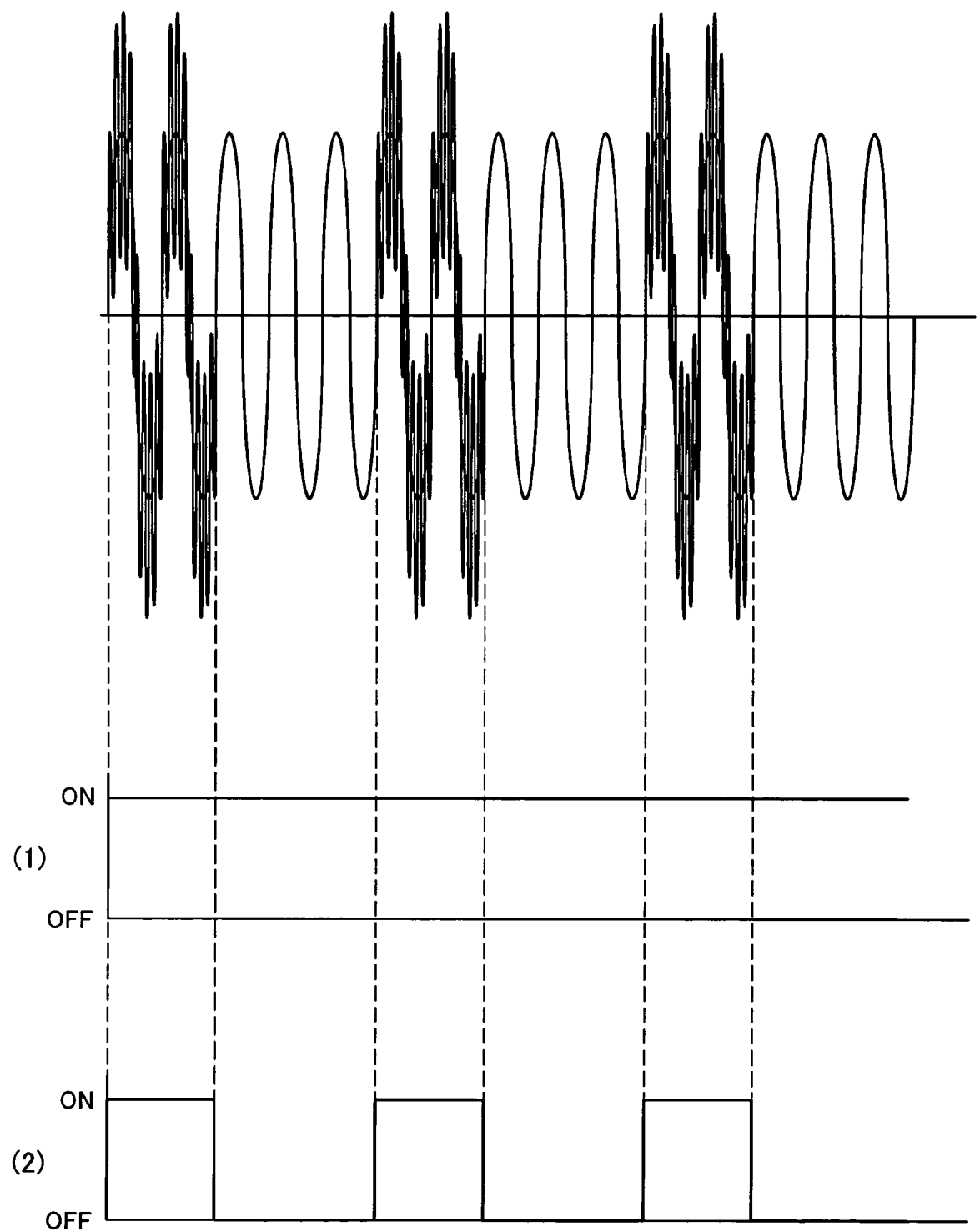
FIG. 8 is a pattern diagram showing an example of a waveform in the case of superposing high-frequency power of a first high-frequency power source and high-frequency power of a second high-frequency power source on each other

In this embodiment mode, in the second film formation condition, silane is diluted with 12 times to 100 times of hydrogen and/or a rare gas, and a heating temperature of a substrate is 100° C. or higher and lower than 400° C., preferably 220° C. or lower. In this embodiment mode, the film formation rate under the second film formation condition is made to be higher than that under the first film formation condition by increasing a flow rate of silane gas. However, a way of increasing the film formation rate is not limited thereto, and the film formation rate under the second film formation condition can be made to be higher than that under the first film formation condition by changing a condition of application of the high-frequency power in the HF band and the high-frequency power in the VHF band. For example, film formation may be performed in a manner that under the first film formation condition, power application is performed such that an output waveform of the high-frequency power source in the VHF band is superposed on an output waveform of the high-frequency power source in the HF band as shown in FIG. 7, and then under the second film formation condition, power application is performed such that the high-frequency power in the VHF band is repeatedly turned on and off to obtain pulsed oscillation and a portion of the waveform is superposed on the high-frequency power in the HF band, as shown in FIG. 8.

Next, after formation of the microcrystalline silicon under the second film formation condition is completed, supply of the source gas such as silane and hydrogen, and the high-frequency powers are stopped, and substrate removal 205 is performed. In the case of performing the film formation treatment to a subsequent substrate, the same treatment starting from substrate installation 202 is performed. In order to remove a coating film or powder that is attached to the inside of the reaction chamber, cleaning 206 is performed.

In cleaning 206, plasma etching is performed by introducing an etching gas typified by $NF_3$ and $SF_6$. Alternatively, cleaning 206 is performed by introducing a gas capable of etching without using plasma, such as $ClF_3$. It is preferable that cleaning 206 is performed with the heater for heating the substrate turned off, and with the temperature of the inner wall of the chamber reduced. This is to suppress generation of a reaction by-product of etching. After completion of cleaning 206, the same treatments as described above may be performed to the subsequent substrate starting from precoating 201.

Here, a structural example of a plasma CVD apparatus is shown in FIG. 6, to which a plurality of high-frequency powers that are used for forming the gate insulating film and the microcrystalline silicon are applied.

A reaction chamber 100 is formed of a stiff material such as aluminum or stainless steel, and has a structure in which the inside can be vacuum evacuated. The reaction chamber 100 is provided with a first electrode 101 and a second electrode 102.

A high-frequency power supply unit 103 is connected to the first electrode 101, a ground potential is applied to the second electrode 102, and the reaction chamber 100 has a structure in which a substrate can be placed. The first electrode 101 is insulated and separated from the reaction chamber 100 by an insulating material 116, so that high-frequency power does not leak. Note that in FIG. 6, the first electrode 101 and the second electrode 102 have structures of a capacitive coupling type (a parallel plate type). However, another structure such as that of an inductive coupling type can be used, as long as glow discharge plasma can be generated in the reaction chamber 100 by applying two or more of different high-frequency powers.

In the high-frequency power supply unit 103, a first high-frequency power source 104 corresponding to a first matching box 106 and a second high-frequency power source 105 corresponding to a second matching box 107 are included. High-frequency powers output from the first high-frequency power source 104 and the second high-frequency power source 105 are both supplied to the first electrode 101. On an output side of the first matching box 106 or the second matching box 107, a band-pass filter can be provided so that the high-frequency power of the other does not flow in.

For a high-frequency power supplied from the first high-frequency power source 104, a high frequency power with a wavelength of about 10 m or longer is used, and a frequency of 3 MHz to 30 MHz that is in the HF band, typically 13.56 MHz is used. For a high-frequency power supplied from the second high-frequency power source 105, a high-frequency power with a frequency in the VHF band and with a wavelength of about than 10 m or shorter, in other words a high-frequency power with a frequency of 30 MHz to 300 MHz is used.

The wavelength of the high frequency power supplied from the first high-frequency power source 104 is three times or more longer than the length of one side of the first electrode 101. The wavelength of the high-frequency power supplied from the second high-frequency power source 105 is shorter than the wavelength of the high frequency power supplied from the first high-frequency power source 104. By supplying to the first electrode 101 a high-frequency power that does not exhibit an effect of a surface standing wave to generate glow discharge plasma, and supplying a high-frequency power in the VHF band to achieve high density of the glow discharge plasma, a thin film that is even and has good film quality can be formed over a large-area substrate with a long side of over 2000 mm.

FIG. 7 shows an example of waveforms in the case of superposing the high-frequency power from the first high-frequency power source 104 and the high-frequency power from the second high-frequency power source 105 on each other. By superposing an output waveform of the second high-frequency power source 105 that uses a frequency in the VHF band, on an output waveform of the first high-frequency power source 104 that uses a frequency in the HF band (typically 13.56 MHz), density of plasma can be increased and internal uniformity of plasma density in a substrate can be improved by getting rid of an effect of a surface standing wave. FIG. 8 is a schematic diagram of an example in the case of using a power source with pulsed oscillation as the second high-frequency power source 105. By supplying the high frequency power in the VHF band in pulses, an abnormal growth of fine particles in a gas phase during film formation can be prevented. In order to suppress growth of the fine particles, the mean residence time of a gas molecule needs to be taken into consideration, and an oscillation frequency of the pulse may be about 1 to 100 kHz.

The first electrode 101 is also connected to a gas supply unit 108. The gas supply unit 108 includes a cylinder 110 that is to be filled with a reaction gas, a pressure regulation valve 111, a stop valve 112, a mass flow controller 113, and the like. In the reaction chamber 100, a surface of the first electrode 101 that faces the substrate is processed into a form of a showerhead plate, and has many fine pores. A reaction gas that is supplied to the first electrode 101 is supplied to the reaction chamber 100 through these fine pores.

Figure 9:
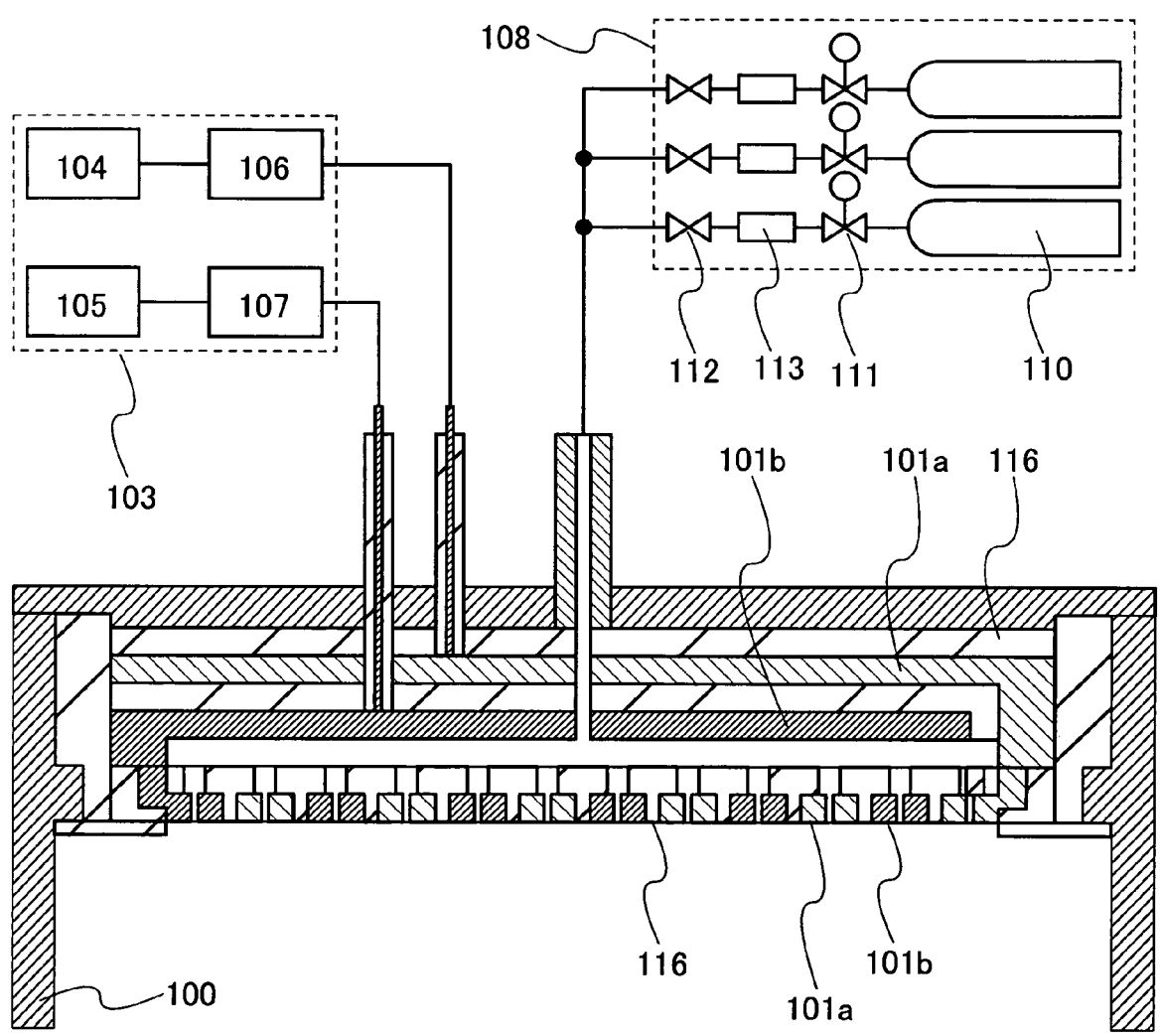
FIG. 9 is a diagram showing another example of an electrode structure in a reaction chamber in which a plurality of types of high-frequency powers are applied to one electrode.

FIG. 9 shows another structure of the first electrode 101. The first electrode 101 is divided into first electrodes 101a that are supplied with high-frequency power from the first high-frequency power source 104 and first electrodes 101b that are supplied with high-frequency power from the second high-frequency power source 105. Surfaces of the first electrodes 101a and the first electrodes 101b that face the substrate are provided with fine pores. The first electrodes 101a and the first electrodes 101b are arranged to engage like teeth of a comb, and are separated by the insulating material 116 so that adjacent electrodes do not come into contact with each other. The structure shown in FIG. 9 can be replaced with the first electrode 101 shown in FIG. 6, and a similar effect can be obtained.

An exhaust unit 109 that is connected to the reaction chamber 100 has a function of vacuum evacuation and a function of controlling the pressure inside the reaction chamber 100 to be maintained at a predetermined level when a reaction gas is introduced. The exhaust unit 109 includes butterfly valves 117, a conductance valve 118, a turbo-molecular pump 119, a dry pump 120, and the like. In the case of arranging one of the butterfly valves 117 and the conductance valve 118 in a parallel manner, by closing the butterfly valve 117 and operating the conductance valve 118, an evacuation rate of the reaction gas is controlled and the pressure in the reaction chamber 100 can be maintained within a predetermined range. Further, by opening the butterfly valves 117, which have large conductance, high vacuum evacuation is possible.

In the case of performing ultrahigh vacuum evacuation in order to ensure a higher degree of vacuum than $10^{-5}$ Pa, it is preferable to also use a cryopump 121. It is also effective to connect two turbo-molecular pumps in series to perform vacuum evacuation. Furthermore, in the case of performing evacuation to reach an ultrahigh vacuum as the ultimate degree of vacuum, the inner wall of the reaction chamber 100 may have a mirror-like finish, and a heater for baking may be provided to reduce discharge of gas from the inner wall.

A substrate heater 114, whose temperature is controlled by a heater controller 115, is provided in the second electrode 102. In the case that the substrate heater 114 is provided inside of the second electrode 102, a heat conduction method is employed. For example, the substrate heater 114 may be a sheathed heater. A space between the first electrode 101 and the second electrode 102 can be adjusted appropriately. Adjustment of this space is done with a bellows by adjusting the height of the second electrode 102 in the reaction chamber 100.

Next, after forming the microcrystalline semiconductor film 53, the substrate is transported without exposure to air, and a buffer layer 54 is preferably formed in a vacuum chamber that is different from the vacuum chamber for forming the microcrystalline semiconductor film 53. By having separate vacuum chambers for forming the buffer layer 54 and forming the microcrystalline semiconductor film 53, the vacuum chamber for forming the microcrystalline semiconductor film 53 can be a chamber dedicated to having ultrahigh vacuum prior to introducing the substrate. Accordingly, contamination by an impurity can be suppressed to a minimum, and the time it takes to reach ultrahigh vacuum can be shortened. This is particularly effective in the case of performing baking to reach the ultrahigh vacuum, because it takes time for the inner-wall temperature of the chamber to become lower and stable. Furthermore, by having separate vacuum chambers, different frequencies of high-frequency power can be used according to film qualities that are to be obtained.

The buffer layer 54 is formed using an amorphous semiconductor film containing hydrogen, nitrogen, or halogen. An amorphous semiconductor film containing hydrogen can be formed by using hydrogen with a flow rate that is 1 times to 10 times, preferably 1 times to 5 times the flow rate of silicon hydride. Further, an amorphous silicon film containing nitrogen can be formed by using nitrogen or ammonia with the above silicon hydride. In addition, an amorphous semiconductor film containing fluorine, chlorine, bromine, or iodine can be formed by using a gas containing fluorine, chlorine, bromine, or iodine ($F_2$, $Cl_2$, $Br_2$, $I_2$, HF, HCl, HBr, HI, or the like) with the above silicon hydride. Note that instead of silicon hydride, $SiH_2Cl_2$, $SiHCl_3$, $SiCl_4$, $SiF_4$, or the like can be used.

Further, the amorphous semiconductor film for the buffer layer 54 can be formed by sputtering using hydrogen or a rare gas and an amorphous semiconductor for a target. At this time, by including ammonia, nitrogen, or $N_2O$ in an atmosphere of the chamber, an amorphous semiconductor film containing nitrogen can be formed. Further, by including a gas containing fluorine, chlorine, bromine, or iodine ($F_2$, $Cl_2$, $Br_2$, $I_2$, HF, HCl, HBr, HI, or the like) in the atmosphere, an amorphous semiconductor film containing fluorine, chlorine, bromine, or iodine can be formed.

The buffer layer 54 is preferably formed of an amorphous semiconductor film that does not contain a crystal grain. Therefore, in the case of forming the buffer layer 54 by a high frequency plasma CVD method with a frequency of several tens of MHz to several hundred MHz or a microwave plasma CVD method, it is preferable to control a film formation condition so that an amorphous semiconductor film that does not contain a crystal grain is formed. Of course, in order to achieve increase in plasma density and uniformity of plasma so that an effect a surface standing wave does not occur, the buffer layer 54 can be formed by using the plasma CVD apparatus shown in FIG. 6 and applying both the high-frequency power in the HF band and the high-frequency power in the VHF band.

The buffer layer 54 is partially etched later in a formation process of a source region and a drain region. It is preferable that the buffer layer 54 is formed with sufficient thickness so that a portion thereof is left after etching, so as not to expose the microcrystalline semiconductor film 53. Typically, the buffer layer 54 is formed with a thickness of 100 nm to 400 nm, preferably 200 nm to 300 nm. By forming the buffer layer 54 with a large thickness in the above range in a display device in which a high voltage is applied to a thin film transistor (for example, about 15V), typically a liquid crystal display device, a withstand voltage becomes high, and even when a high voltage is applied to the thin film transistor, deterioration of the thin film transistor can be avoided.

Note that in the buffer layer 54, an impurity imparting one conductivity type such as phosphorus or boron is not added.

The buffer layer 54 functions as a barrier layer so that an impurity from a semiconductor film 55, to which an impurity element imparting one conductivity type is added, is not dispersed into the microcrystalline semiconductor film 53. In the case of not providing the buffer layer 54, when the microcrystalline semiconductor film 53 and the semiconductor film 55 to which an impurity element imparting one conductivity type is added come into contact with each other, the impurity moves in a later etching step or a heating treatment, and there is a possibility that control of a threshold voltage becomes difficult.

Further, by forming the buffer layer 54 on a surface of the microcrystalline semiconductor film 53, natural oxidation of surfaces of crystal grains contained in the microcrystalline semiconductor film 53 can be prevented. In a region where an amorphous semiconductor and microcrystal grains come into contact with each other, it is particularly easy for a crack to be formed due to localized stress. When this crack is exposed to oxygen, the crystal grains are oxidized, and silicon oxide is formed.

An energy gap of the buffer layer 54 that is an amorphous semiconductor film is larger than that of the microcrystalline semiconductor film 53 (an energy gap of the amorphous semiconductor film is 1.6 to 1.8 eV, and an energy gap of the microcrystalline semiconductor film 53 is 1.1 to 1.5 eV). Also, resistance is higher and mobility is lower in the buffer layer 54 than in the microcrystalline semiconductor film 53, and the mobility of the buffer layer 54 is $\frac{1}{5}$ to $\frac{1}{10}$ of that of the microcrystalline semiconductor film 53. Accordingly, in a thin film transistor that is formed later, the buffer layer 54 that is formed between source and drain regions and the microcrystalline semiconductor film 53 functions as a high-resistant region, and the microcrystalline semiconductor film 53 functions as a channel-forming region. Therefore, an off-current of the thin film transistor can be reduced. In the case of using the thin film transistor for a switching element of a display device, contrast of the display device can be improved.

Note that it is preferable that the buffer layer 54 is formed on the microcrystalline semiconductor film 53 by a plasma CVD method, at a substrate temperature that is 300° C. or higher and lower than 400° C. By this film formation step, hydrogen is supplied to the microcrystalline semiconductor film 53, and the same effect as hydrogenizing the microcrystalline semiconductor film 53 can be obtained. In other words, by depositing the buffer layer 54 over the microcrystalline semiconductor film 53, hydrogen is dispersed in the microcrystalline semiconductor film 53, and a dangling bond can be terminated. Further, during formation of the buffer layer 54, annealing can be performed to the microcrystalline semiconductor film 53 to improve film quality. In particular, although the film obtained under the second film formation condition is formed at a higher film formation rate than the film obtained under the first film formation condition, crystallinity obtained under the second film formation condition tends to be degraded compared to crystallinity obtained under the first film formation condition. However, by performing annealing during formation of the buffer layer, film quality such as crystallinity can be improved. Further, by performing annealing during formation of the buffer layer 54, variation in TFT characteristics (such as variation in threshold voltage) in a reliability test in which voltage application is repeatedly performed can be suppressed, and a TFT with higher reliability than a TFT using mainly an amorphous silicon film for a channel-forming region can be obtained.

Figure 1D:
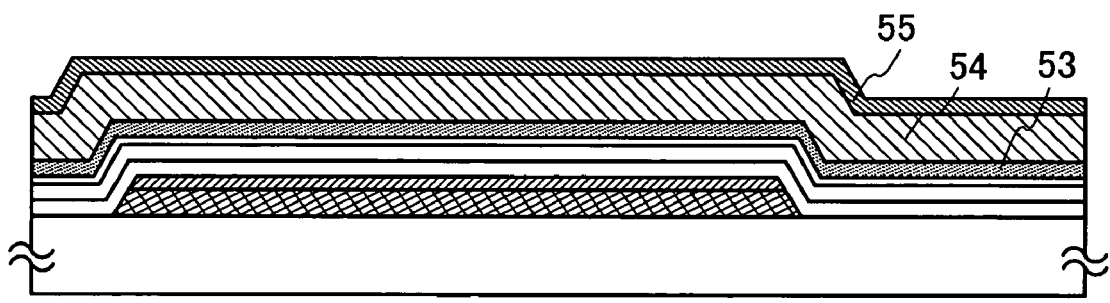

Next, after forming the buffer layer 54, the substrate is transported without exposure to air, and the semiconductor film 55 to which an impurity element imparting one conductivity type is added is preferably formed in a vacuum chamber that is different from the vacuum chamber for forming the buffer layer 54. A cross-sectional view at this stage is shown in FIG. 1D. By forming the semiconductor film 55 to which an impurity element imparting one conductivity is added in a vacuum chamber that is different from the vacuum chamber for forming the buffer layer 54, the impurity imparting one conductivity type can be prevented from mixing into the buffer layer when the buffer layer is formed.

To the semiconductor film 55 to which an impurity element imparting one conductivity is added, in the case of forming an n-channel thin film transistor, phosphorus as a typical impurity element may be added, and an impurity gas such as $PH_3$ may be added to silicon hydride. Alternatively, in the case of forming a p-channel thin film transistor, boron as a typical impurity element may be added, and an impurity gas such as $B_2H_6$ may be added to silicon hydride. The semiconductor film 55 to which an impurity element imparting one conductivity type is added can be formed of a microcrystalline semiconductor or an amorphous semiconductor. The semiconductor film 55 to which an impurity element imparting one conductivity type is added is formed to have a thickness of 2 nm to 50 nm. By the thickness of the semiconductor film 55 to which an impurity element imparting one conductivity type is added being thin, throughput can be improved.

Figure 2A:
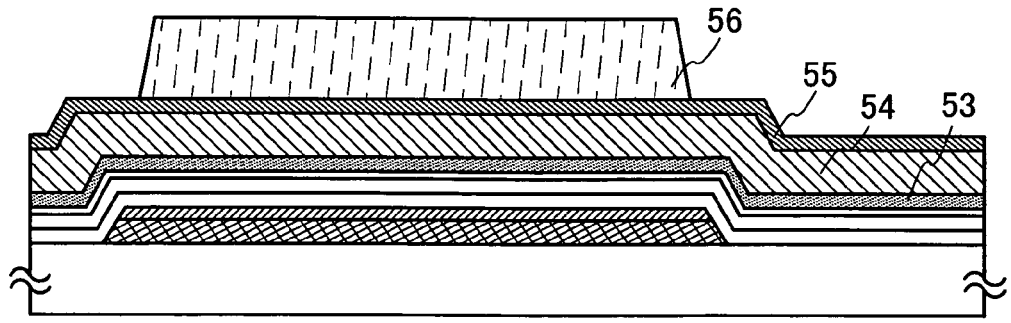
FIGS. 2A to 2D are cross-sectional views describing a manufacturing method of the present invention.

Next, as shown in FIG. 2A, a resist mask 56 is formed over the semiconductor film 55 to which an impurity element imparting one conductivity is added. The resist mask 56 is formed by a photolithography technique or an inkjet method. Here, the resist mask 56 is formed by exposing to light and developing a resist that is applied over the semiconductor film 55 to which an impurity element imparting one conductivity type is added, using a second photomask.

Figure 2B:
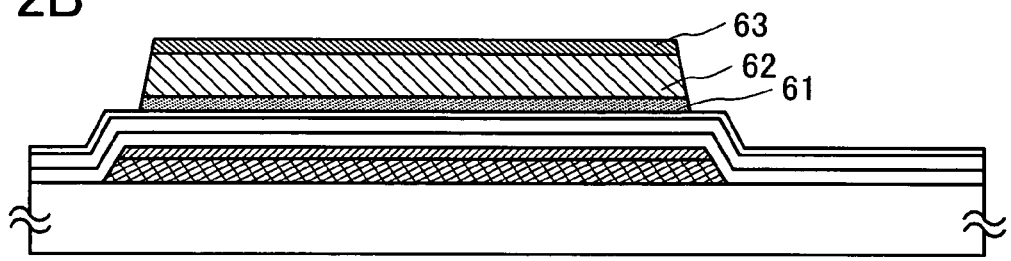

Next, the microcrystalline semiconductor film 53, the buffer layer 54, and the semiconductor film 55 to which an impurity element imparting one conductivity is added are etched using the resist mask 56, to form a microcrystalline semiconductor film 61, a buffer layer 62, and a semiconductor film 63 to which an impurity element imparting one conductivity type is added, as shown in FIG. 2B. After this, the resist mask 56 is removed.

By surfaces of end portions of the microcrystalline semiconductor film 61 and the buffer layer 62 having inclines, occurrence of a leak current between source and drain regions formed over the buffer layer 62 and the microcrystalline semiconductor film 61 can be prevented. In addition, occurrence of a leak current between source and drain electrodes and the microcrystalline semiconductor film 61 can be prevented. Inclination angles of the surface of the end portions of the microcrystalline semiconductor film 61 and the buffer layer 62 are each 30° to 90°, preferably 45° to 80°. With such an angle, a break in the source electrode or the drain electrode due to a step shape can be prevented.

Figure 2C:
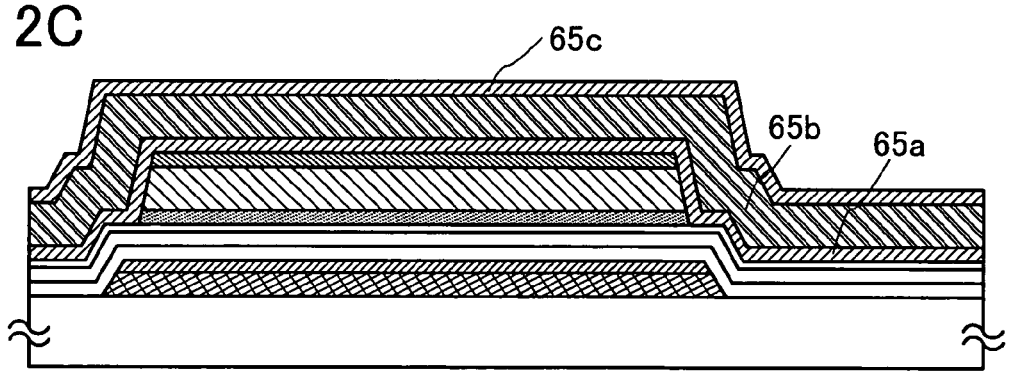

Next, as shown in FIG. 2C, conductive films 65a to 65c, which form a conductive film, are formed so as to cover the semiconductor film 63 to which an impurity element imparting one conductivity type is added and the gate insulating film 52c. It is preferable that the conductive film is formed as a single layer of aluminum, copper, or an aluminum alloy to which an element that improves heat resistance or an element that prevents hillocks such as silicon, titanium, neodymium, scandium, or molybdenum is added; or as stacked layers thereof. Alternatively, a film on a side that is in contact with the semiconductor film to which an impurity element imparting one conductivity type is added may be formed of titanium, tantalum, molybdenum, tungsten, or a nitride thereof, and then aluminum or an aluminum alloy may be formed thereover to form a stacked-layer structure. Further alternatively, the stacked-layer structure may be that in which aluminum or an aluminum alloy is sandwiched by titanium, tantalum, molybdenum, tungsten, or a nitride thereof, from above and below. Here, as the conductive film, a conductive film with a three-layer stacked-layer structure of the conductive films 65a to 65c is shown, and a stacked-layer conductive film using molybdenum films for the conductive films 65a and 65c and an aluminum film for the conductive film 65b, and a stacked-layer conductive film using titanium films for the conductive films 65a and 65c and an aluminum film for the conductive film 65b are shown. The conductive films 65a to 65c are formed by a sputtering method or a vacuum evaporation method.

Figure 2D:
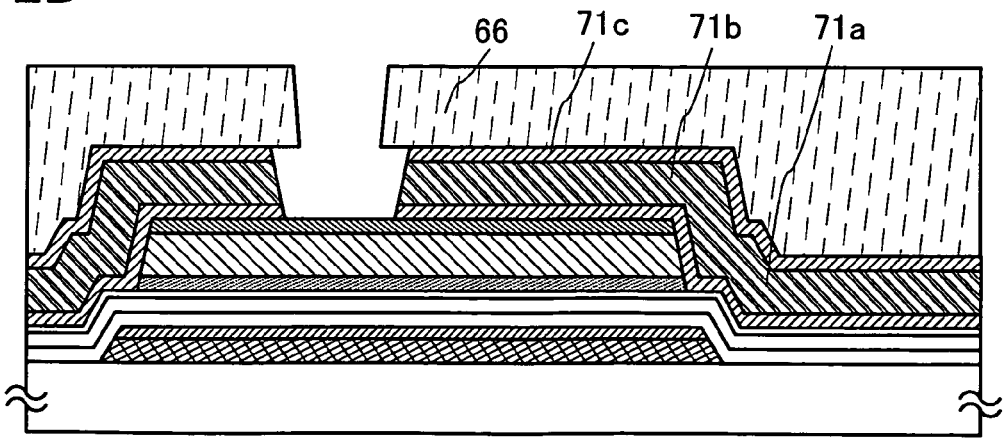

Next, as shown in FIG. 2D, a resist mask 66 is formed over the conductive films 65a to 65c using a third photomask, and portions of the conductive films 65a to 65c are partially etched to form source and drain electrodes 71a to 71c. By performing wet etching on the conductive films 65a to 65c, the conductive films 65a to 65c are selectively etched. As a result, the conductive films are isotropically etched, and thus, the source and drain electrodes 71a to 71c can be formed to have a smaller area than the resist mask 66.

Figure 3A:
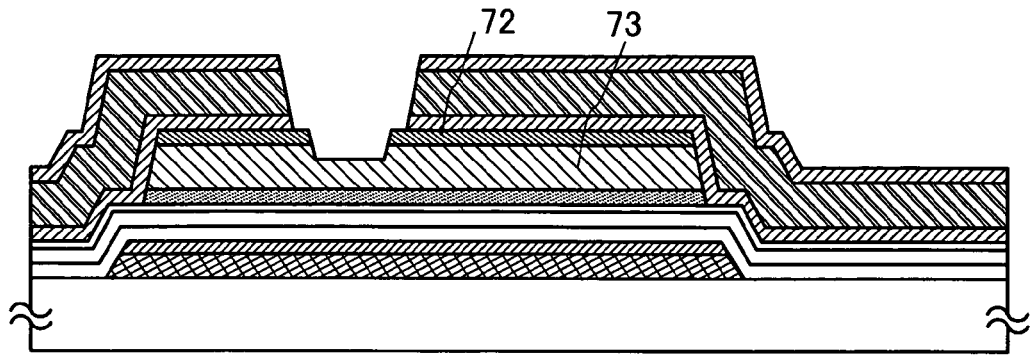
FIGS. 3A to 3C are cross-sectional views describing a manufacturing method of the present invention.

Next, as shown in FIG. 3A, the semiconductor film 63 to which an impurity element imparting one conductivity type is added is etched using the resist mask 66, to form a pair of source and drain regions 72. Further, in this etching step, a portion of the buffer layer 62 is also etched. The buffer layer that is partially etched and has a depression (groove) is referred to as a buffer layer 73. The source and drain regions 72 and the depression (groove) of the buffer layer 73 can be formed in the same step. By making a depth of the depression (groove) of the buffer layer to be ½ to ⅓ of a thickness of the thickest region of the buffer layer 73, it is possible to have distance between the source region and the drain region. Accordingly, a leak current between the source and drain regions can be reduced. Thereafter, the resist mask 66 is removed.

When the resist mask 66 is exposed to plasma used in dry etching or the like, the resist mask becomes altered and it is not removed completely in a resist removal step. Accordingly, the buffer layer is etched by about 50 nm to prevent residue from being left behind. The resist mask 66 is used twice, once in the treatment for partially etching the portion of the conductive films 65a to 65c, and once in the etching treatment during formation of the source and drain regions 72. When dry etching is used in both treatments, residue is easily left behind; therefore, it is effective to form the buffer layer, which may be etched when the residue is being removed completely, to be thick. In addition, the buffer layer 73 can prevent plasma damage to the microcrystalline semiconductor film 61 during dry etching.

Figure 3B:
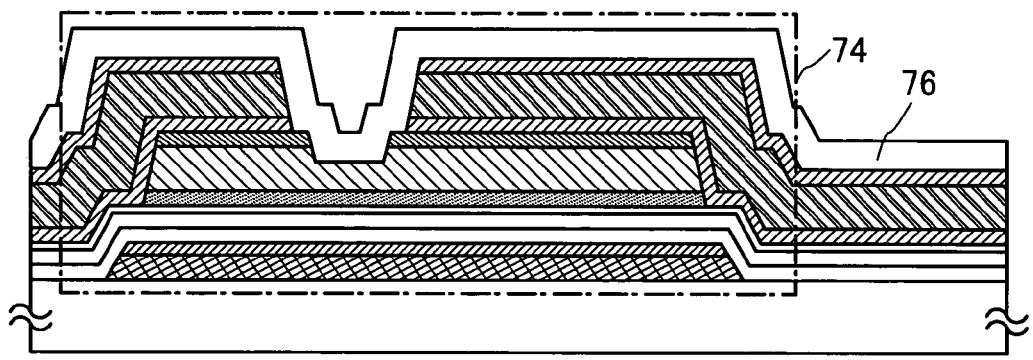
Figure 3C:
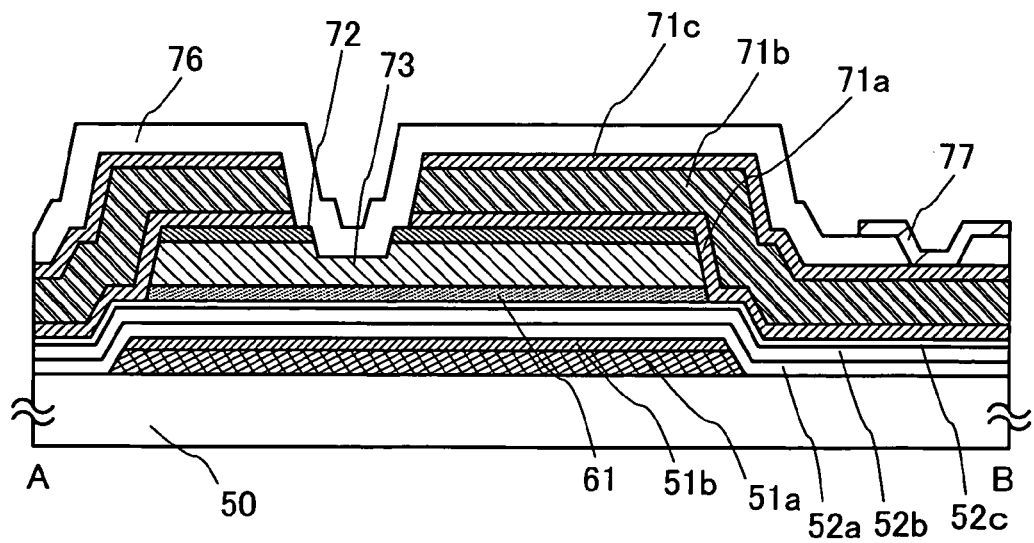

Next, as shown in FIG. 3B, an insulating film 76 is formed so as to cover the source and drain electrodes 71a to 71c, the source and drain regions 72, the buffer layer 73, the microcrystalline semiconductor film 61, and the gate insulating film 52c. The insulating film 76 can be formed by using the same film formation method as the method used for forming the gate insulating films 52a, 52b and 52c. Note that the insulating film 76 is for preventing entrance of a contaminating impurity such as an organic substance, a metal substance, or water vapor which is contained in the atmosphere, and a dense film is preferable. Further, by using a silicon nitride film for the insulating film 76, the oxygen concentration in the buffer layer 73 can be at $5 \times 10^{19}$ atoms/cm³ or less, preferably at $1 \times 10^{19}$ atoms/cm³ or less.

As shown in FIG. 3B, by having end portions of the source and drain electrodes 71a to 71c not align with end portions of the source and drain regions 72, a leak current and a short circuit between the source and drain electrodes can be prevented since there is distance between the source and drain electrodes 71a to 71c. Further, by the end portions of the source and drain electrodes 71a to 71c not aligning with the end portions of the source and drain regions 72, a leak current between a gate electrode and the source and drain electrodes 71a to 71c can be prevented because an electric field does not concentrate at the end portions of the source and drain electrodes 71a to 71c and the source and drain regions 72. Accordingly, a thin film transistor with high reliability and high withstand voltage can be manufactured.

By the above process, a thin film transistor 74 can be formed.

In the thin film transistor described in this embodiment mode, the gate insulating film, the microcrystalline semiconductor film, the buffer layer, the source and drain regions, and the source and drain electrodes are stacked over the gate electrode, and the buffer layer covers the surface of the microcrystalline semiconductor film which functions as a channel-forming region. In addition, a depression (a groove) is formed in a part of the buffer layer, and regions other than the depression are covered with the source and drain regions. That is, because there is distance between the source region and the drain region due to the depression formed in the buffer layer, a leak current between the source and drain regions can be reduced. In addition, because the depression is formed by etching of a part of the buffer layer, an etching residue which is generated in the formation step of the source and drain regions can be removed. Accordingly, a leak current (parasitic channel) can be prevented from being generated between the source and drain regions through the residue.

The buffer layer is formed between the microcrystalline semiconductor film that functions as a channel-forming region and the source and drain regions. In addition, the buffer layer covers the surface of the microcrystalline semiconductor film. Because the buffer layer, which has high resistance, is extended to regions between the microcrystalline semiconductor film and the source and drain regions, occurrence of a leak current can be reduced in a thin film transistor, and deterioration due to application of high voltage can be suppressed. In addition, the buffer layer, the microcrystalline semiconductor film, and the source and drain regions are formed in regions that overlap with the gate electrode. Accordingly, a structure thereof is not affected by a shape of an end portion of the gate electrode. When the gate electrode is formed to have a stacked-layer structure and aluminum is used in a lower layer, there is a possibility of generation of hillock due to aluminum being exposed on a side surface of the gate electrode. However, by having a structure in which the source and drain regions do not overlap with the end portions of the gate electrode, a short circuit occurring in a region overlapping with the side surface of the gate electrode can be prevented. Moreover, because the amorphous semiconductor film, the surface of which is subjected to termination by hydrogen, is formed as the buffer layer on the surface of the microcrystalline semiconductor film, the microcrystalline semiconductor film can be prevented from being oxidized, and an etching residue which is generated in the formation step of the source and drain regions can be prevented from being mixed into the microcrystalline semiconductor film. Accordingly, the thin film transistor has excellent electric characteristics and excellent withstand voltage.

Further, a channel length of the thin film transistor can be shortened, and a planar area of the thin film transistor can be made to be smaller.

Next, a contact hole is formed in the insulating film 76 by etching a portion of the insulating film 76 using a resist mask that is formed using a fourth photomask. Then, a pixel electrode 77 is formed in the contact hole to be in contact with the source or drain electrode 71c. Note that the figure in FIG. 3C corresponds to a cross-sectional view of the figure in FIG. 4 along a chain line A-B.

As illustrated in FIG. 4, it can be seen that end portions of the source and drain regions 72 are located outside of the end portions of the source and drain electrodes 71c. In addition, end portions of the buffer layer 73 are located outside the end portions of the source and drain electrodes 71c and the source and drain regions 72. Further, one of the source and drain electrodes has a shape in which the one electrode surrounds the other of the source and drain electrodes (specifically, a U-shape or a C-shape). Thus, an area in which carriers can move can be increased, and thus the amount of current can be increased and an area for a thin film transistor can be reduced. Over the gate electrode, the microcrystalline semiconductor film and the source and drain electrodes are overlapped, and thus influence by unevenness of the gate electrode is small and reduction of coverage and generation of a leak current can be suppressed. Note that one of the source and drain electrodes also functions as a source or drain wiring.

Further, for the pixel electrode 77, a light-transmitting conductive material can be used, such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Furthermore, the pixel electrode 77 can be formed using a conductive composition containing a conductive high-molecular material (also called a "conductive polymer"). The pixel electrode 77 formed using a conductive composition preferably has a sheet resistance of 10000 Ω/□ or less, and a transmittance of 70% or higher in a wavelength of 550 nm. In addition, it is preferable that the conductive high-molecular material contained in the conductive composition has an electrical resistivity of 0.1 Ω·cm or lower.

As the conductive high-molecular material, a so-called π-conjugated system conductive high-molecular material can be used. For example, polyaniline or a derivative thereof, polypyrrole or a derivative thereof, polythiophene or a derivative thereof, or a copolymer of at least two types of the above can be given.

Here, as the pixel electrode 77, a film of indium tin oxide is formed by a sputtering method, and then a resist is applied over the indium tin oxide film. Next, the resist is exposed to light and developed using a fifth photomask, and a resist mask is formed. Then, the pixel electrode 77 is formed by etching the indium tin oxide film using the resist mask.

Accordingly, an element substrate that can be used for a display device can be formed.

Embodiment Mode 2

This embodiment mode shows an example of a multi-chamber plasma CVD apparatus suitable for formation of a gate insulating film, a microcrystalline semiconductor film, and an n$^+$ layer included in the TFT described in Embodiment Mode 1.

Figure 10:
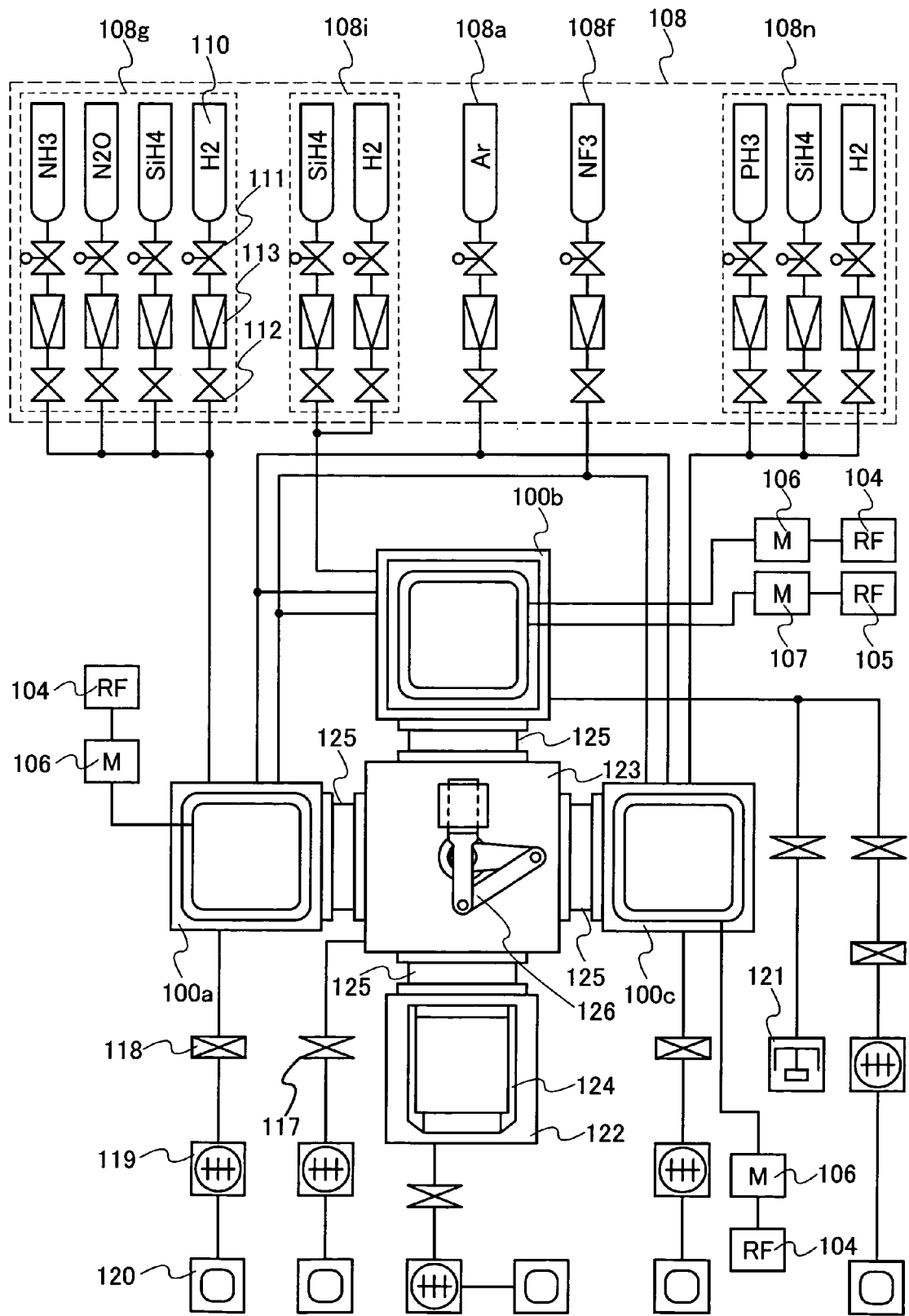
FIG. 10 is a top view showing a structure of a multi-chamber CVD apparatus provided with three treatment chambers.

FIG. 10 shows one example of a multi-chamber plasma CVD apparatus provided with a plurality of reaction chambers. This apparatus is provided with a common chamber 123, a load/unload chamber 122, a first reaction chamber 100a, a second reaction chamber 100b, and a third reaction chamber 100c. This apparatus is a single wafer-processing type in which a substrate set in a cassette 124 in the load/unload chamber 122 is transferred to/from each reaction chamber by a transfer unit 126 in the common chamber 123. A gate valve 125 is provided between the common chamber 123 and each reaction chamber, so that processing in one reaction chamber does not affect processing in other reaction chambers.

The reaction chambers are sorted according to the kinds of thin films to be formed. For example, an insulating film such as a gate insulating film is formed in the first reaction chamber 100a, a microcrystalline semiconductor layer which forms a channel is formed in the second reaction chamber 100b, and a buffer layer and a semiconductor layer to which an impurity element imparting one conductivity type is added and which forms a source and a drain are formed in the third reaction chamber 100c. Of course, the number of the reaction chambers is not limited to three, and can be increased or decreased as needed. Further, one film may be formed in one reaction chamber, or a plurality of films may be formed in one reaction chamber.

As another example, an insulating film such as a gate insulating film is formed in the first reaction chamber 100a, a microcrystalline semiconductor layer which forms a channel and a buffer layer are formed in the second reaction chamber 100b, and a semiconductor layer to which an impurity element imparting one conductivity type is added and which forms a source and a drain is formed in the third reaction chamber 100c.

The turbo-molecular pump 119 and the dry pump 120 are connected to each reaction chamber as exhaust units. The exhaust units are not limited to a combination of these vacuum pumps and can employ other vacuum pumps as long as they can evacuate the reaction chamber to a degree of vacuum of about $10^{-5}$ Pa to $10^{-1}$ Pa. The cryopump 121 is connected to the second reaction chamber 100b in which a microcrystalline semiconductor film is formed so that the reaction chamber is evacuated to an ultra-high vacuum (UHV). The butterfly valve 117 is provided between an exhaust unit and each reaction chamber. With the butterfly valve 117, vacuum-evacuation can be blocked. Further, an evacuation rate is controlled by a conductance valve 118, so that pressure in each reaction chamber can be controlled. The combination of the exhaust units shown in FIG. 10 is one example and the combination is not particularly limited thereto.

The gas supply unit 108 includes the cylinder 110 filled with a gas used for processing such as a semiconductor material gas or a rare gas, the stop valve 112, the mass flow controller 113, and the like. A gas supply unit 108g is connected to the first reaction chamber 100a to supply a gas for forming a gate insulating film. A gas supply unit 108i is connected to the second reaction chamber 100b to supply a gas for forming a microcrystalline semiconductor film. A gas supply unit 108n is connected to the third reaction chamber 100c to supply a gas for forming, for example, an n-type semiconductor film. A gas supply unit 108a supplies argon, and a gas supply unit 108f supplies an etching gas used for cleaning of the inside of the reaction chambers. Thus, the gas supply units 108a and 108f are provided in common for each reaction chamber.

The high-frequency power supply unit 103 is connected to each reaction chamber for generating glow discharge plasma. The high-frequency power supply unit 103 includes a high-frequency power source and a matching box. In this case, in a similar manner to Embodiment Mode 1, by including the first high-frequency power source 104, the second high-frequency power source 105, the first matching box 106 and the second matching box 107, a thin film with favorable evenness can be formed. If the structure of a plasma CVD apparatus is set to match sizes of various glass substrate (first generation (300 mm×400 mm), the second generation (400 mm×500 mm), the third generation (550 mm×650 mm), the fourth generation (730 mm×920 mm), the fifth generation (1000 mm×1200 mm), the sixth generation (2450 mm×1850 mm), the seventh generation (1870 mm×2200 mm), the eighth generation (2000 mm×2400 mm), the ninth generation (2450 mm×3050 mm), the tenth generation (2850 mm×3050 mm), and so on), a thin film with favorable evenness can be formed over a substrate of any size.

As in this embodiment mode, when a plurality of reaction chambers are used and connected to a common chamber as shown in FIG. 10, a plurality of different layers can be formed without being exposed to air.

This embodiment mode can be combined with Embodiment Mode 1 as appropriate.

Embodiment Mode 3

Figure 11:
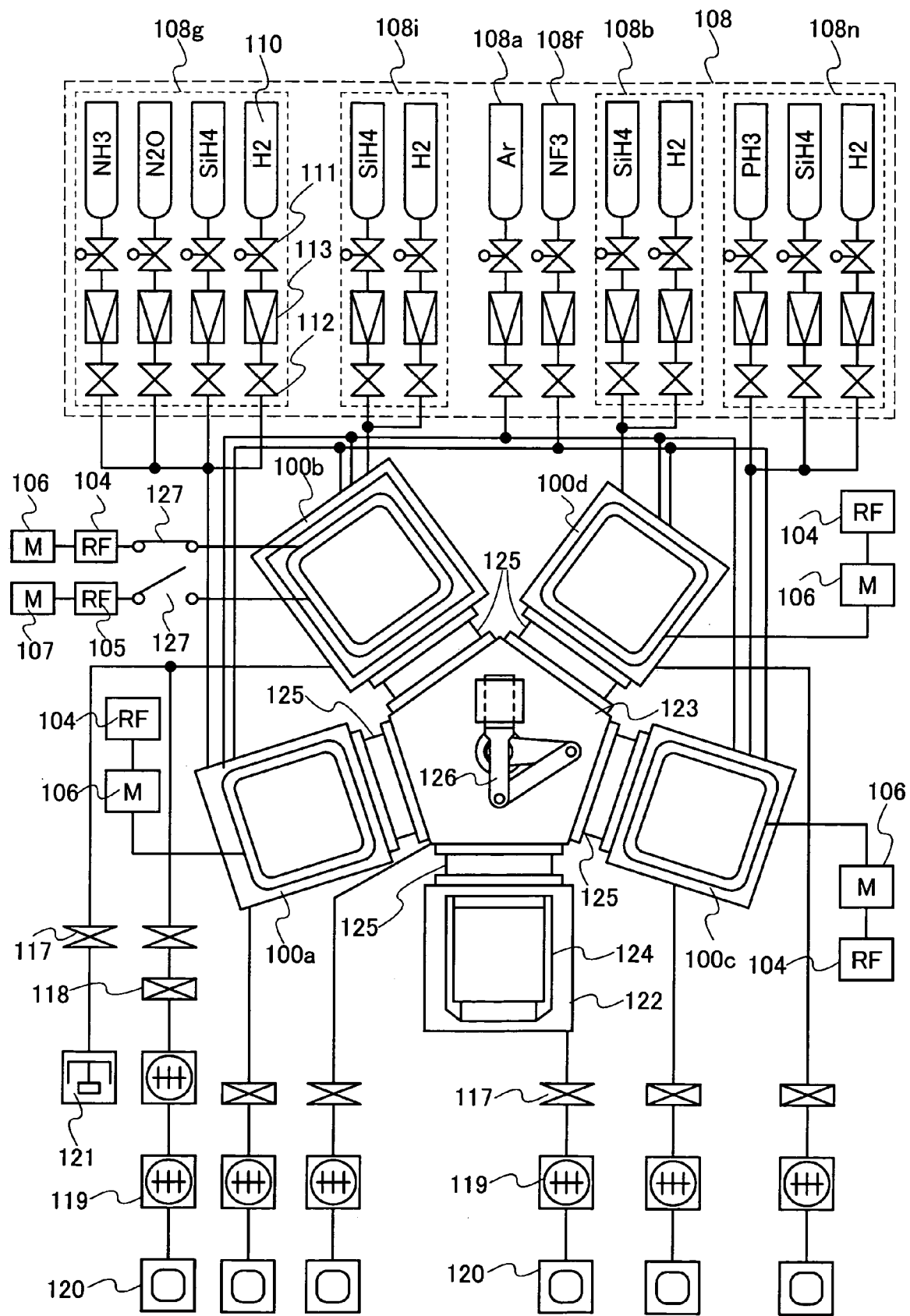
FIG. 11 is a top view showing a structure of a multi-chamber CVD apparatus provided with four treatment chambers.

This embodiment mode will describe a manufacturing process of a thin film transistor using a multi-chamber CVD apparatus which is different from that in FIG. 11 described in Embodiment Mode 2, with reference to FIG. 11. FIG. 11 shows the apparatus provided with three reaction chambers, whereas FIG. 11 is a top view of a multi-chamber CVD apparatus provided with four reaction chambers.

FIG. 11 shows a structure in which a fourth reaction chamber 100d is provided in addition to the structure of the multi-chamber CVD apparatus of FIG. 10. In FIG. 11, the same components as in FIG. 10 are denoted by the same reference numerals and detailed description thereof is omitted. Further, a combination of exhaust units shown in FIG. 11 is one example and the combination is not particularly limited thereto.

A gas supply unit 108b is connected to the fourth reaction chamber 100d. The structure of the high-frequency power supply units and the exhaust units is the same as in FIG. 10. The reaction chambers can be sorted according to the kinds of thin films to be formed. For example, an insulating film such as a gate insulating film is formed in the first reaction chamber 100a, a microcrystalline semiconductor layer which forms a channel is formed in the second reaction chamber 100b, a buffer layer which protects a semiconductor layer for forming a channel is formed in the fourth reaction chamber 100d, and a semiconductor layer to which an impurity element imparting one conductivity type is added and which forms a source and a drain is formed in the third reaction chamber 100c. Each thin film is formed best at a certain film formation temperature (referred to as substrate temperature), and the film formation temperature can be easily controlled by formation of each film in a different reaction chamber. Furthermore, since the same kind of films can be formed repeatedly in the same reaction chamber, an influence of residual impurities due to films which have been formed can be eliminated.

Further, in FIG. 11, switches 127 are provided for the second reaction chamber 100b for controlling input of the first high-frequency power and input of the second high-frequency power. By turning the switches 127 on/off, an output waveform of superimposition can be changed. For example, if both of the switches 127 are turned on, the output waveform as shown in FIG. 7 is exhibited, and if one is repeatedly turned on and off, the waveform as shown in FIG. 8 is exhibited.

By providing the switches 127, a range of adjustment of the film formation condition can be expanded. For example, after forming a microcrystalline semiconductor film by applying both the first high-frequency power and the second high-frequency power, one of the high-frequency powers may be applied to form a buffer layer thereover.

This embodiment mode can be combined with Embodiment Mode 1 or 2 as appropriate.

Embodiment Mode 4

A manufacturing method of a thin film transistor, which is different from that in Embodiment Mode 1, will be described with reference to FIGS. 12A to 12D, FIGS. 13A and 13B, FIGS. 14A to 14C, FIGS. 15A and 15B, and FIGS. 16A to 16C. In this embodiment mode, a process for manufacturing a thin film transistor, which uses a process capable of reducing the number of photomasks compared to Embodiment Mode 1, will be described.

In a similar manner to FIG. 1A described in Embodiment Mode 1, a conductive film is formed over the substrate 50, a resist is applied over the conductive film, and the conductive film is partially etched using a resist mask formed by photolithography using a first photomask, so that a gate electrode 51 is formed. Here, an example of a single-layer conductive film is shown unlike in Embodiment Mode 1. Next, over the gate electrode 51, the gate insulating films 52a, 52b, and 52c are formed in this order using the plasma CVD apparatus shown in FIG. 6.

Next, in a similar manner to FIG. 1B described in Embodiment Mode 1, the microcrystalline semiconductor film 23 is formed under the first film formation condition. Then, in a similar manner to FIG. 1C described in Embodiment Mode 1, the microcrystalline semiconductor film 53 is formed in the same chamber under the second film formation condition, using the plasma CVD apparatus shown in FIG. 6. Next, in a similar manner to FIG. 1D described in Embodiment Mode 1, the buffer layer 54 and the semiconductor film 55 to which an impurity element imparting one conductivity type is added are formed in this order over the microcrystalline semiconductor film 53.

Figure 13A:
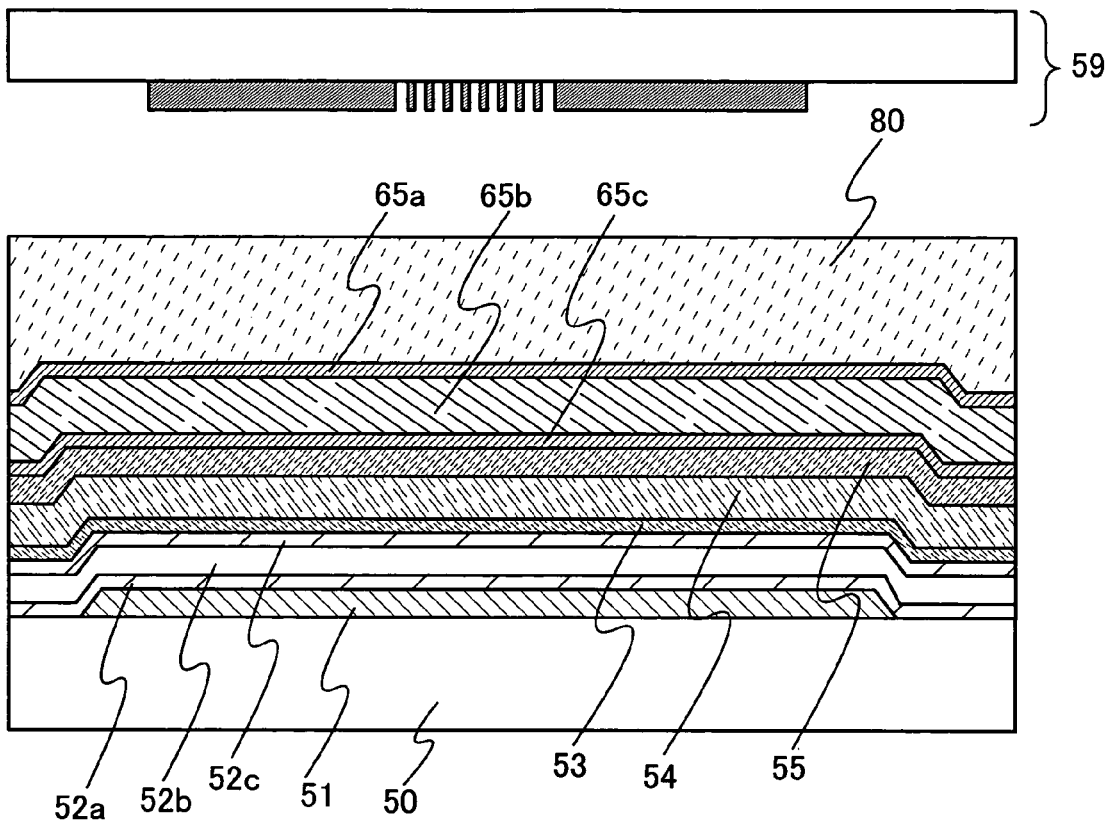
FIGS. 13A and 13B are cross-sectional views of a manufacturing process of the present invention.

Next, the conductive films 65a to 65c are formed over the semiconductor film 55 to which the impurity element imparting one conductivity type is added. Next, as shown in FIG. 13A, a resist 80 is applied over the conductive film 65a.

As the resist 80, a positive resist or a negative resist can be used. In this embodiment mode, a positive resist is used.

Next, a multi-tone mask 59 is used as a second photomask and the resist 80 is irradiated with light, whereby the resist 80 is exposed to light.

The exposure to light with the use of the multi-tone mask 59 will be described below with reference to FIGS. 12A to 12D.

The multi-tone mask is a mask capable of performing exposure to light at three levels: an exposed portion, a half-tone-exposed portion, and an unexposed portion; therefore, a resist mask having regions with different thicknesses (typically, two kinds of thicknesses) can be formed by one exposure-to-light and development process. Thus, the use of the multi-tone mask can reduce the number of photomasks.

Figure 12A:
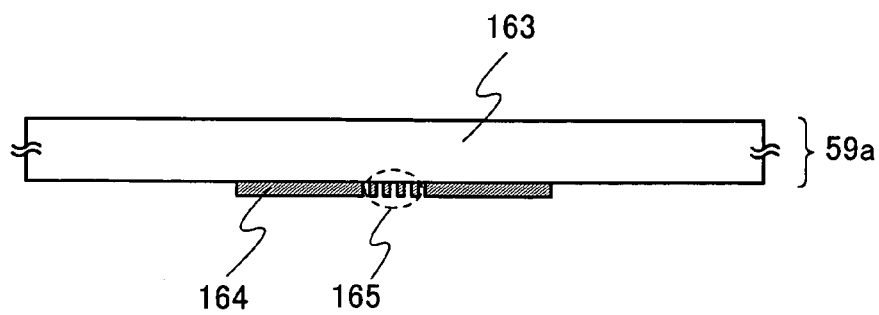
FIGS. 12A to 12D are diagrams describing a multi-tone mask that can be applied to the present invention.
Figure 12B:
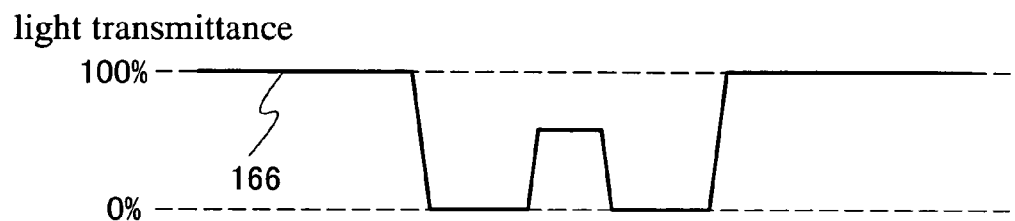
Figure 12C:
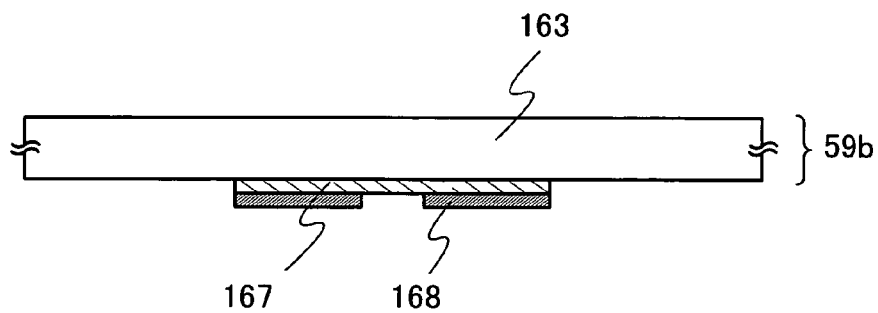

As typical examples of the multi-tone mask, a gray-tone mask 59a shown in FIG. 12A and a half-tone mask 59b shown in FIG. 12C are given.

As shown in FIG. 12A, the gray-tone mask 59a includes a light-transmitting substrate 163 provided with a light-blocking portion 164 and a diffraction grating 165. The light transmittance in the light-blocking portion 164 is 0%. In contrast, the light transmittance at the diffraction grating 165 can be controlled by setting an interval between light-transmitting portions such as slits, dots, or meshes to an interval of less than or equal to the limit of resolution of light used for the exposure. Note that a slit, dot, or mesh form with regular intervals, or a slit, dot, or mesh form with irregular intervals can be used for the diffraction grating 165.

As the light-transmitting substrate 163, a light-transmitting substrate made of quartz or the like can be used. The light-blocking portion 164 and the diffraction grating 165 can be each formed of a light-blocking material by which light is absorbed, such as chromium or chromium oxide.

In the case where the gray-tone mask 59a is irradiated with exposure light, as shown in FIG. 12B, light transmittance 166 in the light-blocking portion 164 is 0% and the light transmittance 166 in a region where the light-blocking portion 164 and the diffraction grating 165 are not provided is 100%. Further, the light transmittance in the diffraction grating 165 can be controlled within the range of 10% to 70%. The light transmittance in the diffraction grating 165 can be controlled by adjusting the interval of slits, dots, or meshes of the diffraction grating and the pitch thereof.

As shown in FIG. 12C, the half-tone mask 59b includes the light-transmitting substrate 163 provided with a semi-light-transmitting portion 167 and a light-blocking portion 168. As the semi-light-transmitting portion 167, MoSiN, MoSi, MoSiO, MoSiON, CrSi, or the like can be used. The light-blocking portion 168 can be formed of a light-blocking material by which light is absorbed, such as chromium or chromium oxide.

Figure 12D:
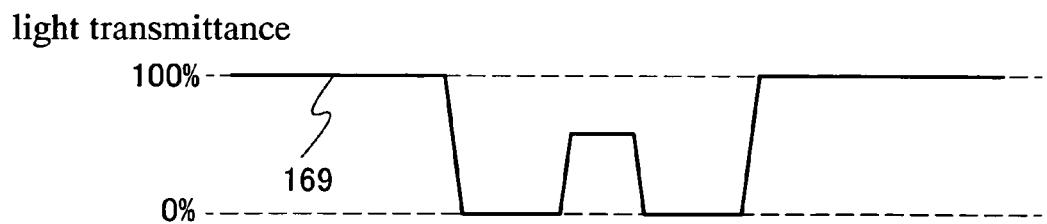

In the case where the half-tone mask 59b is irradiated with exposure light, as shown in FIG. 12D, light transmittance 169 in the light-blocking portion 168 is 0% and the light transmission 169 in a region where the light-blocking portion 168 and the semi-light-transmitting portion 167 are not provided is 100%. Further, the light transmission in the semi-light-transmitting portion 167 can be controlled within the range of 10% to 70%. The light transmittance in the semi-light-transmitting portion 167 can be controlled by the material of the semi-light-transmitting portion 167.

Figure 13B:
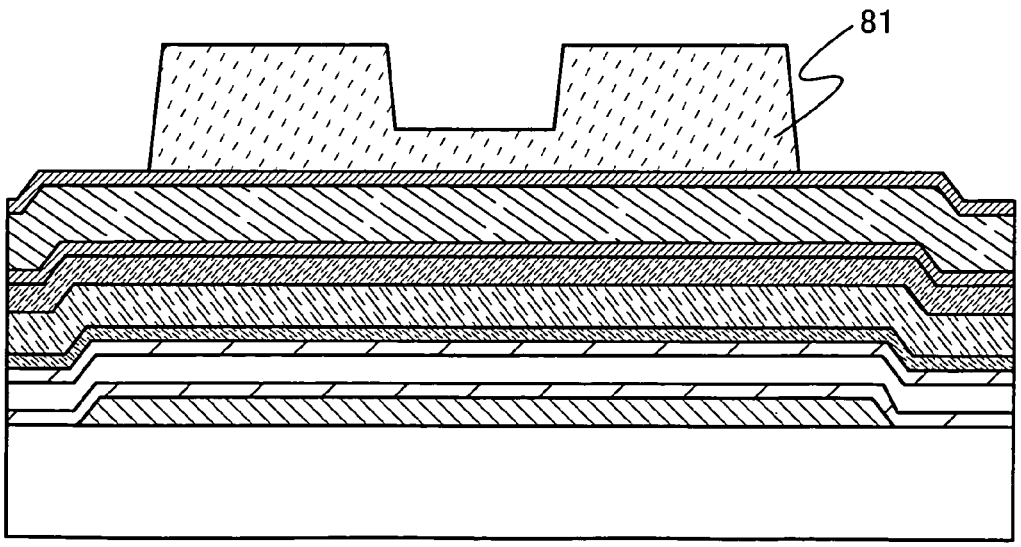

After the exposure to light using the multi-tone photomask, development is carried out, whereby a resist mask 81 having regions with different thicknesses can be formed as shown in FIG. 13B.

Figure 14A:
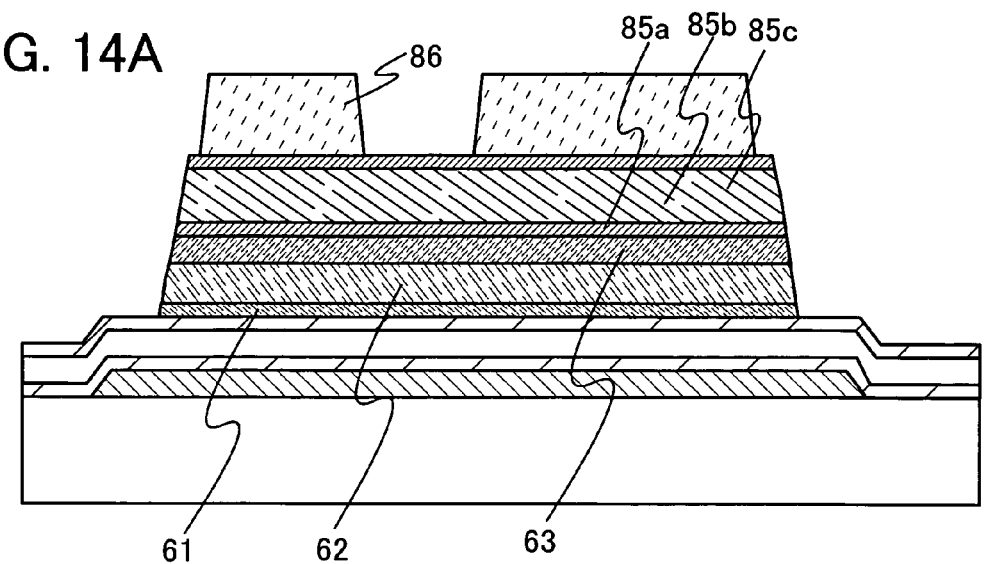
FIGS. 14A to 14C are cross-sectional views of a manufacturing process of the present invention.

Next, with the resist mask 81, the microcrystalline semiconductor film 53, the buffer layer 54, the semiconductor film 55 to which the impurity element imparting one conductivity type is added, and the conductive films 65a to 65c are etched. As a result, the microcrystalline semiconductor film 61, the buffer layer 62, the semiconductor film 63 to which the impurity element imparting one conductivity type is added, and conductive films 85a to 85c as shown in FIG. 14A can be formed. Note that FIG. 14A corresponds to a cross-sectional view taken along a line A-B in FIG. 16A (although a resist mask 86 is not shown).

Next, the resist mask 81 is ashed. As a result, the area and thickness of the resist mask are reduced. At this time, the resist mask in a region with a small thickness (a region overlapping with part of the gate electrode 51) is removed to form the resist mask 86 as shown in FIG. 14A.

Figure 14B:
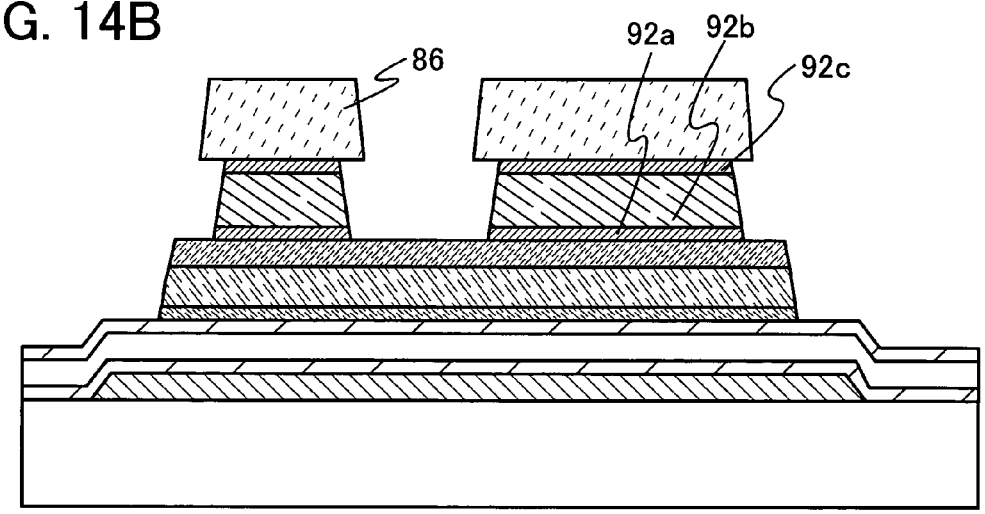

Next, the conductive films 85a to 85c are etched to be separated using the resist mask 86. As a result, pairs of source and drain electrodes 92a to 92c can be formed as shown in FIG. 14B. When the conductive films 85a to 85c are etched by wet etching using the resist mask 86, the conductive films 85a to 85c are etched as selected. Since the conductive films are isotropically etched, the source and drain electrodes 92a to 92c with a smaller area than the resist mask 86 can be formed.

Next, the semiconductor film 63 to which the impurity element imparting one conductivity type is added is etched using the resist mask 86 to form a pair of source and drain regions 88. In the etching step, a part of the buffer layer 62 is also etched. The buffer layer after being etched partially is referred to as a buffer layer 87. The buffer layer 87 has a depression. The source and drain regions and the depression (groove) in the buffer layer can be formed by the same step. Here, the buffer layer 87 is partially etched with use of the resist mask 86 having a smaller area than the resist mask 81, so end portions of the buffer layer 87 are located outside the source and drain regions 88. After that, the resist mask 86 is removed. End portions of the source and drain electrodes 92a to 92a are not aligned with those of the source and drain regions 88, and the end portions of the source and drain regions 88 are located outside those of the source and drain electrodes 92a to 92c.

Figure 14C:
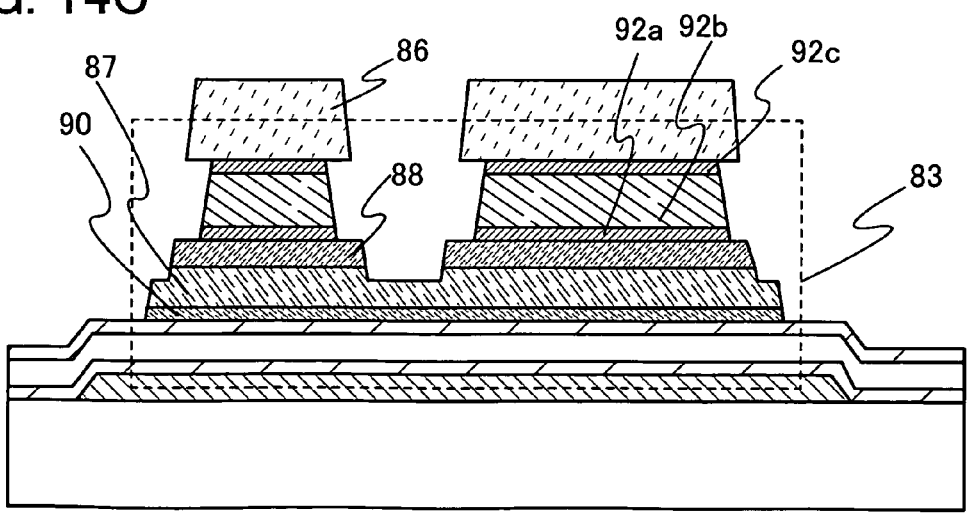
Figure 16A:
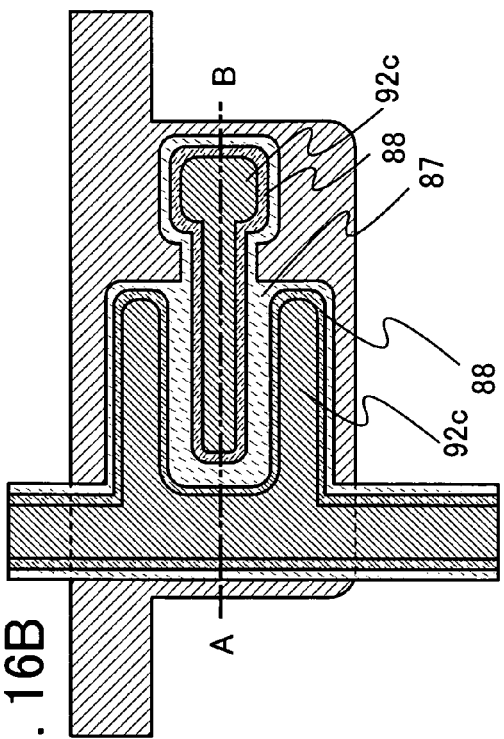
FIGS. 16A to 16C are cross-sectional views of a manufacturing process of the present invention.
Figure 16B:
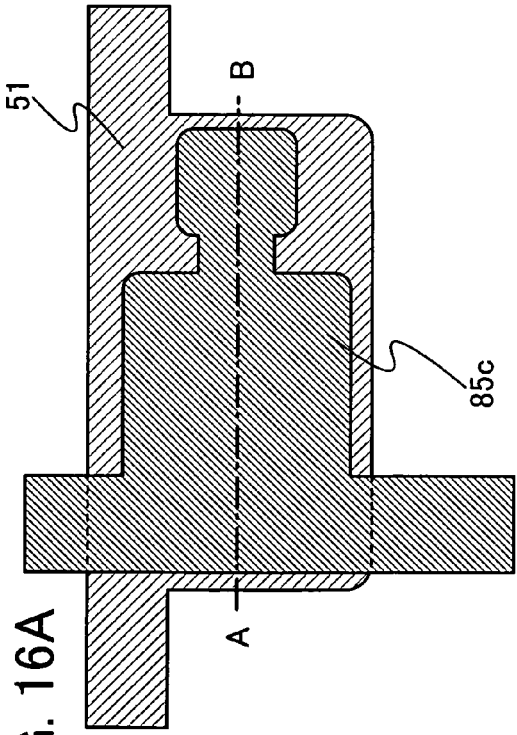
Figure 16C:
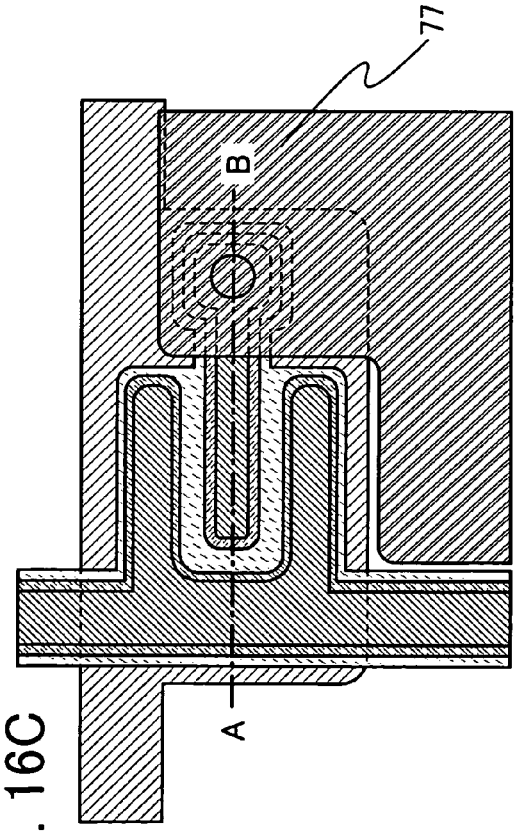

Note that FIG. 14C corresponds to a cross-sectional view taken along a line A-B in FIG. 16B. As shown in FIG. 16B, the end portions of the source and drain regions 88 are located outside those of the source and drain electrodes 92c. Further, end portions of the buffer layer 87 are located outside those of the source and drain electrodes 92c and those of the source and drain regions 88. Furthermore, one of the source and drain electrodes surrounds the other of the source and drain electrodes (specifically, the former electrode is in a U-shape or a C-shape). Therefore, the area of a region where carriers move can be increased; and thus the amount of current can be increased, and the area of a thin film transistor can be reduced. Further, roughness of the gate electrode has little influence because the microcrystalline semiconductor film and the source and drain electrodes overlap with each other over the gate electrode, thereby suppressing reduction in coverage and generation of a leak current. Note that either the source electrode or the drain electrode also functions as a source wiring or a drain wiring.

As shown in FIG. 14C, the end portions of the source and drain electrodes 92a to 92c are not aligned with those of the source and drain regions 88, and there is distance between the end portions of the source and drain electrodes 92a to 92c; thus, a leak current or short circuit between the source and drain electrodes can be prevented. In addition, since the end portions of the source and drain electrodes 92a to 92c are not aligned with those of the source and drain regions 88, an electric field is not concentrated at the end portions of the source and drain electrodes 92a to 92c and the source and drain regions 88; thus, a leak current between the gate electrode 51 and the source and drain electrodes 92a to 92c can be prevented. Accordingly, a thin film transistor with high reliability and high withstand voltage can be manufactured.

Through the above process, a thin film transistor 83 can be formed. The thin film transistor can be formed using two photomasks.

Figure 15A:
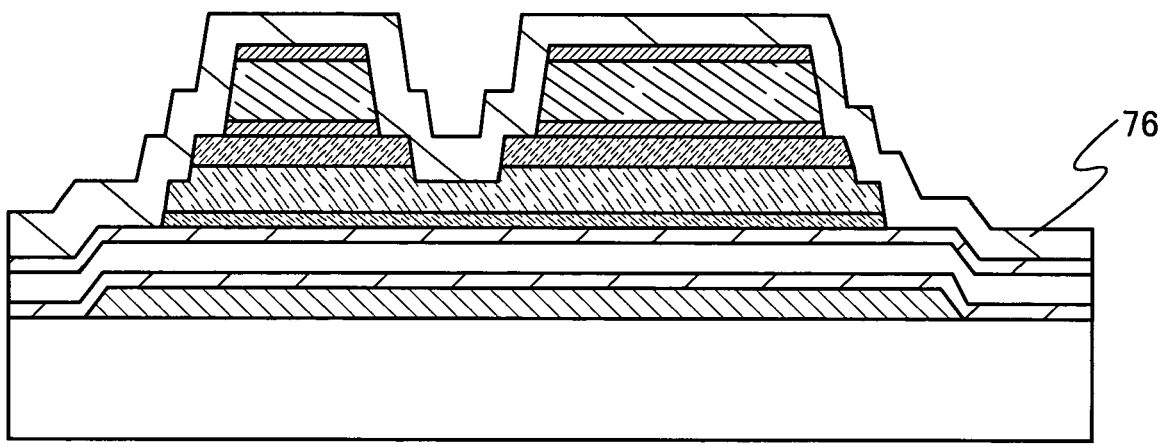
FIGS. 15A and 15B are cross-sectional views of a manufacturing process of the present invention.
Figure 15B:
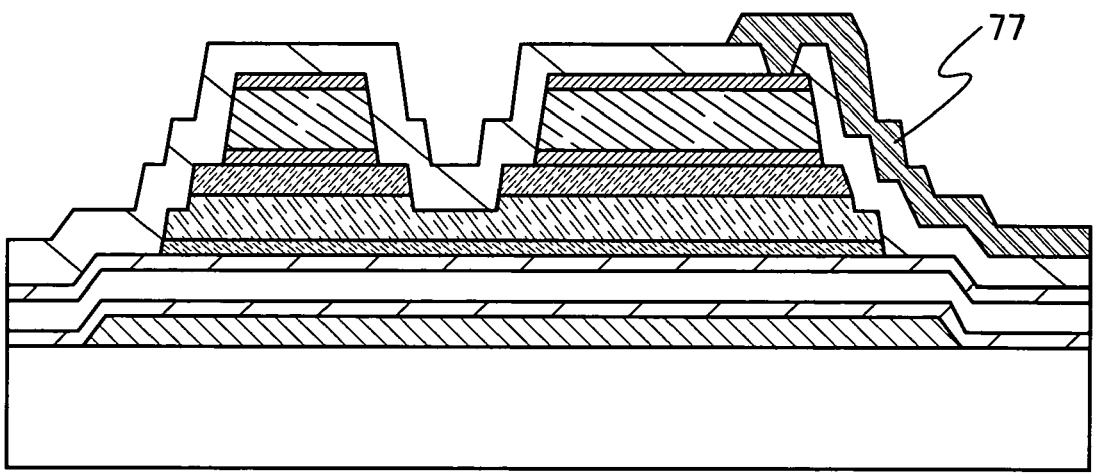

Next, as shown in FIG. 15A, the insulating film 76 is formed over the source and drain electrodes 92a to 92c, the source and drain regions 88, the buffer layer 87, a microcrystalline semiconductor film 90, and the gate insulating film 52c. The insulating film 76 can be formed by the same method as that of the gate insulating films 52a to 52c.

Next, a contact hole is formed in the insulating film 76 by partially etching the insulating film 76 using a resist mask formed using a third photomask. Then, a pixel electrode 77 that is in contact with the source or drain electrode 92c through the contact hole is formed. In this embodiment mode, the pixel electrode 77 is formed as follows: an indium tin oxide film is formed by a sputtering method; a resist is applied over the indium tin oxide film; the resist is exposed to light and developed using a fourth photomask, thereby forming a resist mask; and then, the indium tin oxide film is etched using the resist mask. Note that FIG. 15B corresponds to a cross-sectional view taken along a line A-B in FIG. 16C.

In this manner, an element substrate which can be used for a display device can be formed using a multi-tone mask to reduce the number of masks.

In addition, this embodiment mode can be combined with any of Embodiment Modes 1 to 3 as appropriate.

Embodiment Mode 5

In this embodiment mode, a liquid crystal display device including the thin film transistor described in Embodiment Mode 1 will be described below as one mode of the display device.

First, a vertical alignment (VA) liquid crystal display device is described. The VA liquid crystal display device is a kind of form in which alignment of liquid crystal molecules of a liquid crystal panel is controlled. The VA liquid crystal display device is a form in which liquid crystal molecules are vertical to a panel surface when voltage is not applied. In particular, in this embodiment mode, it is devised that a pixel is divided into several regions (sub-pixels) so that molecules are aligned in a different direction in each region. This is referred to as domain multiplication or multi-domain design. In the following description, a liquid crystal display device with multi-domain design is described.

Figure 17:
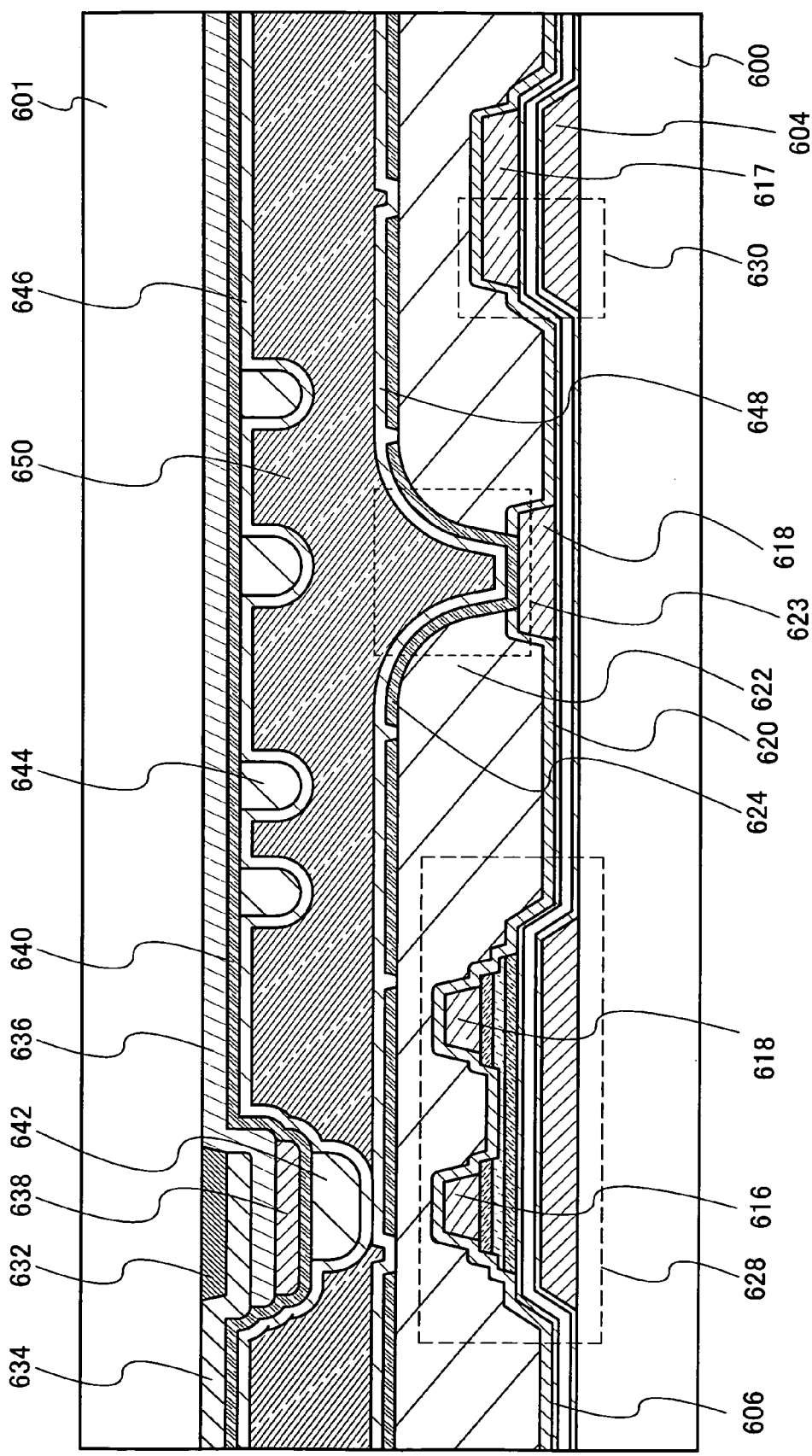
FIG. 17 is a diagram describing an example of a liquid crystal apparatus.
Figure 18:
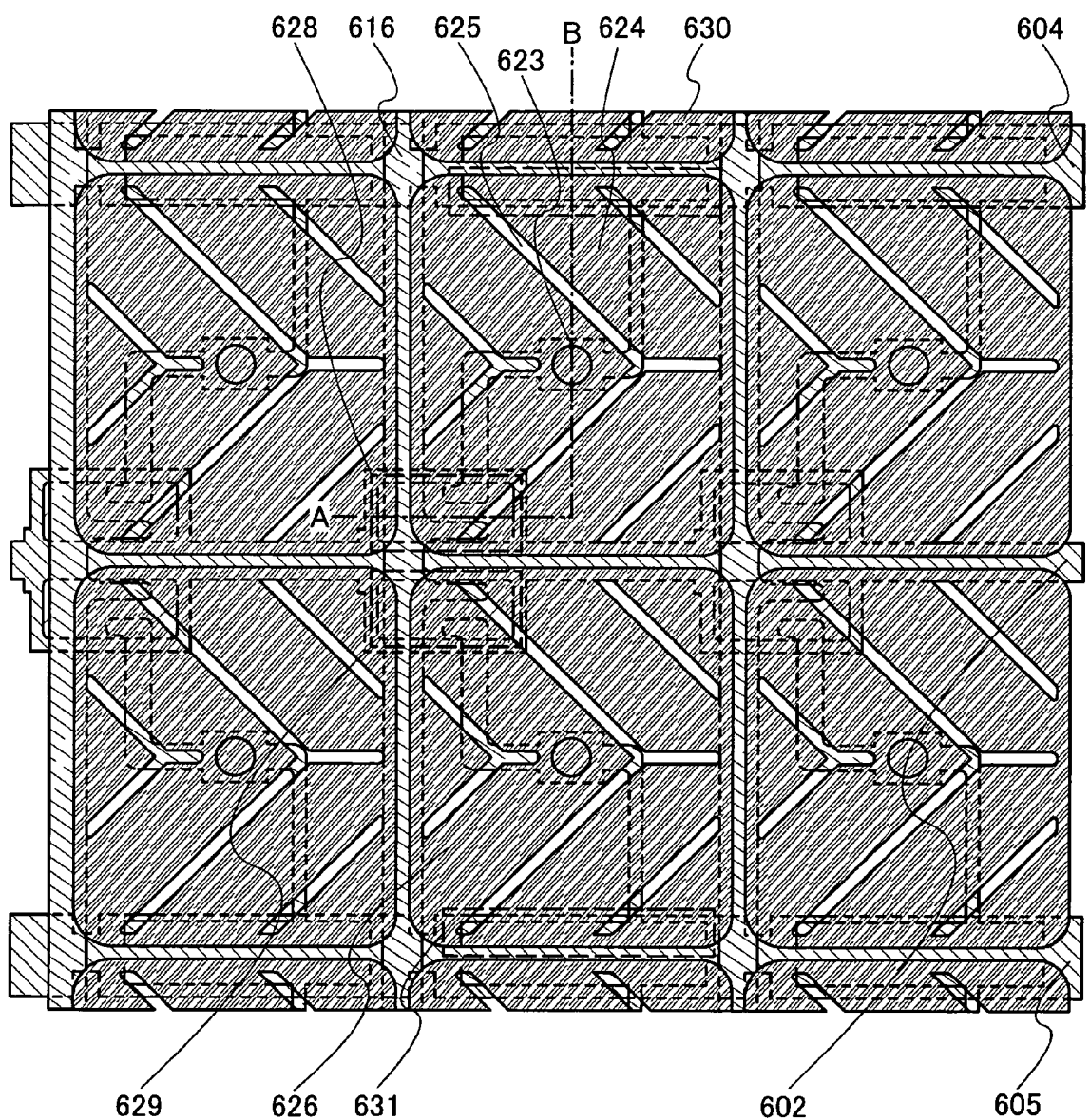
FIG. 18 is a diagram describing an example of a liquid crystal apparatus.
Figure 19:
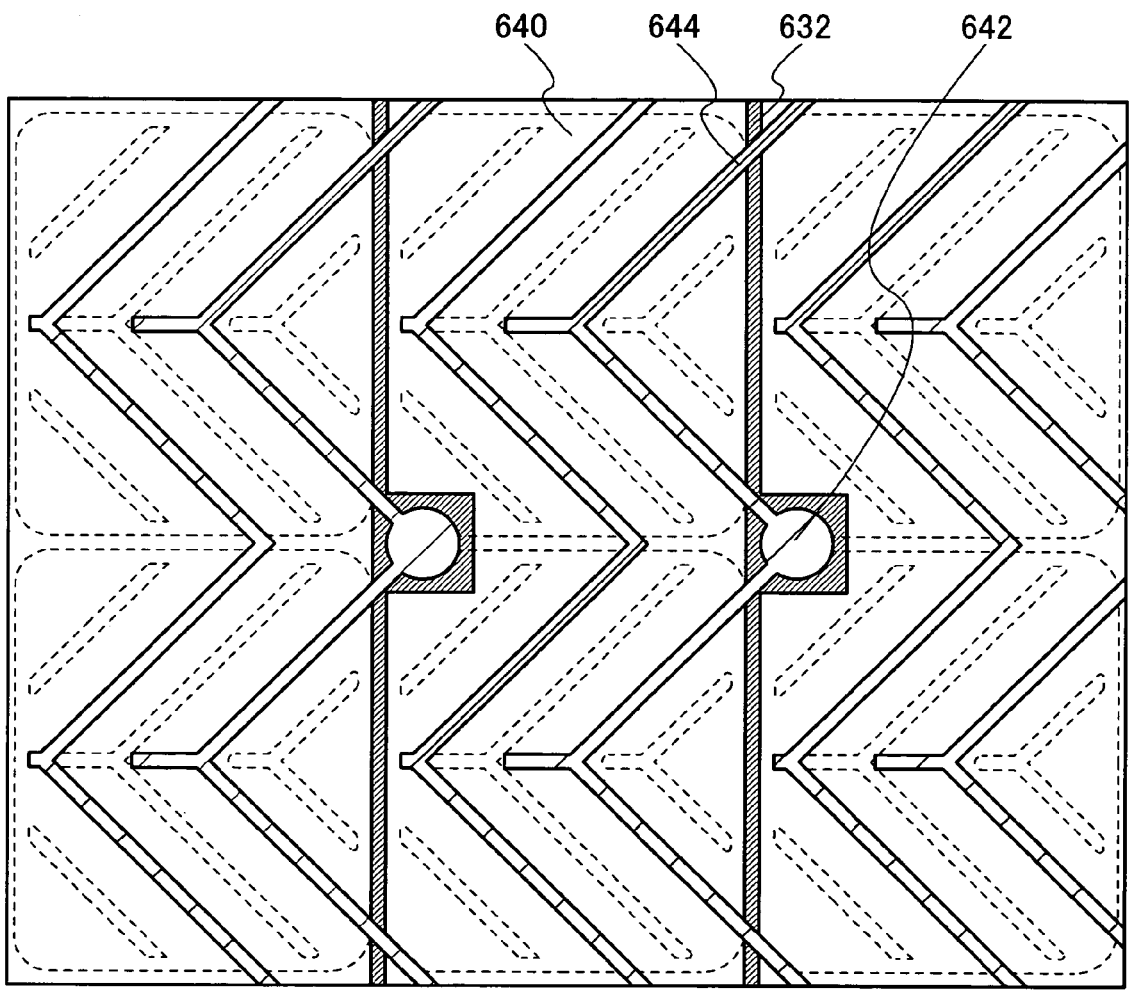
FIG. 19 is a diagram describing an example of a liquid crystal apparatus.

FIG. 18 and FIG. 19 show a pixel electrode and a counter electrode, respectively. FIG. 18 is a plan view of a side of a substrate on which the pixel electrode is formed. FIG. 17 shows a cross-sectional structure along a line A-B in FIG. 18. FIG. 19 is a plan view of a side of a substrate on which the counter electrode is formed. Hereinafter, description is made with reference to these drawings.

FIG. 17 illustrates a state in which a substrate 600 provided with a TFT 628, a pixel electrode 624 connected to the TFT 628, and a storage capacitor portion 630 overlaps with a counter substrate 601 provided with a counter electrode 640 and the like, and liquid crystal is injected therebetween.

At the position where the counter substrate 601 is provided with a spacer 642, a light-blocking film 632, a first color film 634, a second color film 636, a third color film 638, and the counter electrode 640 are formed. With this structure, the height of a projection 644 for controlling alignment of the liquid crystal and the height of the spacer 642 vary. An alignment film 648 is formed over the pixel electrode 624. Similarly, the counter electrode 640 is provided with an alignment film 646. A liquid crystal layer 650 is formed between the alignment films 646 and 648.

Although a columnar spacer is used for the spacer 642 in this embodiment mode, bead spacers may also be dispersed. Further, the spacer 642 may be formed over the pixel electrode 624 provided over the substrate 600.

The TFT 628, the pixel electrode 624 connected to the TFT 628, and the storage capacitor portion 630 are formed over the substrate 600. The pixel electrode 624 is connected to a wiring 618 via a contact hole 623 which penetrates an insulating film 620 which covers the TFT 628, the wiring 618, and the storage capacitor portion 630 and also penetrates a third insulating film 622 which covers the insulating film 620. The thin film transistor described in Embodiment Mode 1 can be used as the TFT 628 as appropriate. The storage capacitor portion 630 includes a first capacitor wiring 604 which is formed in a similar manner to a gate wiring 602 of the TFT 628, a gate insulating film 606, and a second capacitor wiring 617 which is formed in a similar manner to a wiring 616 and the wiring 618.

A liquid crystal element is formed by overlapping of the pixel electrode 624, the liquid crystal layer 650, and the counter electrode 640.

FIG. 18 shows a structure over the substrate 600. The pixel electrode 624 is formed using the material described in Embodiment Mode 1. The pixel electrode 624 is provided with a slit 625. The slit 625 is for controlling alignment of the liquid crystal.

A TFT 629, a pixel electrode 626 connected to the TFT 629, and a storage capacitor portion 631 shown in FIG. 18 can be formed in a similar manner to the TFT 628, the pixel electrode 624, and the storage capacitor portion 630, respectively. Both the TFT 628 and the TFT 629 are connected to the wiring 616. A pixel of this liquid crystal panel includes the pixel electrodes 624 and 626. Each of the pixel electrodes 624 and 626 is in a sub-pixel.

FIG. 19 shows a structure of the counter substrate side. The counter electrode 640 is formed over the light-blocking film 632. The counter electrode 640 is preferably formed using a material similar to that of the pixel electrode 624. The projection 644 for controlling alignment of the liquid crystal is formed over the counter electrode 640. Moreover, the spacer 642 is formed corresponding to the position of the light-blocking film 632.

Figure 20:
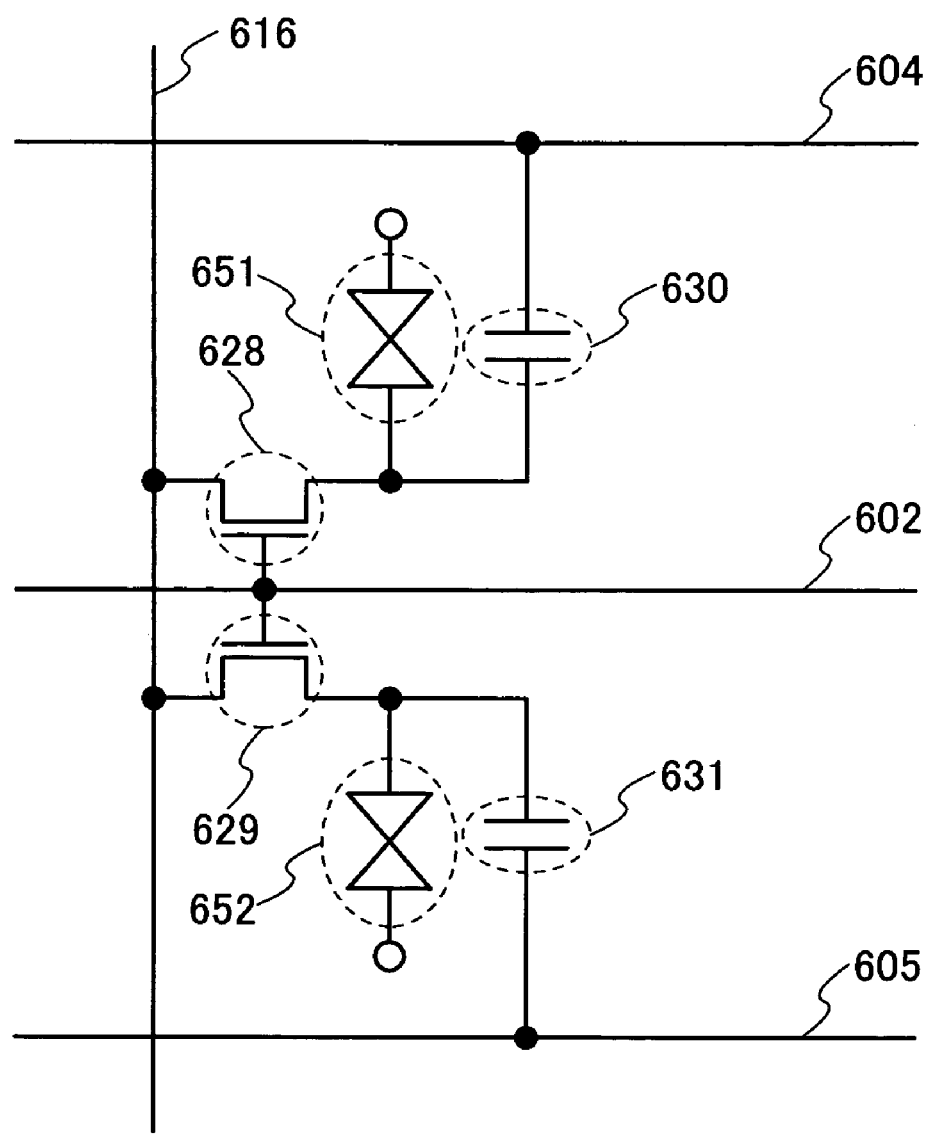
FIG. 20 is a diagram describing an example of a liquid crystal apparatus.

FIG. 20 shows an equivalent circuit of this pixel structure. Both the TFT 628 and the TFT 629 are connected to the gate wiring 602 and the wiring 616. In this case, when potentials of the capacitor wiring 604 and a capacitor wiring 605 are different from each other, operations of liquid crystal elements 651 and 652 can vary. That is, alignment of the liquid crystal is precisely controlled and a viewing angle is increased by individual control of potentials of the capacitor wirings 604 and 605.

When voltage is applied to the pixel electrode 624 provided with the slit 625, electric field distortion (an oblique electric field) is generated near the slit 625. The slit 625 and the projection 644 on the counter substrate 601 side are alternately arranged in an engaging manner and thus, an oblique electric field is effectively generated to control alignment of the liquid crystal, so that a direction of alignment of the liquid crystal varies depending on location. That is, a viewing angle of the liquid crystal panel is increased by domain multiplication.

Next, another VA liquid crystal display device, which is different from the above-described device, is described with reference to FIG. 21, FIG. 22, FIG. 23, and FIG. 24.

Figure 21:
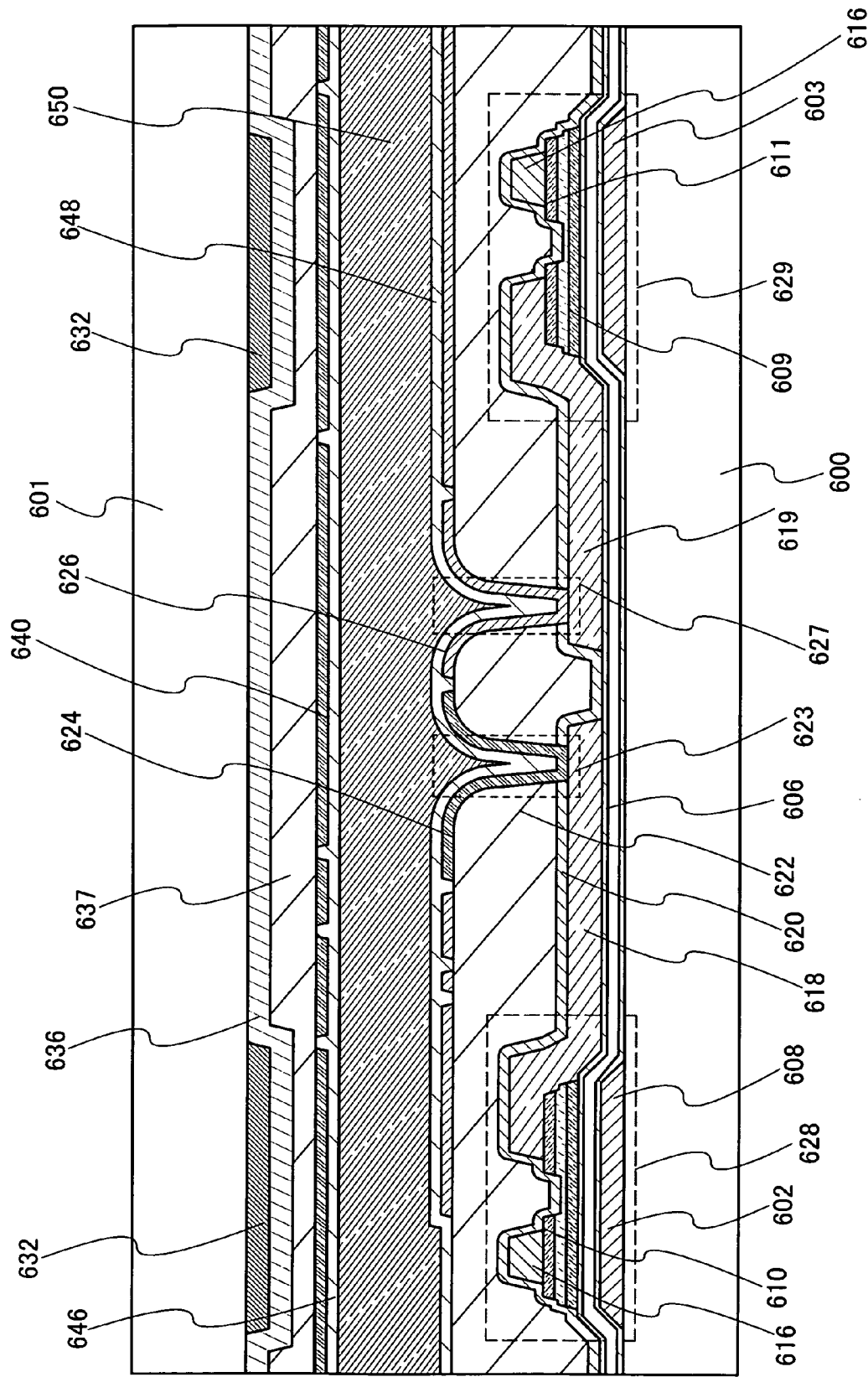
FIG. 21 is a diagram describing an example of a liquid crystal apparatus.
Figure 22:
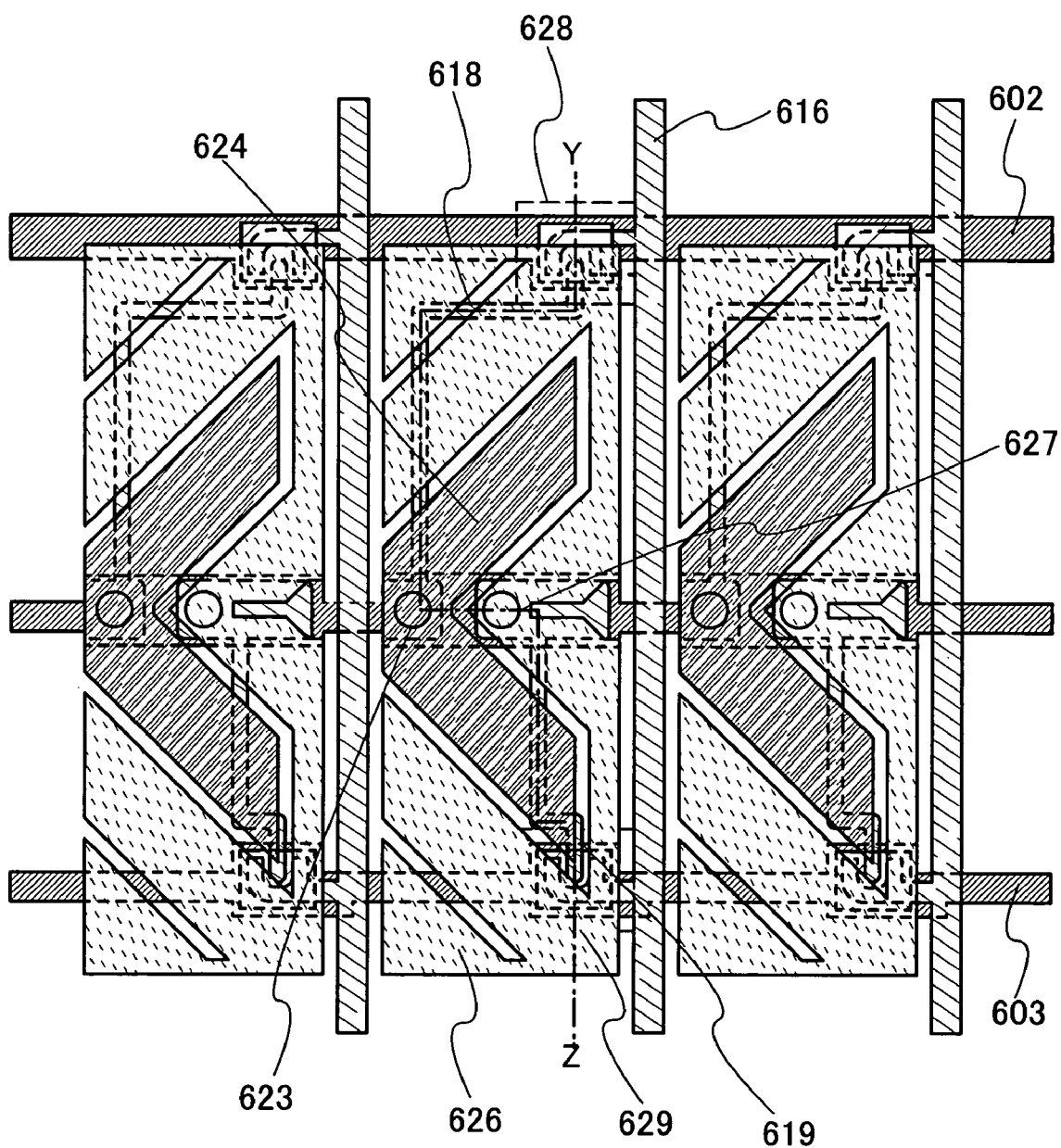
FIG. 22 is a diagram describing an example of a liquid crystal apparatus.

FIG. 21 and FIG. 22 each show a pixel structure of the VA liquid crystal panel. FIG. 22 is a plan view of the substrate 600. FIG. 21 shows a cross-sectional structure along a line Y-Z in FIG. 22. Hereinafter, description is made with reference to these drawings.

In this pixel structure, a plurality of pixel electrodes are included in one pixel, and a TFT is connected to each pixel electrode. Each TFT is driven by a different gate signal. That is, a multi-domain pixel has a structure in which a signal supplied to each pixel electrode is individually controlled.

Via the contact hole 623, the pixel electrode 624 is connected to the TFT 628 through the wiring 618. Via a contact hole 627, the pixel electrode 626 is connected to the TFT 629 through a wiring 619. The gate wiring 602 of the TFT 628 and a gate wiring 603 of the TFT 629 are separated so that different gate signals can be given thereto. In contrast, the wiring 616 functioning as a data line is used in common for the TFTs 628 and 629. As each of the TFTs 628 and 629, the thin film transistor described in Embodiment Mode 1 can be used as appropriate.

Figure 24:
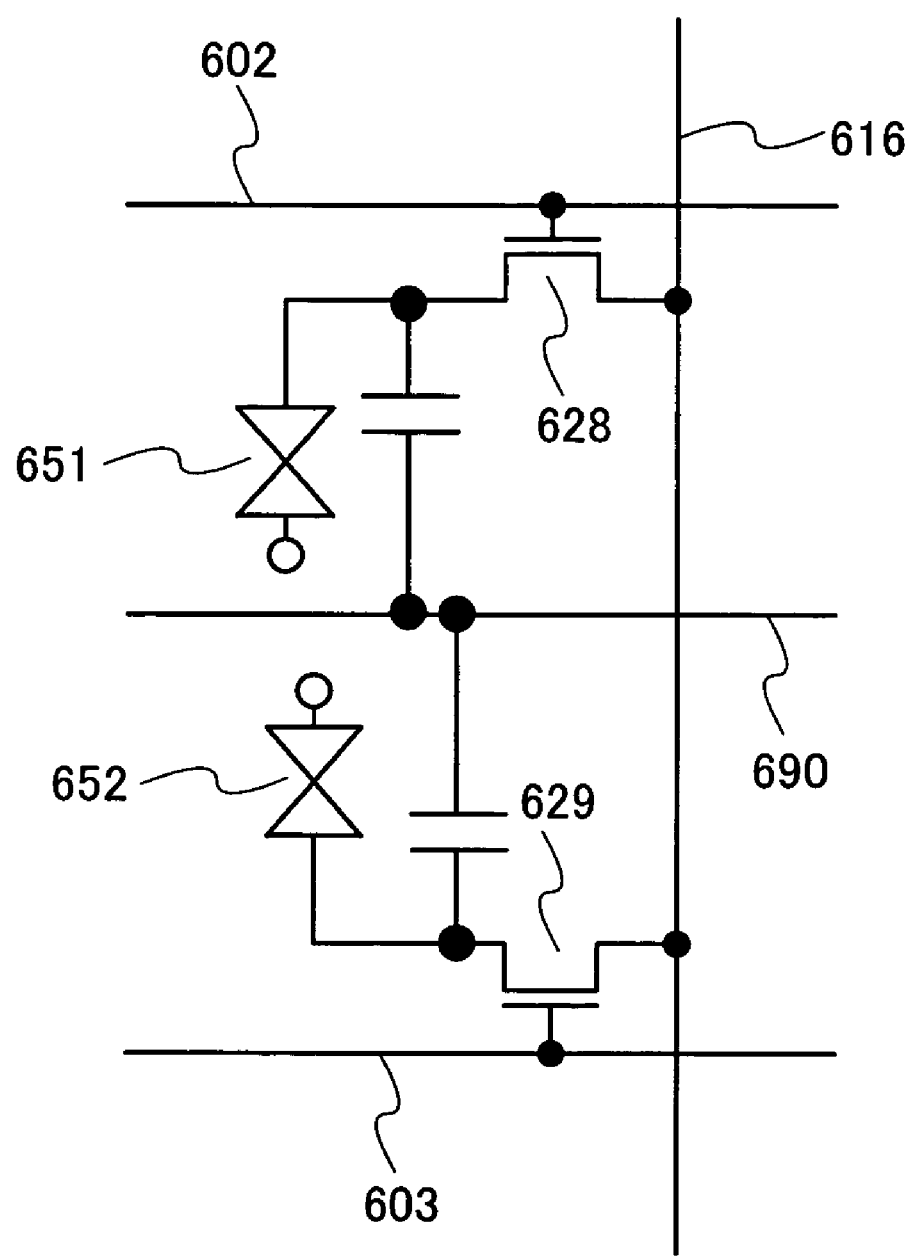
FIG. 24 is a diagram describing an example of a liquid crystal apparatus.

The pixel electrodes 624 and 626 have different shapes and are separated by the slit 625. The pixel electrode 626 is formed so as to surround the external side of the pixel electrode 624 which is spread in a V-shape. Timing of voltage application is made to vary between the pixel electrodes 624 and 626 by the TFTs 628 and 629 in order to control alignment of the liquid crystal. FIG. 24 shows an equivalent circuit of this pixel structure. The TFT 628 is connected to the gate wiring 602. The TFT 629 is connected to the gate wiring 603. When different gate signals are supplied to the gate wirings 602 and 603, operation timings of the TFTs 628 and 629 can vary.

Figure 23:
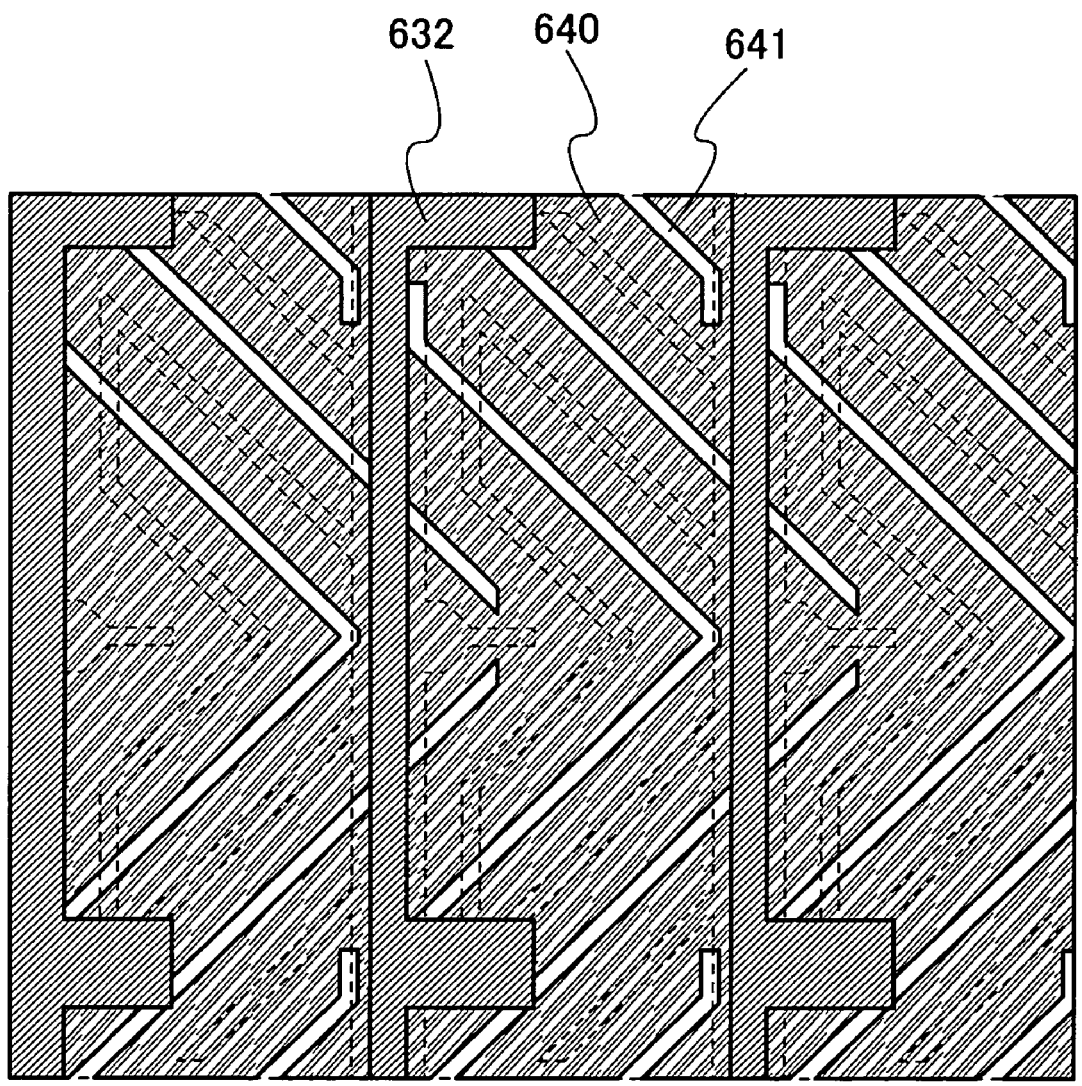
FIG. 23 is a diagram describing an example of a liquid crystal apparatus.

The counter substrate 601 is provided with the light-blocking film 632, the second color film 636, and the counter electrode 640. Moreover, a planarization film 637 is formed between the second color film 636 and the counter electrode 640 to prevent alignment disorder of the liquid crystal. FIG. 23 shows a structure of the counter substrate side. A slit 641 is formed in the counter electrode 640, which is used in common between different pixels. The slit 641 and the slit 625 on the pixel electrodes 624 and 626 side are alternately arranged in an engaging manner; thus, an oblique electric field is effectively generated, and alignment of the liquid crystal can be controlled. Accordingly, a direction in which the liquid crystal is aligned can vary depending on location, and a viewing angle is increased.

A first liquid crystal element is formed by overlapping of the pixel electrode 624, the liquid crystal layer 650, and the counter electrode 640. A second liquid crystal element is formed by overlapping of the pixel electrode 626, the liquid crystal layer 650, and the counter electrode 640. This is a multi-domain structure in which the first liquid crystal element and the second liquid crystal element are included in one pixel.

Next, a horizontal electric field liquid crystal display device is described. The horizontal electric field mode is a method in which an electric field is horizontally applied to liquid crystal molecules in a cell, whereby the liquid crystal is driven to express a gray scale. By this method, a viewing angle can be increased to approximately 180 degrees. Hereinafter, a liquid crystal display device employing the horizontal electric field mode is described.

Figure 25:
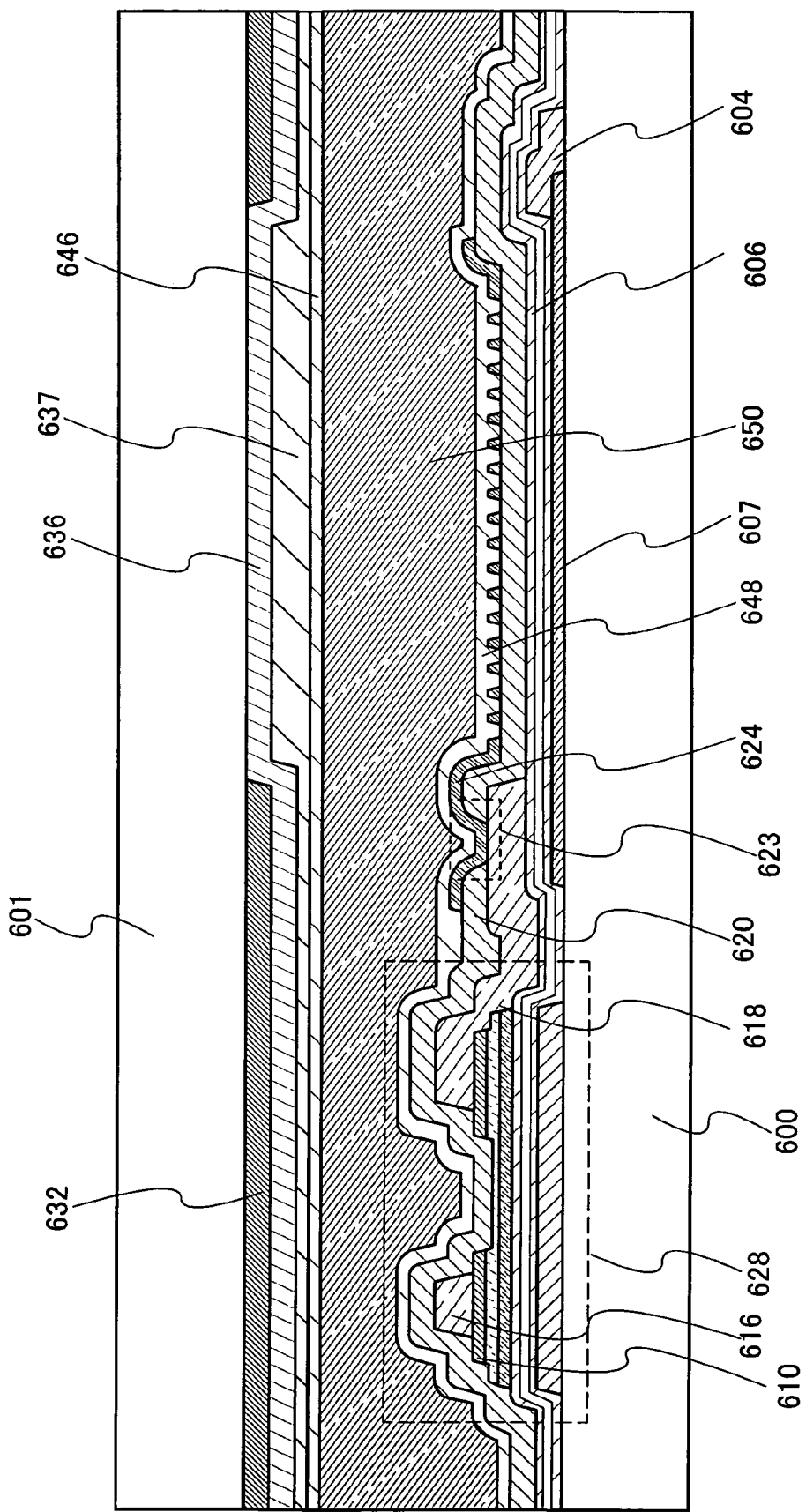
FIG. 25 is a diagram describing an example of a liquid crystal apparatus.

FIG. 25 illustrates a state in which the substrate 600 provided with the TFT 628 and the pixel electrode 624 connected to the TFT 628 overlaps with the counter substrate 601, and liquid crystal is injected therebetween. The counter substrate 601 is provided with the light-blocking film 632, the second color film 636, the planarization film 637, and the like. The pixel electrode is provided on the substrate 600 side, and it is not provided on the counter substrate 601 side. The liquid crystal layer 650 is formed between the substrate 600 and the counter substrate 601.

A first pixel electrode 607, the capacitor wiring 604 connected to the first pixel electrode 607, and the TFT 628 described in Embodiment Mode 1 are formed over the substrate 600. The first pixel electrode 607 can be formed using a material similar to that of the pixel electrode 77 described in Embodiment Mode 1. The first pixel electrode 607 is formed in a shape which is compartmentalized roughly in a pixel shape. Note that the gate insulating film 606 is formed over the first pixel electrode 607 and the capacitor wiring 604.

The wirings 616 and 618 of the TFT 628 are formed over the gate insulating film 606. The wiring 616 serves as a data line extending in one direction, through which a video signal is transmitted in a liquid crystal panel, and is connected to a source region 610 and serves as one of a source electrode and a drain electrode. The wiring 618 serves as the other of the source electrode and the drain electrode, and is connected to the second pixel electrode 624.

The second insulating film 620 is formed over the wirings 616 and 618. Over the insulating film 620, the second pixel electrode 624 connected to the wiring 618 via a contact hole formed in the insulating film 620 is formed. The second pixel electrode 624 is formed using a material similar to that of the pixel electrode 77 described in Embodiment Mode 1.

In such a manner, the TFT 628 and the second pixel electrode 624 connected to the TFT 628 are formed over the substrate 600. Note that a storage capacitor is formed between the first pixel electrode 607 and the second pixel electrode 624.

Figure 26:
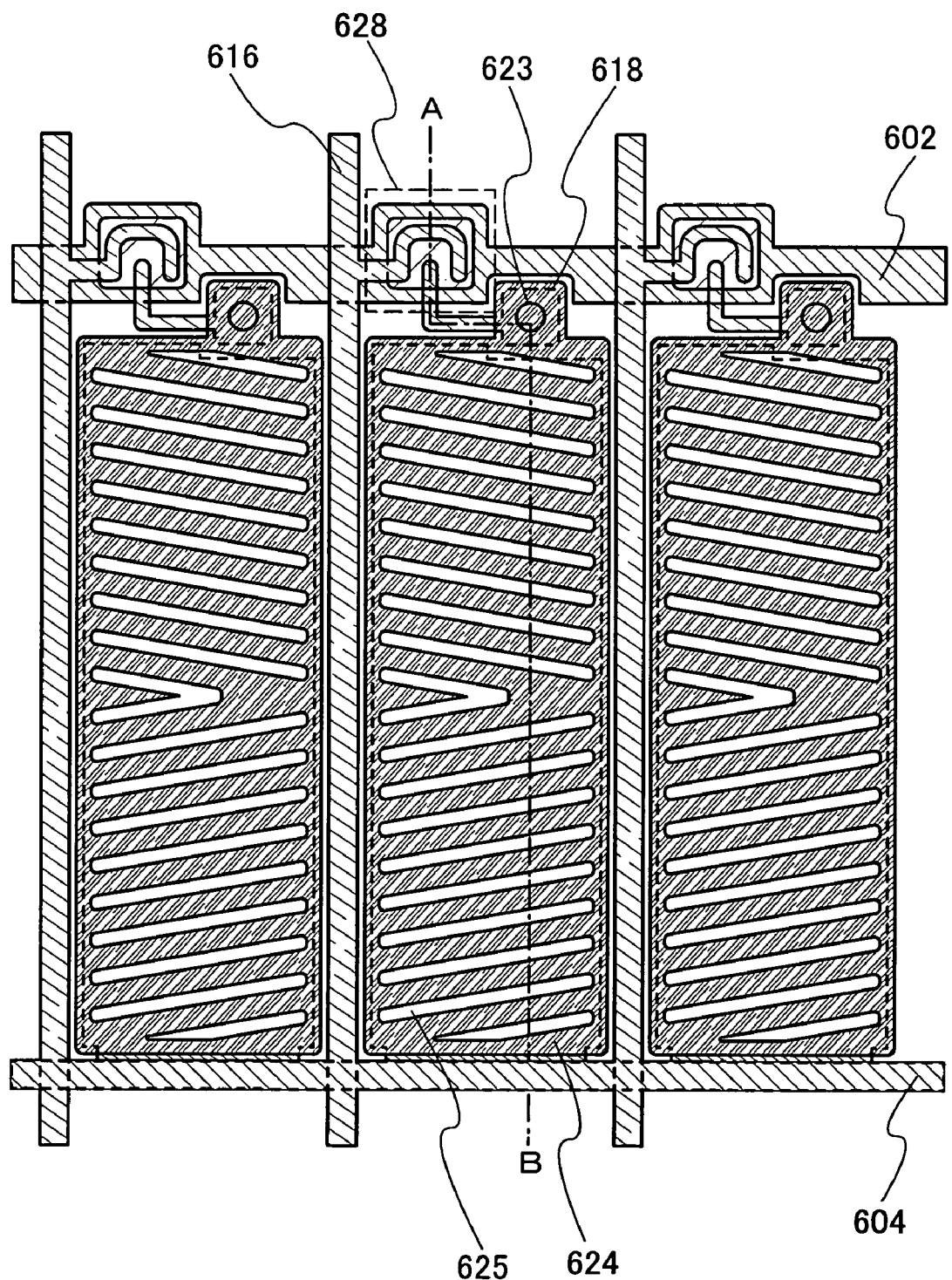
FIG. 26 is a diagram describing an example of a liquid crystal apparatus.

FIG. 26 is a plan view illustrating a structure of the pixel electrode. The pixel electrode 624 is provided with the slit 625. The slit 625 is for controlling alignment of the liquid crystal. In this case, an electric field is generated between the first pixel electrode 607 and the second pixel electrode 624. The thickness of the gate insulating film 606 formed between the first pixel electrode 607 and the second pixel electrode 624 is 50 nm to 200 nm, which is thin enough compared to the liquid crystal layer with a thickness of 2 µm to 10 µm. Accordingly, an electric field is generated substantially in parallel (in a horizontal direction) to the substrate 600. Alignment of the liquid crystal is controlled by the electric field. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased. Further, since both the first pixel electrode 607 and the second pixel electrode 624 are light-transmitting electrodes, an aperture ratio can be increased.

Next, another example of a horizontal electric field liquid crystal display device is described.

Figure 27:
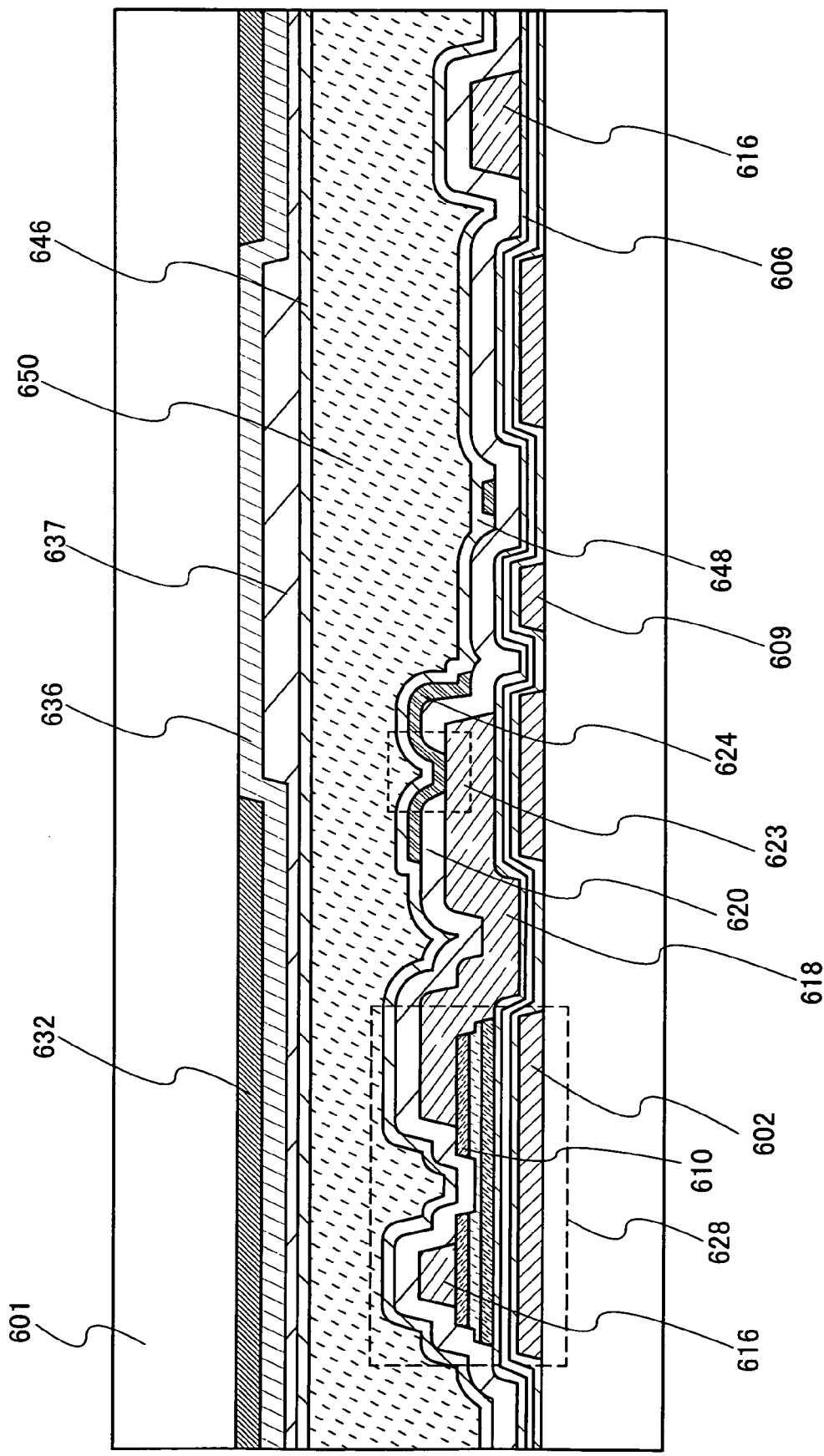
FIG. 27 is a diagram describing an a liquid crystal apparatus of the present invention.
Figure 28:
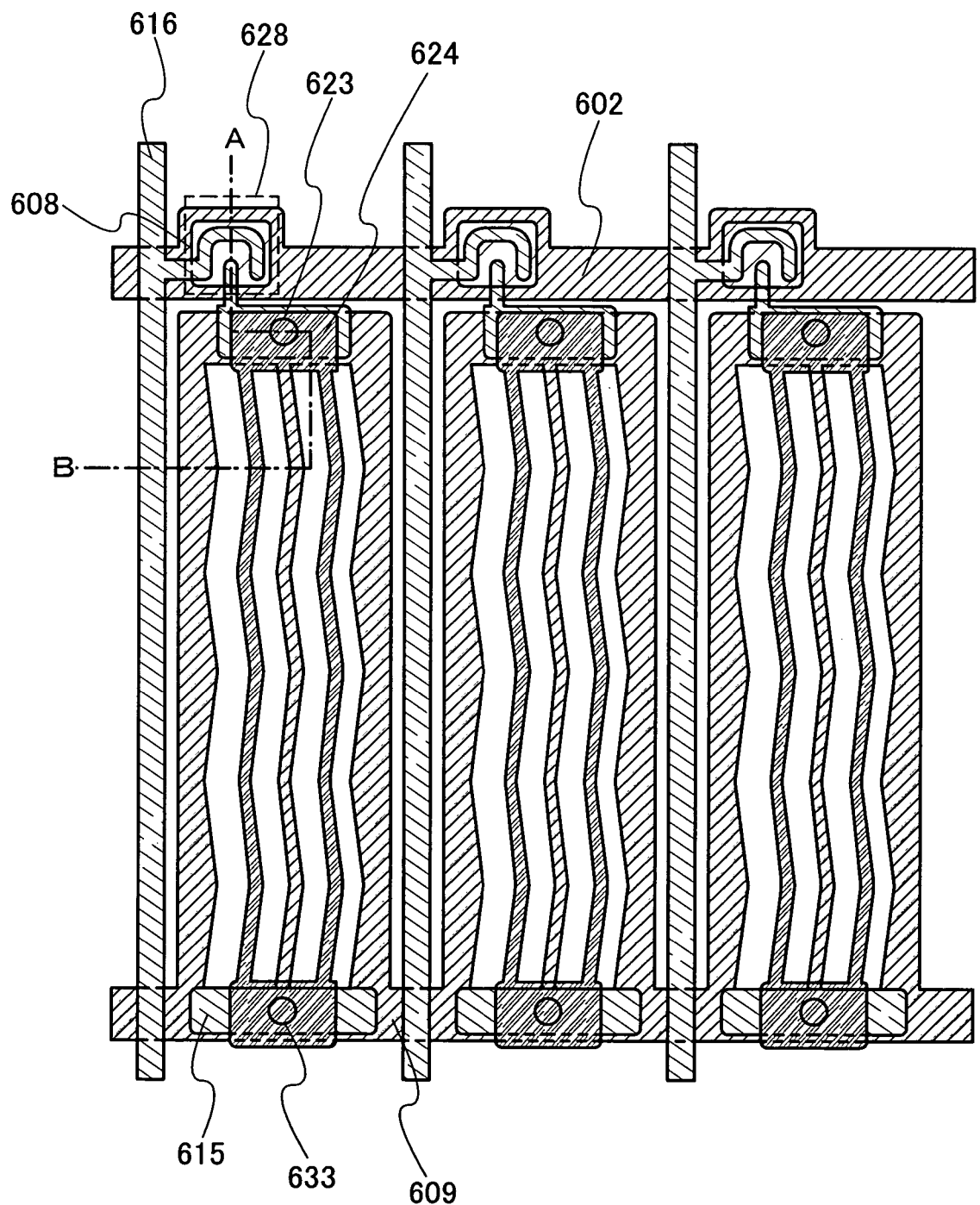
FIG. 28 is a diagram describing an a liquid crystal apparatus of the present invention.

FIG. 27 and FIG. 28 each show a pixel structure of an in-plane switching (IPS) liquid crystal display device. FIG. 28 is a plan view. FIG. 27 shows a cross-sectional structure along a line A-B in FIG. 28. Hereinafter, description is made with reference to these drawings.

FIG. 27 illustrates a state in which the substrate 600 provided with the TFT 628 and the pixel electrode 624 connected to the TFT 628 overlaps with the counter substrate 601, and liquid crystal is injected therebetween. The counter substrate 601 is provided with the light-blocking film 632, the second color film 636, the planarization film 637, and the like. The pixel electrode is provided on the substrate 600 side, and it is not provided on the counter substrate 601 side. The liquid crystal layer 650 is formed between the substrate 600 and the counter substrate 601.

A common potential line 609 and the TFT 628 described in Embodiment Mode 1 are formed over the substrate 600. The common potential line 609 can be formed at the same time as the gate wiring 602 of the TFT 628. The first pixel electrode 607 is formed in a shape which is compartmentalized roughly in a pixel shape.

The wirings 616 and 618 of the TFT 628 are formed over the gate insulating film 606. The wiring 616 serves as a data line extending in one direction, through which a video signal is transmitted in a liquid crystal panel, and is connected to the source region 610 and serves as one of a source electrode and a drain electrode. The wiring 618 serves as the other of the source electrode and the drain electrode, and is connected to the pixel electrode 624.

The second insulating film 620 is formed over the wirings 616 and 618. Over the insulating film 620, the pixel electrode 624 connected to the wiring 618 via the contact hole 623 formed in the insulating film 620 is formed. The pixel electrode 624 is formed using a material similar to that of the pixel electrode 77 described in Embodiment Mode 1. Note that as shown in FIG. 28, the pixel electrode 624 is formed so as to generate a horizontal electric field with a comb-shaped electrode which is formed at the same time as the common potential line 609. Moreover, the pixel electrode 624 is formed so that comb-teeth portions of the pixel electrode 624 are alternately engaged with the comb-shaped electrode which is formed at the same time as the common potential line 609.

Alignment of the liquid crystal is controlled by an electric field generated between a potential applied to the pixel electrode 624 and a potential of the common potential line 609. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased.

In such a manner, the TFT 628 and the pixel electrode 624 connected to the TFT 628 are formed over the substrate 600. A storage capacitor is formed by the common potential line 609, a capacitor electrode 615, and the gate insulating film 606 provided therebetween. The capacitor electrode 615 and the pixel electrode 624 are connected via a contact hole 633.

Next, a mode of a TN liquid crystal display device is described.

Figure 29:
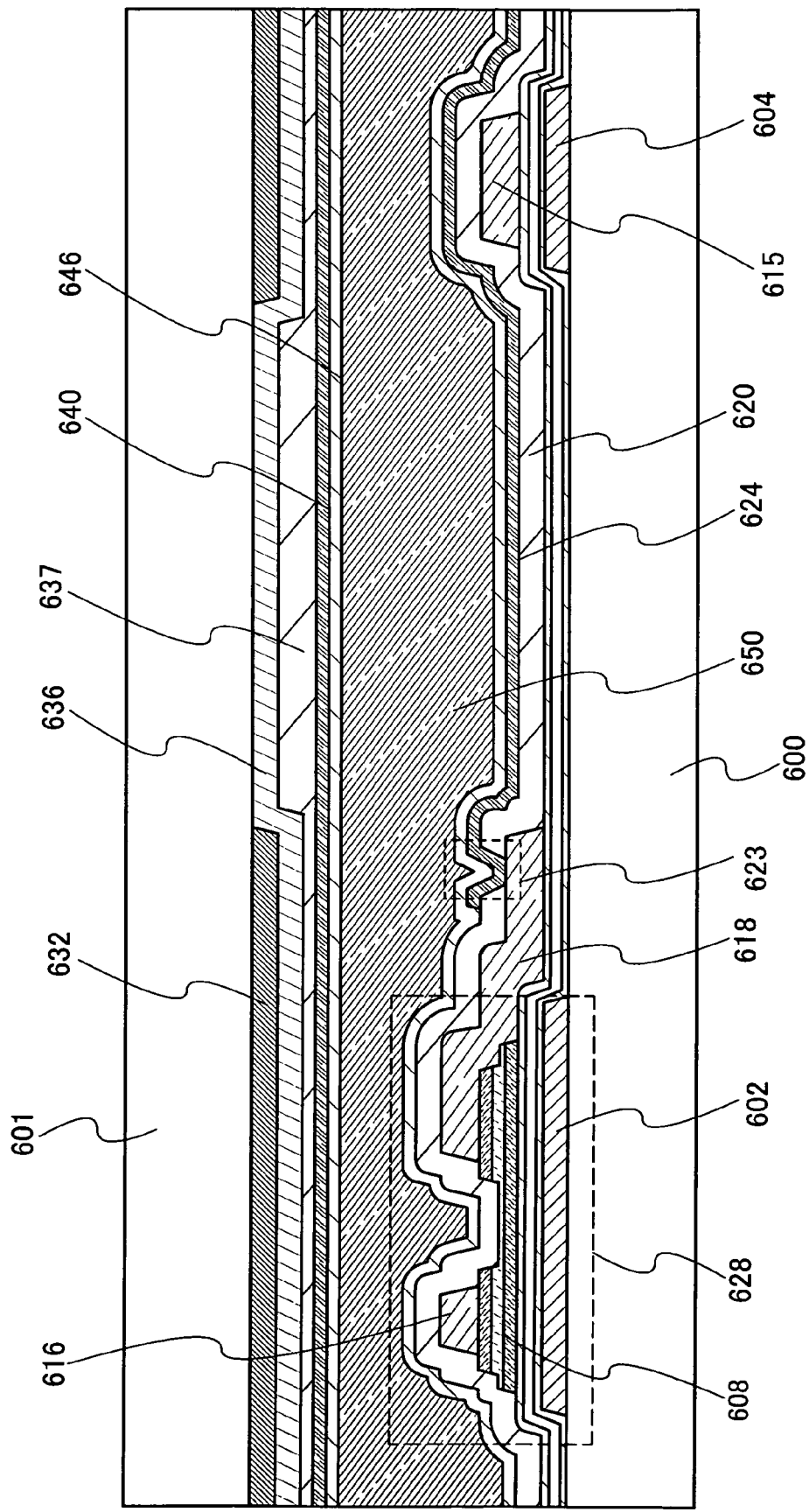
FIG. 29 is a diagram describing an example of a liquid crystal apparatus.
Figure 30:
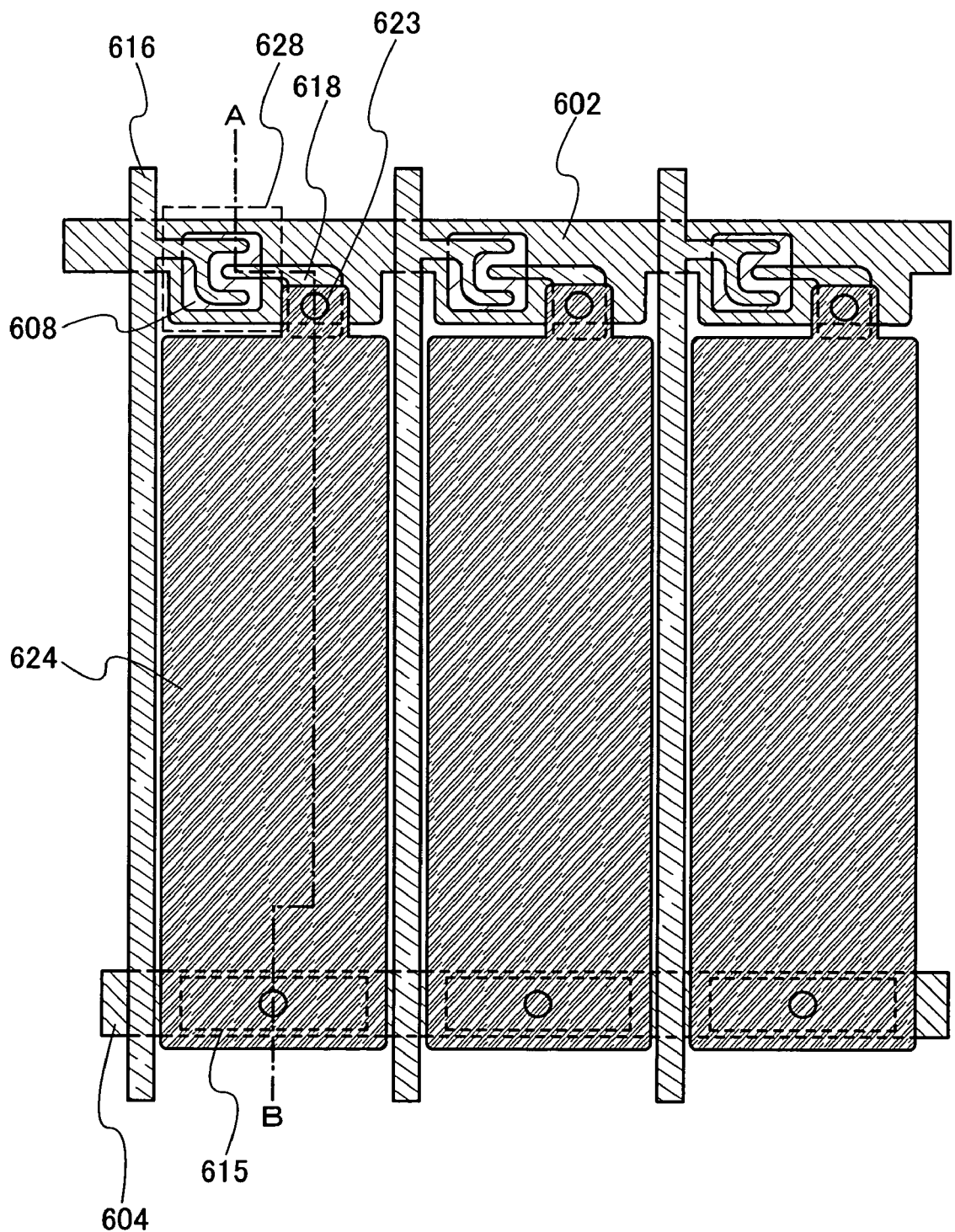
FIG. 30 is a diagram describing an example of a liquid crystal apparatus.

FIG. 29 and FIG. 30 each show a pixel structure of a TN liquid crystal display device. FIG. 30 is a plan view. FIG. 29 shows a cross-sectional structure along a line A-B in FIG. 30. Hereinafter, description is made with reference to these drawings.

The pixel electrode 624 is connected to the TFT 628 by the wiring 618 via the contact hole 623. The wiring 616 functioning as a data line is connected to the TFT 628. As the TFT 628, any of the TFTs described in Embodiment Mode 1 can be used.

The pixel electrode 624 is formed using a material similar to that of the pixel electrode 77 described in Embodiment Mode 1.

The counter substrate 601 is provided with the light-blocking film 632, the second color film 636, and the counter electrode 640. The planarization film 637 is formed between the second color film 636 and the counter electrode 640 to prevent alignment disorder of liquid crystal. The liquid crystal layer 650 is formed between the pixel electrode 624 and the counter electrode 640.

A liquid crystal element is formed by overlapping of the pixel electrode 624, the liquid crystal layer 650, and the counter electrode 640.

The substrate 600 or the counter substrate 601 may be provided with a color filter, a blocking film (a black matrix) for preventing disclination, or the like. Further, a polarizing plate is attached to a surface of the substrate 600, which is opposite to a surface on which the thin film transistor is formed. Moreover, a polarizing plate is attached to a surface of the counter substrate 601, which is opposite to a surface on which the counter electrode 640 is formed.

The counter electrode 640 can be formed using a material similar to that of the pixel electrode 624. The liquid crystal element is formed by overlapping of the pixel electrode 624, the liquid crystal layer 650, and the counter electrode 640.

Through the above-described steps, the liquid crystal display device can be formed. Since a thin film transistor with small off-current, high electric characteristics, and high reliability is used in the liquid crystal display device of this embodiment mode, the liquid crystal display device has high contrast and high visibility. Further, using the plasma CVD apparatus shown in FIG. 6, by generating plasma through supplying high-frequency power that does not exhibit an effect of surface standing wave and high-frequency power in the VHF band, an even and good quality thin film can be manufactured over a large-area glass substrate with a long side that has a length of 2000 mm, variation in electric characteristics of a liquid crystal display device can be suppressed, and mass production can be performed.

Embodiment Mode 6

In this Embodiment Mode, a light-emitting device which is one mode of the display device will be described with reference to FIGS. 13A and 13B, FIGS. 14A to 14C, FIGS. 15A and 15B, FIGS. 31A and 31B, and FIGS. 32A to 32C. A light-emitting device, in which a light-emitting element utilizing electroluminescence is used, is described here. Light-emitting elements utilizing electroluminescence are classified according to whether a light-emitting material is an organic compound or an inorganic compound. In general, the former is referred to as organic EL elements and the latter as inorganic EL elements.

In an organic EL element, by application of voltage to a light-emitting element, electrons and holes are separately injected from a pair of electrodes into a layer containing a light-emitting organic compound, and current flows. Then, recombination of these carriers (the electrons and holes) causes the light-emitting organic compound to be in an excited state and to emit light when it returns from the excited state to a ground state. Due to such a mechanism, such a light-emitting element is referred to as a current-excitation light-emitting element.

Inorganic EL elements are classified into a dispersion type inorganic EL element and a thin-film type inorganic EL element, depending on their element structures. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure in which a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element. In addition, description is made using the thin film transistor described in Embodiment Mode 1 as a thin film transistor which controls driving of a light-emitting element. In a light-emitting device in which the thin film transistor obtained according to Embodiment Mode 1 is used, variation in threshold voltage of the thin film transistor can be suppressed and reliability can be improved. In particular, the thin film transistor which is used in the light-emitting device is driven by direct current. Thus, the thin film transistor described in Embodiment Mode 1 having a gate insulating film with a three-layer structure in which a silicon nitride film is formed as a first layer, a silicon oxynitride film is formed as a second layer, and a silicon nitride film is formed as a third layer can suppress a drift of the threshold voltage mainly owing to the silicon oxynitride film in the second layer.

Figure 31A:
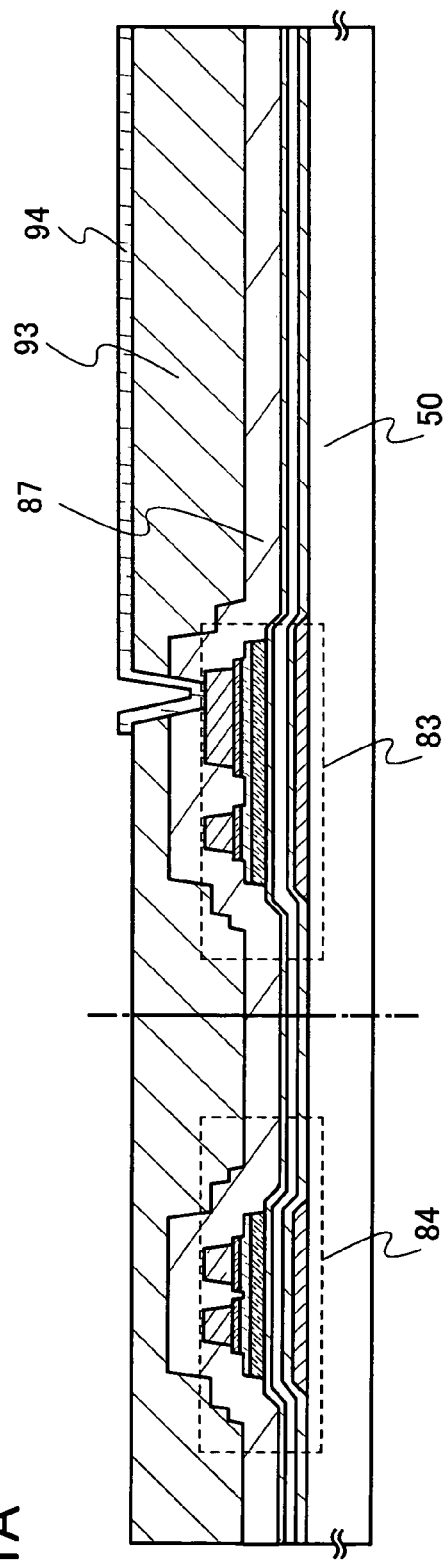
FIGS. 31A and 31B are cross-sectional views describing an example of a manufacturing method of a light-emitting device.
Figure 31B:
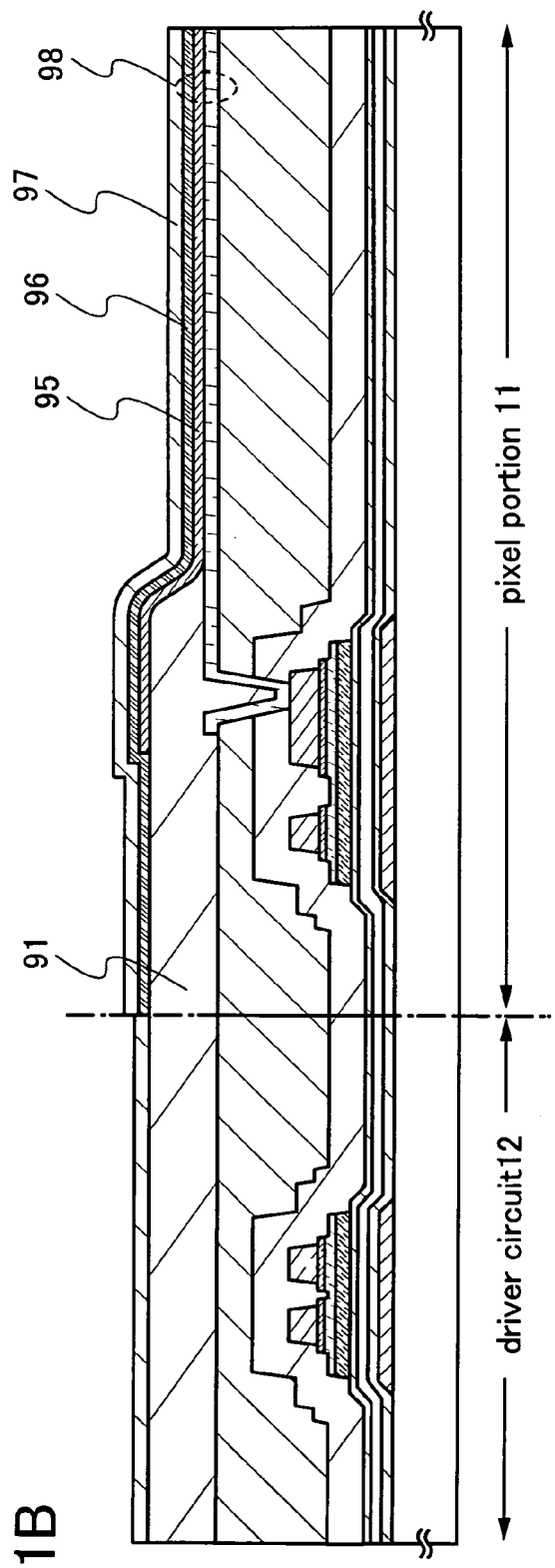

Through the process of FIGS. 13A and 13B, FIGS. 14A to 14C, and FIGS. 15A and 15B, as shown in FIGS. 31A and 31B, the thin film transistor 83 is formed over the substrate 50, and an insulating film 87 functioning as a protective film is formed over the thin film transistor 83. A thin film transistor 84 is formed for a driver circuit 12. The thin film transistor 84 can be formed in the same manufacturing process as the thin film transistor 83 in a pixel portion 11. Next, a planarization film 93 is formed over the insulating film 87, and a pixel electrode 94 connected to a source or drain electrode of the thin film transistor 83 is formed over the planarization film 93.

It is preferable that the planarization film 93 be formed using an organic resin such as acrylic, polyimide, or polyamide, or using siloxane.

In FIG. 31A, the thin film transistor in the pixel portion 11 is an n-type transistor; thus, it is desired that the pixel electrode 94 be a cathode. In contrast, when the thin film transistor is a p-type transistor, it is desired that the pixel electrode 94 be an anode. Specifically, as a cathode, a known material with a low work function, such as calcium, aluminum, calcium fluoride, a magnesium-silver alloy, or a lithium-aluminum alloy, can be used.

Next, as shown in FIG. 31B, a partition 91 is formed over the planarization film 93 and an end portion of the pixel electrode 94. The partition 91 has an opening, through which the pixel electrode 94 is exposed. The partition 91 is formed using an organic resin film, an inorganic insulating film, or organic polysiloxane. It is particularly preferable that the partition be formed using a photosensitive material to have an opening over the pixel electrode so that a sidewall of the opening is formed as an inclined surface with continuous curvature.

Next, a light-emitting layer 95 is formed in contact with the pixel electrode 94 in the opening of the partition 91. The light-emitting layer 95 may be formed using either a single layer or a stacked layer of a plurality of layers.

Then, a common electrode 96 serving as an anode is formed to cover the light-emitting layer 95. The common electrode 96 can be formed of a light-transmitting conductive film using any of the light-transmitting conductive materials listed in Embodiment Mode 1 for the pixel electrode 77. As the common electrode 96, a titanium nitride film or a titanium film may be used in addition to the above-mentioned light-transmitting conductive films. In FIG. 31B, indium tin oxide is used for the common electrode 96. In the opening of the partition 91, a light-emitting element 98 is formed by overlapping of the pixel electrode 94, the light-emitting layer 95, and the common electrode 96. After that, it is preferable that a protective film 97 be formed over the common electrode 96 and the partition 91 so that oxygen, hydrogen, moisture, carbon dioxide, or the like does not enter the light-emitting element 98. As the protective film 97, a silicon nitride film, a silicon nitride oxide film, a DLC film, or the like can be formed.

Furthermore, in practice, after the steps to the step of FIG. 31B are completed, it is preferable that packaging (sealing) be performed using a protective film (a laminated film, an ultraviolet curable resin film, or the like), or a cover material having high airtightness and causing less degasification, in order to prevent further exposure to external air.

Next, structures of light-emitting elements are described with reference to FIGS. 32A to 32C. Here, the case where a driving TFT is of n-type is given as an example, and cross-sectional structures of pixels are described.

In a light-emitting element, it is acceptable as long as at least one of an anode and a cathode is transparent in order to extract light emission. There are light-emitting elements having the following structures: a top emission structure in which a thin film transistor and a light-emitting element are formed over a substrate and light is extracted from a side opposite to the substrate; a bottom emission structure in which light is extracted from the substrate side; and a dual emission structure in which light is extracted from both the substrate side and the side opposite to the substrate. The pixel structure of the present invention can be applied to a light-emitting element with any of the emission structures.

A light-emitting element having a top emission structure is described with reference to FIG. 32A.

Figure 32A:
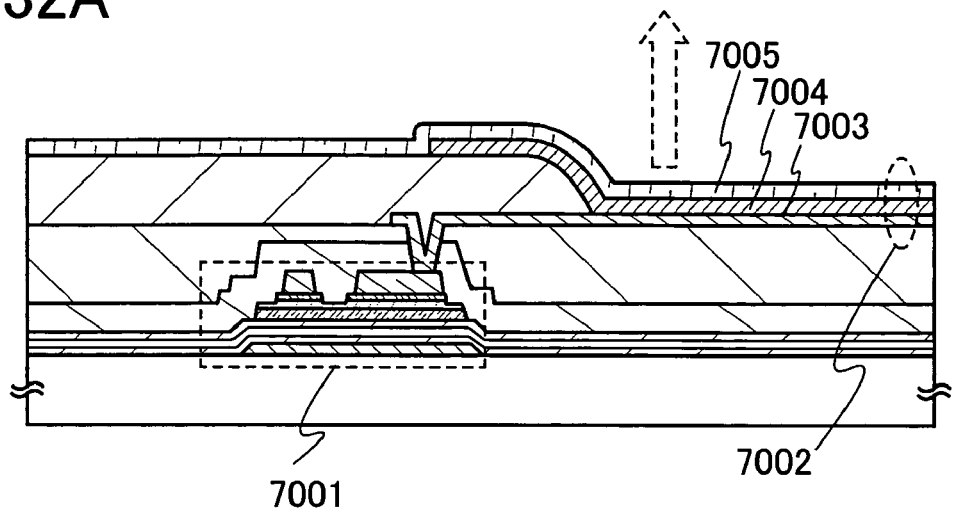
FIGS. 32A to 32C are cross-sectional views describing a pixel that can be applied to a light-emitting device.

FIG. 32A is a cross-sectional view of a pixel in the case where a driving TFT 7001 is of n-type and light is emitted from a light-emitting element 7002 to an anode 7005 side. In FIG. 32A, a cathode 7003 of the light-emitting element 7002 is electrically connected to the driving TFT 7001, and a light-emitting layer 7004 and the anode 7005 are sequentially stacked over the cathode 7003. The cathode 7003 can be formed using any known conductive material as long as it has a low work function and reflects light. For example, calcium, aluminum, calcium fluoride, a magnesium-silver alloy, a lithium-aluminum alloy, or the like is preferable. The light-emitting layer 7004 may be formed using either a single layer or a stacked layer of a plurality of layers. In the case of using a plurality of layers, an electron injection layer, an electron transport layer, a light-emitting layer, a hole transport layer, and a hole injection layer are stacked in this order over the cathode 7003. Note that all of these layers do not always need to be provided. The anode 7005 is formed using a light-transmitting conductive material that transmits light, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like may be used.

A region where the light-emitting layer 7004 is sandwiched between the cathode 7003 and the anode 7005 corresponds to the light-emitting element 7002. In the case of the pixel shown in FIG. 32A, light is emitted from the light-emitting element 7002 to the anode 7005 side as indicated by an outlined arrow.

Next, a light-emitting element having a bottom emission structure is described with reference to FIG. 32B. FIG. 32B is a cross-sectional view of a pixel in the case where a driving TFT 7011 is of n-type and light is emitted from a light-emitting element 7012 to a cathode 7013 side. In FIG. 32B, the cathode 7013 of the light-emitting element 7012 is formed over a light-transmitting conductive material 7017 which is electrically connected to the driving TFT 7011, and a light-emitting layer 7014 and an anode 7015 are sequentially stacked over the cathode 7013. Note that, in the case where the anode 7015 has a light-transmitting property, a blocking film 7016 for reflecting or blocking light may be formed to cover the anode. As in FIG. 32A, the cathode 7013 can be formed using any known conductive material as long as it has a low work function. Note that the thickness of the cathode 7013 is set such that light is transmitted therethrough (preferably, about 5 nm to 30 nm). For example, an Al film with a thickness of 20 nm can be used as the cathode 7013. As in FIG. 32A, the light-emitting layer 7014 may be formed using either a single layer or a stacked layer of a plurality of layers. Although the anode 7015 does not need to be able to transmit light, as in FIG. 32A, it can be formed using a light-transmitting conductive material. The blocking film 7016 can be formed using, for example, a metal which reflects light, or the like; however, the blocking film 7016 is not limited to a metal film. For example, a resin to which black colorant is added can also be used.

A region where the light-emitting layer 7014 is sandwiched between the cathode 7013 and the anode 7015 corresponds to the light-emitting element 7012. In the case of the pixel shown in FIG. 32B, light is emitted from the light-emitting element 7012 to the cathode 7013 side as indicated by an outlined arrow.

Next, a light-emitting element having a dual emission structure is described with reference to FIG. 32C. In FIG. 32C, a cathode 7023 of a light-emitting element 7022 is formed over a light-transmitting conductive material 7027 which is electrically connected to a driving TFT 7021, and a light-emitting layer 7024 and an anode 7025 are sequentially stacked over the cathode 7023. As in FIG. 32A, the cathode 7023 can be formed using any known conductive material as long as it has a low work function. Note that the thickness of the cathode 7023 is set such that light is transmitted therethrough. For example, an Al film with a thickness of 20 nm can be used as the cathode 7023. As in FIG. 32A, the light-emitting layer 7024 may be formed using either a single layer or a stacked layer of a plurality of layers. As in FIG. 32A, the anode 7025 can be formed using a light-transmitting conductive material which transmits light.

A region where the cathode 7023, the light-emitting layer 7024, and the anode 7025 overlap with each other corresponds to the light-emitting element 7022. In the case of the pixel shown in FIG. 32C, light is emitted from the light-emitting element 7022 to both the anode 7025 side and the cathode 7023 side as indicated by outlined arrows.

Note that, although an organic EL element is described here as a light-emitting element, an inorganic EL element can also be provided as a light-emitting element.

Note that, in this embodiment mode, the example is described in which a thin film transistor (a driving TFT) which controls the driving of a light-emitting element is electrically connected to the light-emitting element, but a structure may be employed in which a TFT for current control is connected between the driving TFT and the light-emitting element.

Figure 32B:
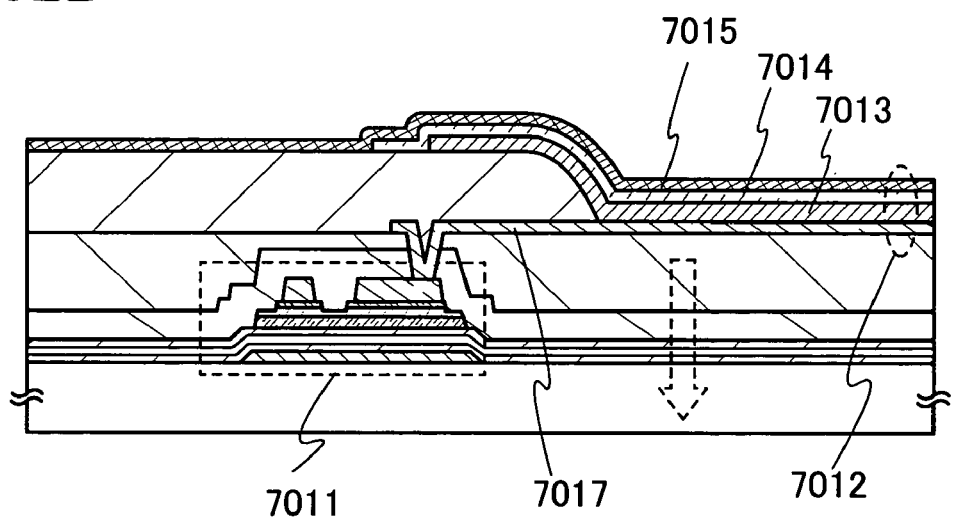
Figure 32C:
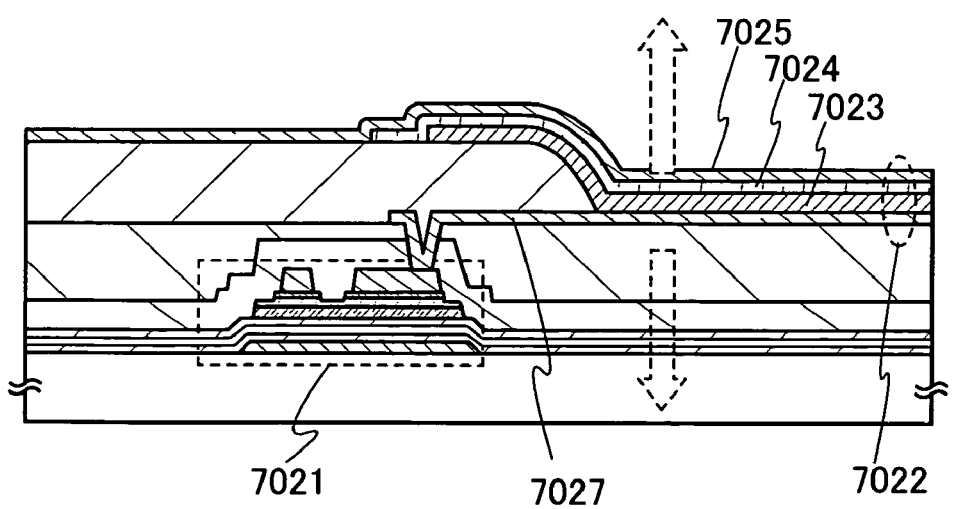

Note that the light-emitting device described in this embodiment mode is not limited to the structures shown in FIGS. 32A to 32C and can be modified in various ways based on the technical idea of the present invention.

Through the above-described steps, the light-emitting device can be formed. Since a thin film transistor with small off-current, high electric characteristics, and high reliability is used in the light-emitting device of this embodiment mode, the light-emitting device has high contrast and high visibility. Further, using the plasma CVD apparatus shown in FIG. 6, by generating plasma through supplying high-frequency power that does not exhibit an effect of surface standing wave and high-frequency power in the VHF band, an even and good quality thin film can be manufactured over a large-area glass substrate with a long side that has a length of 2000 mm, variation in electric characteristics of a light-emitting device can be suppressed, and mass production can be performed.

Embodiment Mode 7

A structure of a display panel, which is one mode of the display device of the present invention, will be described below.

Figure 33A:
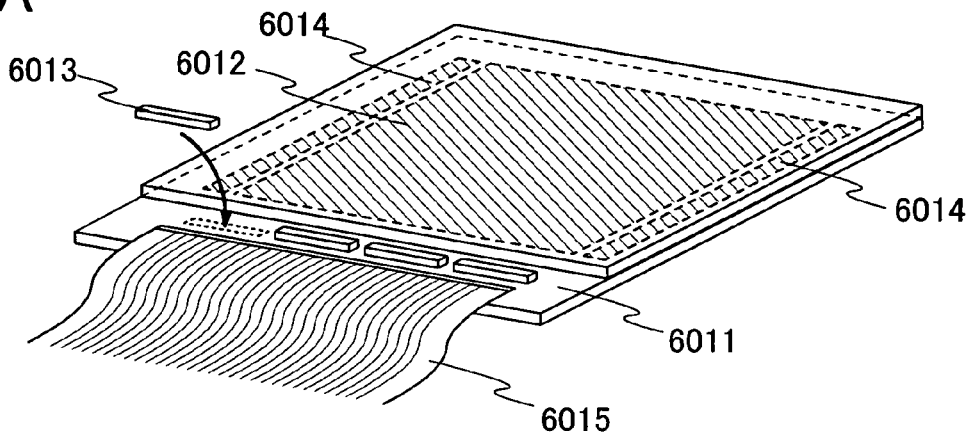
FIGS. 33A to 33C are perspective views each describing a display panel.

FIG. 33A shows a mode of a display panel in which a signal line driver circuit 6013 which is separately formed is connected to a pixel portion 6012 formed over a substrate 6011. The pixel portion 6012 and a scanning line driver circuit 6014 are each formed using a thin film transistor in which a microcrystalline semiconductor film is used. When the signal line driver circuit is formed using a transistor in which higher mobility can be obtained compared to the thin film transistor using the microcrystalline semiconductor film, an operation of the signal line driver circuit which demands a higher driving frequency than that of the scanning line driver circuit can be stabilized. Note that the signal line driver circuit 6013 may be formed using a transistor using a single crystalline semiconductor, a thin film transistor using a polycrystalline semiconductor, or a transistor using SOI. The pixel portion 6012, the signal line driver circuit 6013, and the scanning line driver circuit 6014 are each supplied with a potential of a power source, a variety of signals, and the like via an FPC 6015.

Note that both the signal line driver circuit and the scanning line driver circuit may be formed over the same substrate as that of the pixel portion.

Figure 33B:
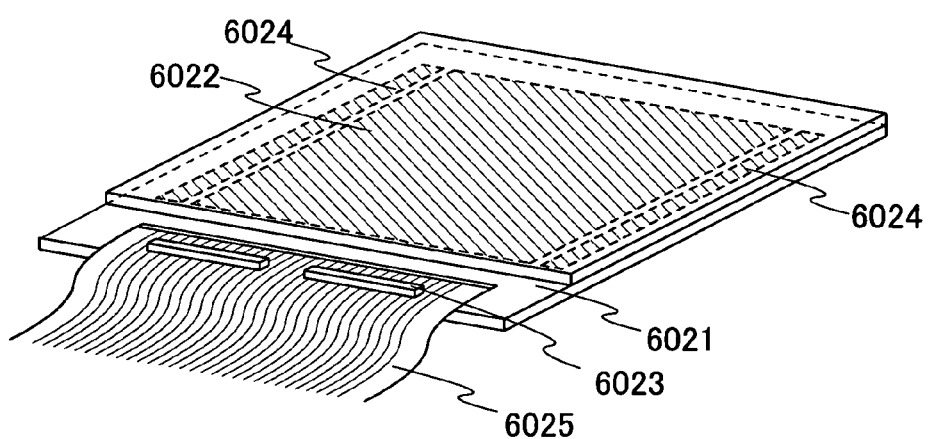

When a driver circuit is separately formed, a substrate over which the driver circuit is formed is not necessarily attached to a substrate over which a pixel portion is formed, and may be attached to an FPC, for example. FIG. 33B shows a mode of a liquid crystal display panel in which a signal line driver circuit 6023 which is separately formed is connected to a pixel portion 6022 and a scanning line driver circuit 6024 formed over a substrate 6021. The pixel portion 6022 and the scanning line driver circuit 6024 are each formed using a thin film transistor in which a microcrystalline semiconductor film is used. The signal line driver circuit 6023 is connected to the pixel portion 6022 via an FPC 6025. The pixel portion 6022, the signal line driver circuit 6023, and the scanning line driver circuit 6024 are each supplied with a potential of a power source, a variety of signals, and the like via the FPC 6025.

Figure 33C:
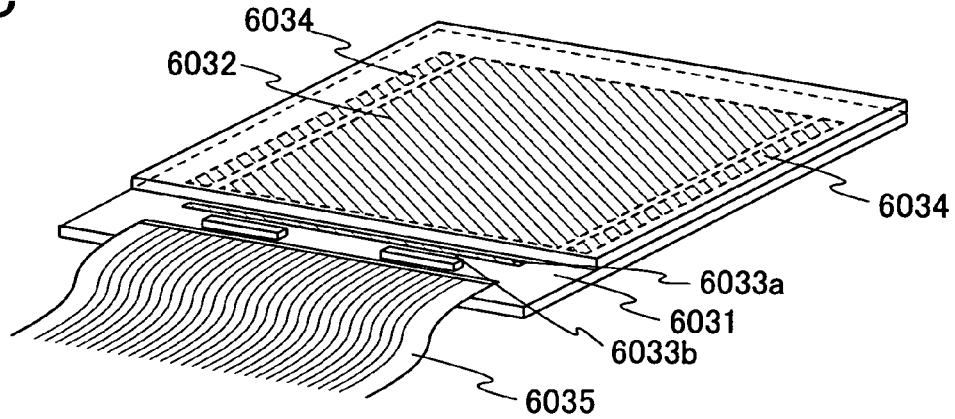

Alternatively, only part of a signal line driver circuit or part of a scanning line driver circuit may be formed over the same substrate as that of a pixel portion by using a thin film transistor which uses a microcrystalline semiconductor film, and the other part of the driver circuit may be separately formed and electrically connected to the pixel portion. FIG. 33C shows a mode of a liquid crystal display panel in which an analog switch 6033a which is part of a signal line driver circuit is formed over a substrate 6031, which is the same substrate as that of a pixel portion 6032 and a scanning line driver circuit 6034, and a shift register 6033b which is part of the signal line driver circuit is separately formed over a different substrate and attached to the substrate 6031. The pixel portion 6032 and the scanning line driver circuit 6034 are each formed using a thin film transistor in which a microcrystalline semiconductor film is used. The shift register 6033b which is part of the signal line driver circuit is connected to the pixel portion 6032 via an FPC 6035. The pixel portion 6032, the signal line driver circuit, and the scanning line driver circuit 6034 are each supplied with a potential of a power source, a variety of signals, and the like via the FPC 6035.

As shown in FIGS. 33A to 33C, in a liquid crystal display device of the present invention, all or a part of the driver circuit can be formed over the same substrate as that of the pixel portion, using the thin film transistor in which the microcrystalline semiconductor film is used.

Note that a connection method of a substrate which is separately formed is not particularly limited, and a known method such as a COG method, a wire bonding method, or a TAB method can be used. Further, a connection position is not limited to the positions shown in FIGS. 33A to 33C as long as electrical connection is possible. Moreover, a controller, a CPU, a memory, or the like may be formed separately and connected.

Note that a signal line driver circuit used in the present invention is not limited to a structure including only a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Figure 36:
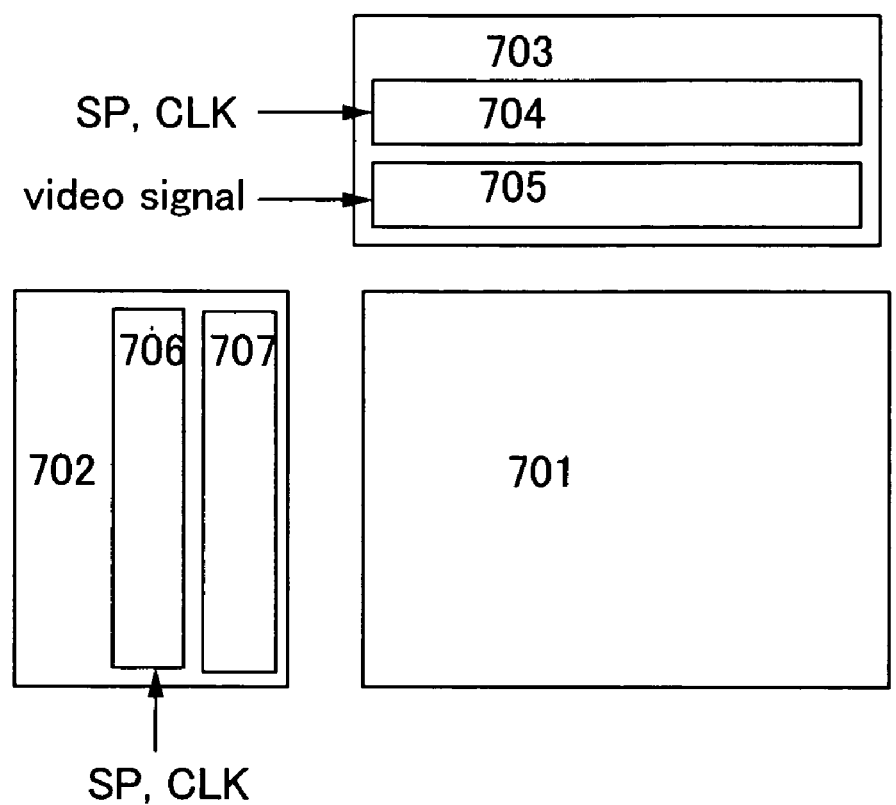
FIG. 36 is a block diagram describing a structure of a light-emitting device.

FIG. 36 is a block diagram of a liquid crystal display device of the present invention. The display device shown in FIG. 36 includes a pixel portion 701 including a plurality of pixels each provided with a display element, a scanning line driver circuit 702 which selects each pixel, and a signal line driver circuit 703 which controls input of a video signal to a selected pixel.

In FIG. 36, the signal line driver circuit 703 includes a shift register 704 and an analog switch 705. A clock signal (CLK) and a start pulse signal (SP) are input to the shift register 704. When the clock signal (CLK) and the start pulse signal (SP) are input, a timing signal is generated in the shift register 704 and input to the analog switch 705.

A video signal is supplied to the analog switch 705. The analog switch 705 samples the video signal in accordance with the timing signal that is input and supplies the resulting signal to a signal line of the next stage.

Next, a structure of the scanning line driver circuit 702 is described. The scanning line driver circuit 702 includes a shift register 706 and a buffer 707. The scanning line driver circuit 702 may also include a level shifter in some cases. In the scanning line driver circuit 702, when the clock signal (CLK) and the start pulse signal (SP) are input to the shift register 706, a selection signal is generated. The generated selection signal is buffered and amplified by the buffer 707, and the resulting signal is supplied to a corresponding scanning line. Gates of transistors in pixels of one line are connected to the scanning line. Further, since the transistors in the pixels of one line have to be turned on at the same time, a buffer through which large current can flow is used as the buffer 707.

In a full color liquid crystal display device, when video signals corresponding to R (red), G (green), and B (blue) are sequentially sampled and supplied to a corresponding signal line, the number of terminals for connecting the shift register 704 and the analog switch 705 corresponds to approximately ⅓ of the number of terminals for connecting the analog switch 705 and the signal line in the pixel portion 700. Accordingly, when the analog switch 705 and the pixel portion 700 are formed over the same substrate, the number of terminals used for connecting a substrate which is separately formed can be suppressed compared to the case where the analog switch 705 and the pixel portion 700 are formed over different substrates; thus, occurrence probability of bad connection can be suppressed, and the yield can be increased.

Note that although the scanning line driver circuit 702 shown in FIG. 36 includes the shift register 706 and the buffer 707, the scanning line driver circuit 702 may be formed using only the shift register 706.

Note that structures of the signal line driver circuit and the scanning line driver circuit are not limited to the structures shown in FIG. 36, which are merely one mode of the display device of the present invention. In a liquid crystal display device including the circuit as shown in FIG. 36 having a transistor using a microcrystalline semiconductor, the circuit can be operated at high speed. For example, mobility of a transistor using a microcrystalline semiconductor film is higher than that of a transistor using an amorphous semiconductor film; thus, a driving frequency of a driver circuit (e.g., the shift register 706 in the scanning line driver circuit 702) can be increased. Since the scanning line driver circuit 702 can be operated at high speed, a frame frequency can be increased or black frame insertion can be realized, for example.

When the frame frequency is increased, data for a screen is preferably generated in accordance with a direction of movement of an image. That is, motion compensation is preferably performed to interpolate data. When the frame frequency is increased and image data is interpolated in such a manner, display characteristics of moving images are improved, and smooth display can be performed. For example, when a frame frequency is twice (e.g., 120 Hz or 100 Hz) or more, and preferably four times (e.g., 480 Hz or 400 Hz) or more, blurring and afterimages of moving images can be reduced. In this case, the driving frequency of the scanning line driver circuit 702 is also increased to be operated; thus, the frame frequency can be increased.

When black frame insertion is performed, image data or data for black display is supplied to the pixel portion 701. Thus, such a display mode is closer to impulse driving, and afterimages can be reduced. In this case, the driving frequency of the scanning line driver circuit 702 is also increased to be operated, and thus, black frame insertion can be performed.

In addition, when the channel width of the thin film transistor in the scanning line driver circuit 702 is increased or a plurality of scanning line driver circuits are provided, for example, a higher frame frequency can be realized. For example, a frame frequency can be eight times (e.g., 960 Hz or 800 Hz) or more. When a plurality of scanning line driver circuits are provided, a scanning line driver circuit for driving even-numbered scanning lines is provided on one side and a scanning line driver circuit for driving odd-numbered scanning lines is provided on the opposite side; thus, increase in frame frequency can be realized.

When the circuit as shown in FIG. 36 includes a thin film transistor in which a microcrystalline semiconductor is used, the layout area can be reduced. Accordingly, a frame of the liquid crystal display device which is one example of the display device can be reduced. For example, mobility of the thin film transistor in which a microcrystalline semiconductor film is used is higher than that of a thin film transistor in which an amorphous semiconductor film is used; thus, the channel width of the thin film transistor can be reduced. As a result, a frame of the liquid crystal display device can be narrowed.

The thin film transistor in which a microcrystalline semiconductor film is used is harder to deteriorate than a thin film transistor in which an amorphous semiconductor film is used. Accordingly, when the microcrystalline semiconductor film is used, the channel width of the thin film transistor can be reduced. Alternatively, the thin transistor can be normally operated without any circuit for compensation for deterioration. Accordingly, the layout area of a thin transistor for one pixel can be reduced.

Embodiment Mode 8

Figure 37A:
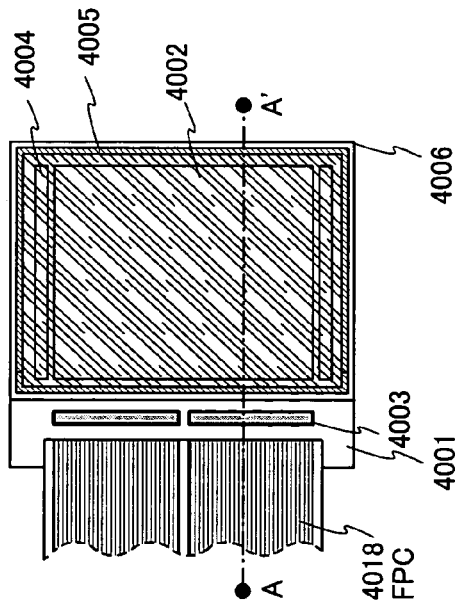
FIGS. 37A and 37B are a top view and a cross-sectional view, respectively, that describe a display panel.
Figure 37B:
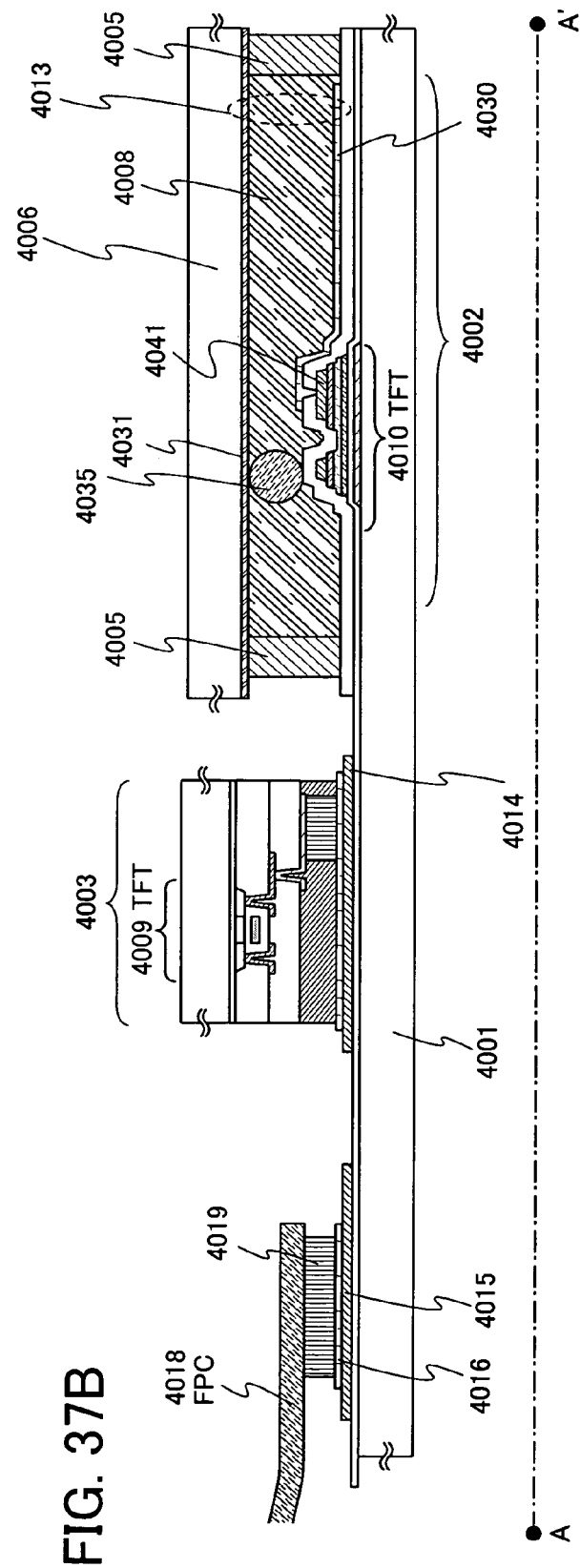

Next, the appearance and a cross section of a liquid crystal display panel which is one mode of the display device of the present invention will be described with reference to FIGS. 37A and 37B. FIG. 37A is a top view of a panel. In the panel, a thin film transistor 4010 in which a microcrystalline semiconductor film is used and a liquid crystal element 4013 which are formed over a first substrate 4001 are sealed between the first substrate 4001 and a second substrate 4006 by a sealing material 4005. FIG. 37B is a cross-sectional view along a line A-A' in FIG. 37A.

The sealing material 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Accordingly, the pixel portion 4002 and the scanning line driver circuit 4004 are sealed together with liquid crystal 4008 by the first substrate 4001, the sealing material 4005, and the second substrate 4006. Further, a signal line driver circuit 4003 formed using a polycrystalline semiconductor film over a different substrate is mounted on a region over the first substrate 4001, which is different from the region surrounded by the sealing material 4005. Note that in this embodiment mode, an example is described in which the signal line driver circuit including a thin film transistor using a polycrystalline semiconductor film is attached to the first substrate 4001; however, a signal line driver circuit may be formed using a transistor using a single crystalline semiconductor and attached to a substrate. FIGS. 37A and 37B illustrate a thin film transistor 4009 formed using a polycrystalline semiconductor film, which is included in the signal line driver circuit 4003.

Each of the pixel portion 4002 and the scanning line driver circuit 4004 which are provided over the first substrate 4001 includes a plurality of thin film transistors. FIG. 37B illustrates the thin film transistor 4010 included in the pixel portion 4002. The thin film transistor 4010 corresponds to a thin film transistor in which a microcrystalline semiconductor film is used.

A pixel electrode 4030 included in the liquid crystal element 4013 is electrically connected the thin film transistor 4010 through a wiring 4041. A counter electrode 4031 of the liquid crystal element 4013 is formed on the second substrate 4006. A portion where the pixel electrode 4030, the counter electrode 4031, and the liquid crystal 4008 overlap with each other corresponds to the liquid crystal element 4013.

Note that for each of the first substrate 4001 and the second substrate 4006, glass, a metal (typically, stainless steel), ceramics, or plastics can be used. As plastics, a fiberglass-reinforced plastics (FRP) plate, a polyvinyl fluoride (PVF) film, a polyester film, or an acrylic resin film can be used. Moreover, a sheet in which aluminum foil is interposed by a PVF film or a polyester film can also be used.

A spherical spacer 4035 is provided to control a distance (a cell gap) between the pixel electrode 4030 and the counter electrode 4031. Note that a spacer obtained by selective etching of an insulating film may be used.

A variety of signals and a potential supplied to the separately formed signal line driver circuit 4003, the scanning line driver circuit 4004, and the pixel portion 4002 are supplied from an FPC 4018 through lead wirings 4014 and 4015.

In this embodiment mode, a connection terminal 4016 is formed using the same conductive film as the pixel electrode 4030 included in the liquid crystal element 4013. Further, the lead wirings 4014 and 4015 are formed using the same conductive film as the wiring 4041.

The connection terminal 4016 is electrically connected to a terminal included in the FPC 4018 through an anisotropic conductive film 4019.

Note that although not shown, a liquid crystal display device shown in this embodiment mode includes an alignment film and a polarizing plate, and may also include a color filter or a blocking film.

FIGS. 37A and 37B illustrate an example in which the signal line driver circuit 4003 is separately formed and attached to the first substrate 4001; however, this embodiment mode is not limited to this structure. A scanning line driver circuit may be separately formed and attached to a substrate, or only part of a signal line driver circuit or part of a scanning line driver circuit may be separately formed and attached to a substrate.

This embodiment mode can be implemented in combination with any of the structures described in other embodiment modes.

Embodiment Mode 9

Figure 38A:
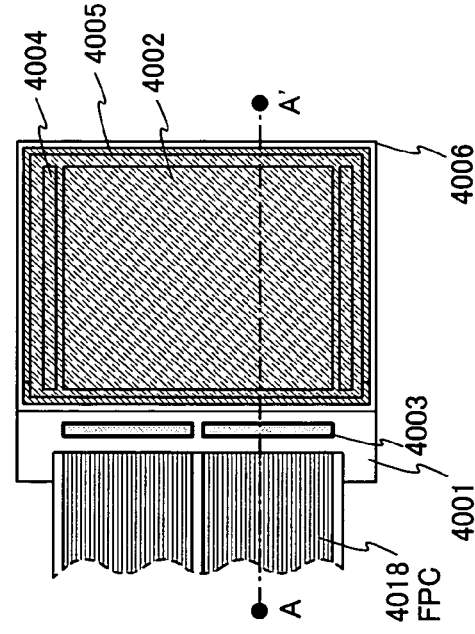
FIGS. 38A and 38B are a top view and a cross-sectional view, respectively, that describe a display panel.
Figure 38B:
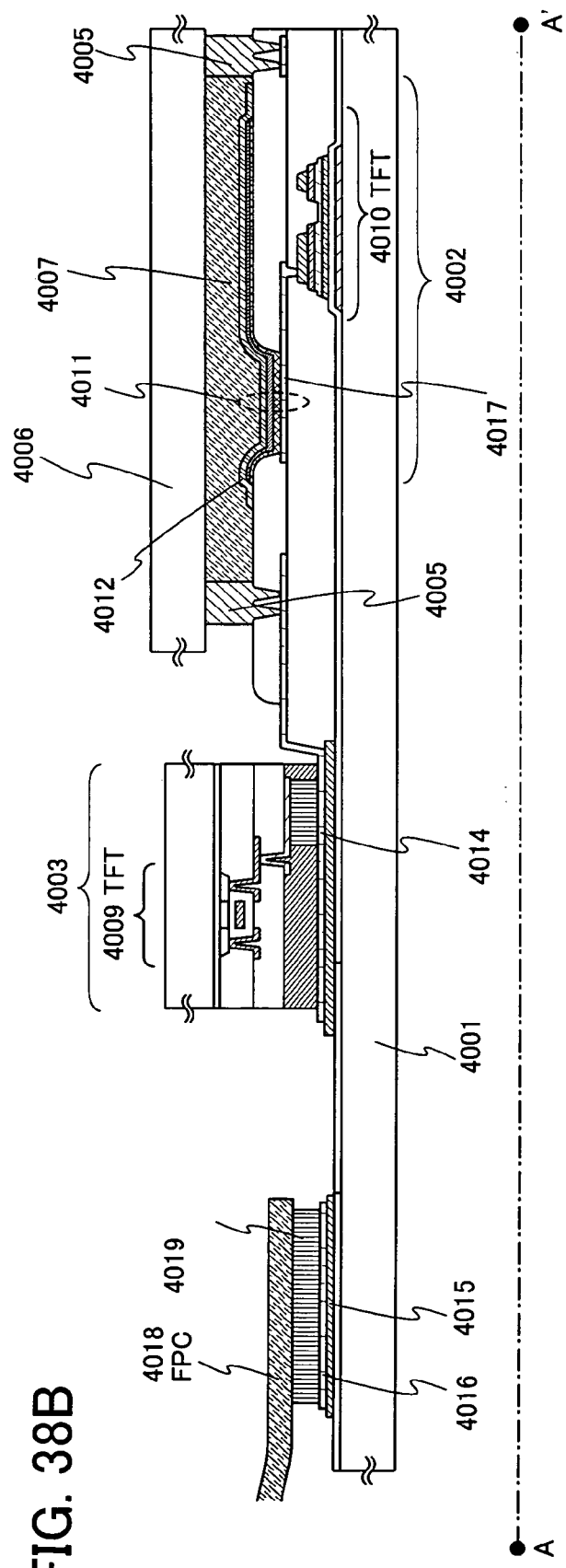

Next, the appearance and a cross section of a light-emitting display panel which is one mode of the display device of the present invention will be described with reference to FIGS. 38A and 38B. FIG. 38A is a top view of a panel. In the panel, a thin film transistor in which a microcrystalline semiconductor film is used and a light-emitting element which are formed over a first substrate are sealed between the first substrate and a second substrate by a sealing material. FIG. 38B is a cross-sectional view along a line A-A' in FIG. 38A.

The sealing material 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Accordingly, the pixel portion 4002 and the scanning line driver circuit 4004 are sealed together with a filler 4007 by the first substrate 4001, the sealing material 4005, and the second substrate 4006. Further, a signal line driver circuit 4003 formed using a polycrystalline semiconductor film over a different substrate is mounted on a region over the first substrate 4001, which is different from the region surrounded by the sealing material 4005. Note that in this embodiment mode, an example is described in which the signal line driver circuit including a thin film transistor using a polycrystalline semiconductor film is attached to the first substrate 4001; however, a signal line driver circuit may be formed using a transistor using a single crystalline semiconductor and attached to a substrate. FIG. 38B illustrates a thin film transistor 4009 formed using a polycrystalline semiconductor film, which is included in the signal line driver circuit 4003.

Each of the pixel portion 4002 and the scanning line driver circuit 4004 which are provided over the first substrate 4001 includes a plurality of thin film transistors. FIG. 38B illustrates the thin film transistor 4010 included in the pixel portion 4002. Note that in this embodiment mode, description is made on the assumption that the thin film transistor 4010 is a driving TFT; however, the thin film transistor 4010 may be a TFT for current control or a TFT for erasing. The thin film transistor 4010 corresponds to a thin film transistor in which a microcrystalline semiconductor film is used.

Reference numeral 4011 denotes a light-emitting element. A pixel electrode included in the light-emitting element 4011 is electrically connected to a source or drain electrode of the thin film transistor 4010 through a wiring 4017. Moreover, in this embodiment mode, a light-transmitting conductive film 4012 and a common electrode of the light-emitting element 4011 are electrically connected to each other. Note that a structure of the light-emitting element 4011 is not limited to that described in this embodiment mode. The structure of the light-emitting element 4011 can be changed as appropriate depending on a direction in which light is extracted from the light-emitting element 4011, the polarity of the thin film transistor 4010, or the like.

Although not shown in the cross-sectional view of FIG. 38B, a variety of signals and a potential supplied to the separately formed signal line driver circuit 4003, the scanning line driver circuit 4004, and the pixel portion 4002 are supplied from an FPC 4018 through lead wirings 4014 and 4015.

In this embodiment mode, a connection terminal 4016 is formed using the same conductive film as that of the wiring 4017. Further, the lead wirings 4014 and 4015 are formed using the same conductive film as that of the source or drain electrode of the thin film transistor 4010.

The connection terminal 4016 is electrically connected to a terminal included in the FPC 4018 through an anisotropic conductive film 4019.

The second substrate located in the direction in which light is extracted from the light-emitting element 4011 needs to be transparent. In this case, a light-transmitting material such as a glass plate, a plastic plate, a polyester film, or an acrylic film is used.

As the filler 4007, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used for the filler 4007.

If needed, an optical film such as a polarizing plate, a circular polarizing plate (including an elliptical polarizing plate), a retardation plate (a quarter-wave plate or a half-wave plate), or a color filter may be provided on an emission surface of the light-emitting element as appropriate. Further, the polarizing plate or the circular polarizing plate may be provided with an antireflection film. For example, anti-glare treatment for diffusing reflected light by unevenness of the surface and reducing reflection can be performed.

FIGS. 38A and 38B illustrate an example in which the signal line driver circuit 4003 is separately formed and attached to the first substrate 4001; however, this embodiment mode is not limited to this structure. A scanning line driver circuit may be separately formed and attached to a substrate, or only part of a signal line driver circuit or part of a scanning line driver circuit may be separately formed and attached to a substrate.

This embodiment mode can be implemented in combination with any of the structures described in other embodiment modes.

Embodiment Mode 10

The display device obtained by the present invention, and the like can be used for an active matrix display module. That is, the present invention can be implemented in any of electronic devices having a display portion into which such a display module is incorporated.

Examples of such electronic devices include a camera such as a video camera or a digital camera, a head-mounted display (a goggle-type display), a car navigation system, a projector, a car stereo, a personal computer, and a portable information terminal (e.g., a mobile computer, a cellular phone, and an e-book reader). FIGS. 34A to 34D show examples of such electronic devices.

Figure 34A:
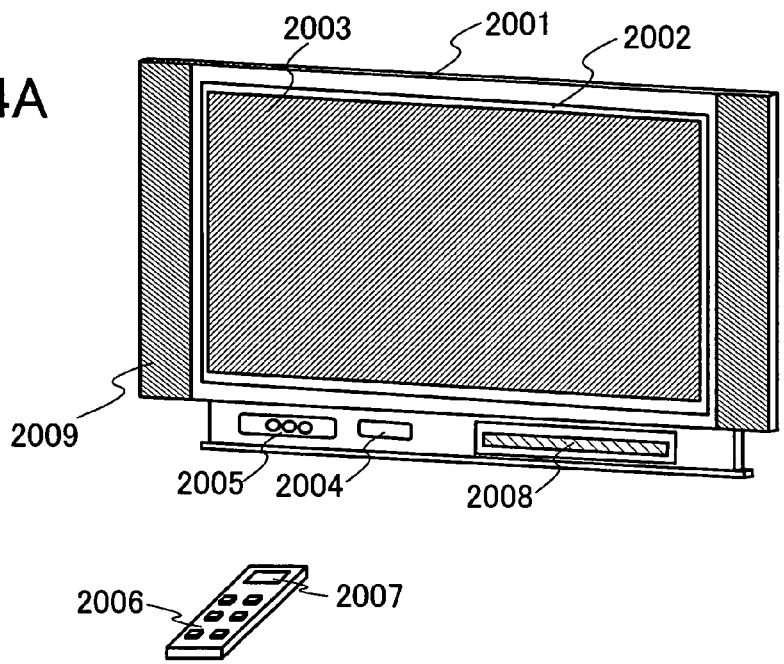
FIGS. 34A to 34D are perspective views each describing an electronic appliance using a light-emitting device.

FIG. 34A shows a television device. The television device can be completed by incorporating a display module into a housing as shown in FIG. 34A. A display panel at the stage after an FPC is attached is also referred to as a display module.

A main screen 2003 is formed using the display module, and other accessories such as a speaker portion 2009 and an operation switch are provided. Thus, the television device can be completed.

As shown in FIG. 34A, a display panel 2002 using a display element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by a switch incorporated into the housing or a separate remote control unit 2006. The remote control unit may include a display portion 2007 for displaying information to be output.

Further, the television device may include a sub screen 2008 formed using a second display panel for displaying channels, sound volume, and the like, in addition to the main screen 2003. In this structure, the main screen 2003 may be formed using a liquid crystal display panel with an excellent viewing angle, and the sub screen may be formed using a light-emitting display panel in which display is performed with low power consumption. Alternatively, when reduction in power consumption is prioritized, a structure may be employed in which the main screen 2003 is formed using a light-emitting display panel, the sub screen is formed using a light-emitting display panel, and the sub screen can be turned on and off.

Figure 35:
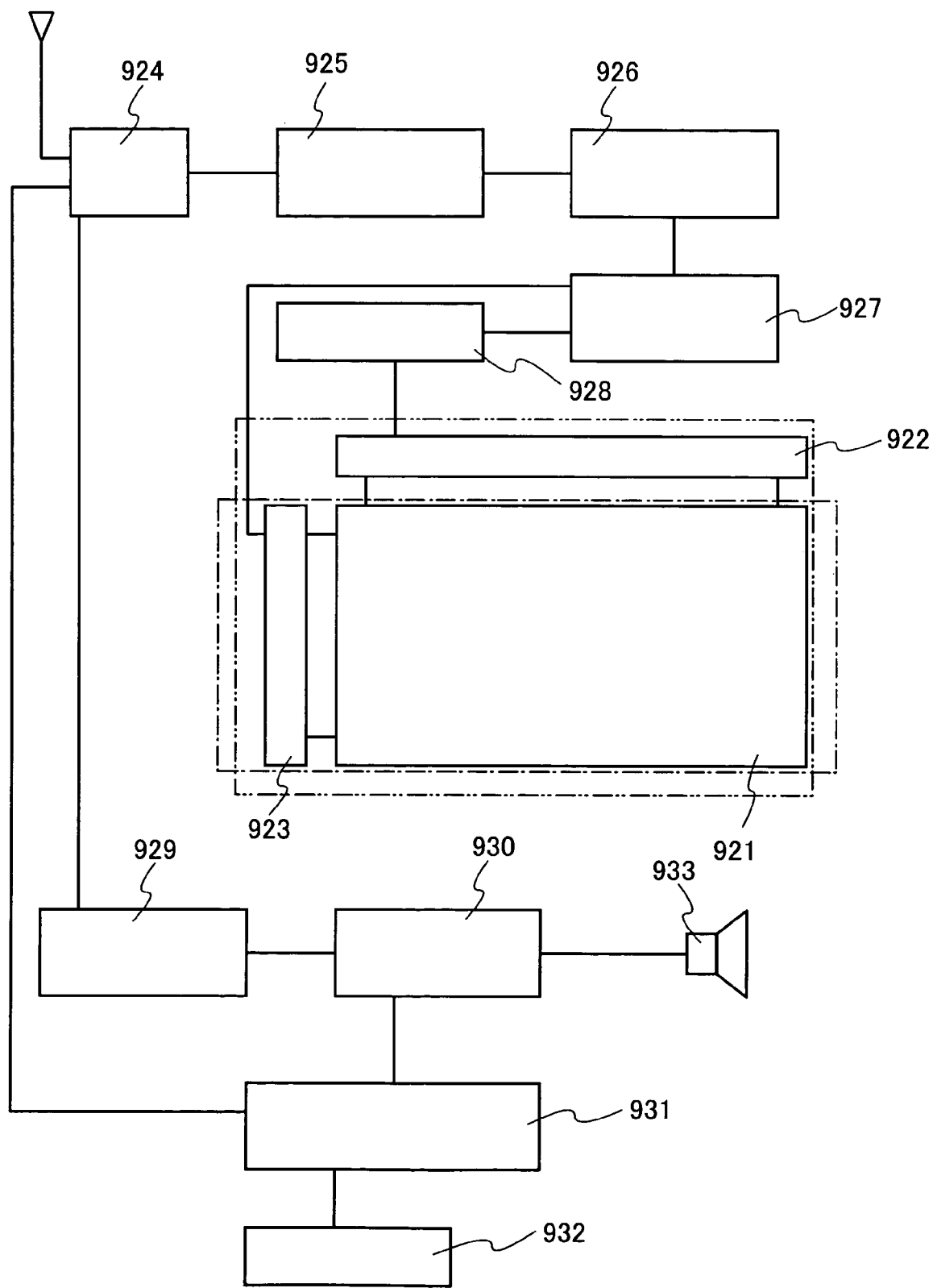
FIG. 35 is a diagram describing an electronic appliance using a light-emitting device.

FIG. 35 is a block diagram of a main structure of a television device. A display panel is provided with a pixel portion 921. A signal line driver circuit 922 and a scanning line driver circuit 923 may be mounted on the display panel by a COG method.

As for other external circuits, the television device includes a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like, on the input side of the video signal. The control circuit 927 outputs signals to each of the scanning line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a television device and can be applied to various uses, e.g., a monitor of a personal computer, a large display medium such as an information display board at the train station, the airport, or the like, or an advertisement display board on the street, and the like.

Figure 34B:
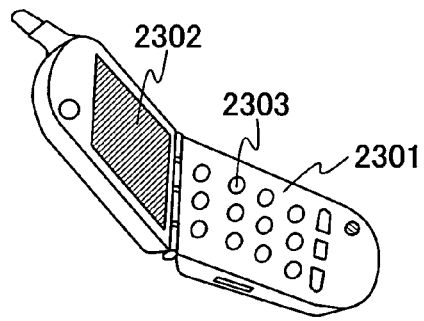

FIG. 34B shows an example of a cellular phone 2301. The cellular phone 2301 includes a display portion 2302, an operation portion 2303, and the like. When the display device described in the above-described embodiment mode is used for the display portion 2302, mass productivity can be increased.

Figure 34C:
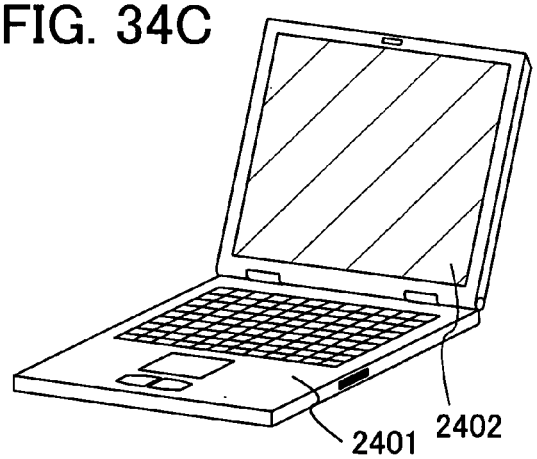

A portable computer shown in FIG. 34C includes a main body 2401, a display portion 2402, and the like. When the display device described in the above-described embodiment mode is used for the display portion 2402, mass productivity can be increased.

Figure 34D:
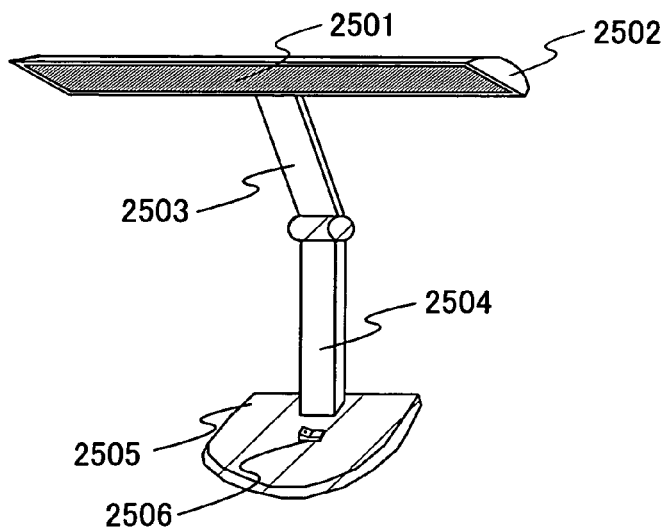

FIG. 34D shows a desk lamp including a lighting portion 2501, a shade 2502, an adjustable arm 2503, a support 2504, a base 2505, and a power source switch 2506. The desk lamp is formed using the light-emitting device, which is described in Embodiment Mode 6, for the lighting portion 2501. Note that a lamp includes a ceiling light, a wall light, and the like in its category. By employing the display device described in Embodiment Mode 6, mass productivity can be increased, and an inexpensive desk lamp can be provided.

Embodiment 1

In this embodiment, a growth rate of a microcrystalline silicon film formed under a film formation condition in which plasma is generated by application of one type of high-frequency power, and a growth rate of a microcrystalline silicon film formed under a film formation condition under which plasma is generated by superposed application of two types of high-frequency powers are compared. Note that the growth rate excludes a growth rate of the film during an incubation time in which the film does not grow much at all, which starts from the start of film formation, and refers to a sedimentation rate of the film, which starts right after the incubation time has passed, considering that time as time zero at which film formation starts. Further, the film formation rate refers to a sedimentation rate considering as time zero the time at which a gas such as silane gas is introduced into a chamber and a high-frequency power is input.

Under each of the film formation conditions, flow rate of $SiH_4$ was set at 4 sccm, flow rate of $H_2$ was set at 400 sccm, film formation pressure was set at 100 Pa, and substrate temperature was set at 200° C. Further, under each of the film formation conditions, a silicon nitride film with a thickness of 50 nm was formed over a glass substrate and then a microcrystalline silicon film with a thickness of 50 nm was formed thereover, to compare grow rates.

Comparative example 1 is an example in which film formation was performed by application of one type of high-frequency power (power source frequency of 60 MHz and electrical power of 15 W). As a result of performing film formation with an electrode interval of 20 mm, the growth rate of a microcrystalline silicon film was 2.8 nm/min, and the incubation time was 0.7 minutes.

Further, comparative example 2 is an example in which film formation was performed by application of one type of high-frequency power (power source frequency of 13.56 MHz and electrical power of 80 W). As a result of performing film formation with an electrode interval of 30 mm, the growth rate of a microcrystalline silicon film was 4.8 nm/min, and the incubation time was 0.4 minutes.

Furthermore, comparative example 3 is an example in which film formation was performed by application of one type of high-frequency power (power source frequency of 60 MHz and electrical power of 80 W). As a result of performing film formation with an electrode interval of 30 mm, the growth rate of a microcrystalline silicon film was 3.3 nm/min, and the incubation time was 0.6 minutes.

For sample 1, film formation was performed by superposed application of two types of high-frequency powers. Film formation was performed using a first high-frequency power with a frequency of 13.56 MHz and electrical power of 60 W and a second high-frequency power with a frequency of 60

MHz and electrical power of 20 W, with an electrode interval of 30 mm. In sample 1, the growth rate of a microcrystalline silicon film was 6.3 nm/min, and the incubation time was 0.8 minutes.

Further, for sample 2, film formation was performed by superposed application of two types of high-frequency powers. Film formation was performed under a first high-frequency power condition with a frequency of 13.56 MHz and electrical power of 40 W and a second high-frequency power condition with a frequency of 60 MHz and electrical power of 40 W, with an electrode interval of 30 mm. In sample 2, the growth rate of a microcrystalline silicon film was 5.5 nm/min, and the incubation time was 0.3 minutes.

Furthermore, for sample 3, film formation was performed by superposed application of two types of high-frequency powers. Film formation was performed under a first high-frequency power condition with a frequency of 13.56 MHz and electrical power of 20 W and a second high-frequency power condition with a frequency of 60 MHz and electrical power of 60 W, with an electrode interval of 30 mm. In sample 3, the growth rate of a microcrystalline silicon film was 3.6 nm/min, and the incubation time was 0 minutes.

In sample 1, improvement in growth rate by superposed application is realized. Although the incubation time is 0.8 minutes, it can be said that sample 1 has a condition under which the growth rate of a microcrystalline silicon film is the highest.

In sample 2, the incubation time is less than those in comparative examples 1 to 3. Further, in sample 3, elimination of the incubation time is realized by superposed application of high-frequency powers, and evenness of film quality is realized by the elimination of the incubation time. In sample 3, since the incubation time is eliminated, the growth rate in sample 3 can be considered the film formation rate. In a film formation process that is a single wafer-processing type, there is a waiting time for each substrate that corresponds to the incubation time, and there is a possibility that throughput is reduced in an overall manufacturing process of a semiconductor device. Accordingly, elimination of the incubation time is useful in terms of mass production.

That is, the film formation condition in sample 2 is suitable as a film formation condition of a microcrystalline semiconductor film formed in an initial stage of film formation, that improves quality and evenness of a semiconductor region. For example, if the film formation condition in sample 2 is employed as a first film formation condition and the film formation condition in sample 1 is employed as a second film formation condition, a lower part of a film near an interface with a gate insulating film is formed under the first film formation condition, which is low in film formation rate but results in a good quality film, and then an upper part of the film is deposited under a second film formation condition with a high film formation rate. In this case, since a film containing a crystal grain that becomes a nucleus is already formed under the first film formation condition before switching to the second film formation condition, there is barely an incubation time under the second condition, and a microcrystalline film can be formed efficiently.

Of course, it is useful to form a microcrystalline silicon film by employing the film formation condition in sample 2 as the first film formation condition and the film formation condition in comparative example 2 as the second film formation condition. In other words, in the initial stage of film formation, film formation is performed by superposed application of two types of high-frequency powers, and then formation of a microcrystalline semiconductor film is continued after switching to a film formation condition in which input of one of the high-frequency powers is stopped.

Note that the above experiment results are shown in FIG. 39. In each of samples 1 to 3 in which film formation is performed by superposed application, distribution of film thickness of the microcrystalline silicon film is suppressed to ±3%, which shows favorable evenness of film thickness.

This application is based on Japanese Patent Application serial no. 2007-213102 filed with Japan Patent Office on Aug. 17 in 2007, the entire contents of which are hereby incorporated by reference.

What is claimed is:

1. A manufacturing method of a semiconductor device comprising:
   forming a gate electrode over a substrate having an insulating surface;
   forming an insulating film over the gate electrode;
   introducing the substrate into a vacuum chamber;
   introducing a source gas into the vacuum chamber;
   forming a lower part of a microcrystalline semiconductor film in the vacuum chamber under a first film formation condition in which glow discharge plasma is generated by superposed application of a first high-frequency power having a frequency with a wavelength of 10 m or longer and a second high-frequency power having a frequency with a wavelength of shorter than 10 m, to an electrode that generates glow discharge plasma;
   depositing an upper part of the microcrystalline semiconductor film under a second film formation condition in which at least one of substrate temperature, power, frequency, flow rate of source gas, and degree of vacuum is different from that under the first film formation condition; and
   forming a buffer layer over the microcrystalline semiconductor film.

2. The manufacturing method of a semiconductor device according to claim 1, wherein the buffer layer is an amorphous semiconductor film that is formed in a different vacuum chamber from the vacuum chamber, under a film formation condition in which a substrate temperature is higher than or equal to 300° C. and less than 400° C.

3. The manufacturing method of a semiconductor device according to claim 1, wherein:
   a semiconductor film containing an n-type impurity element is formed over the buffer layer;
   source and drain electrodes are formed over the semiconductor film containing an n-type impurity element;
   the semiconductor film containing an n-type impurity element is etched to form source and drain regions; and
   a portion of the buffer layer is etched and removed such that regions overlapping the source and drain regions are left remaining.

4. The manufacturing method of a semiconductor device according to claim 1, wherein the second high-frequency power source is pulse oscillated.

5. The manufacturing method of a semiconductor device according to claim 1, wherein the source gas for forming the microcrystalline semiconductor film contains silane gas, hydrogen gas, and trimethyl boron gas.

6. The manufacturing method of a semiconductor device according to claim 1, wherein the first film formation condition is a film formation condition under which a substrate temperature is higher than or equal to 100° C. and lower than 300° C.

7. The manufacturing method of a semiconductor device according to claim 1, wherein the insulating film is formed in the vacuum chamber by generating glow discharge plasma by superposed application of the first high-frequency power having a frequency with a wavelength of 10 m or longer and the second high-frequency power having a frequency with a wavelength of shorter than 10 m, to an electrode that generates glow discharge plasma.

8. The manufacturing method of a semiconductor device according to claim 1, wherein the insulating film is formed in the vacuum chamber by generating glow discharge plasma by superposed application of a first high-frequency power of 3 MHz to 30 MHz and a second high-frequency power of 30 MHz to 300 MHz, to an electrode that generates glow discharge plasma.

9. A manufacturing method of a semiconductor device comprising:
    forming a gate electrode over a substrate having an insulating surface;
    forming an insulating film over the gate electrode;
    introducing the substrate into a vacuum chamber;
    introducing a source gas into the vacuum chamber;
    forming a lower part of a microcrystalline semiconductor film in the vacuum chamber under a first film formation condition in which glow discharge plasma is generated by superposed application of a first high-frequency power of 3 MHz to 30 MHz and a second high-frequency power of 30 MHz to 300 MHz, to an electrode that generates glow discharge plasma;
    depositing an upper part of the microcrystalline semiconductor film under a second film formation condition in which at least one of substrate temperature, power, frequency, flow rate of source gas, and degree of vacuum is different from that under the first film formation condition; and
    forming a buffer layer over the microcrystalline semiconductor film.

10. The manufacturing method of a semiconductor device according to claim 9, wherein the buffer layer is an amorphous semiconductor film that is formed in a different vacuum chamber from the vacuum chamber, under a film formation condition in which a substrate temperature is higher than or equal to 300° C. and less than 400° C.

11. The manufacturing method of a semiconductor device according to claim 9, wherein before introducing the substrate into the vacuum chamber, vacuum evacuation is performed so that an atmosphere inside the vacuum chamber has a degree of vacuum that is over $1\times10^{-8}$ Pa and less than or equal to $1\times10^{-5}$ Pa, and then a source gas is introduced to form a film over an inner wall of the vacuum chamber.

12. The manufacturing method of a semiconductor device according to claim 9, wherein before introducing the substrate into the vacuum chamber, vacuum evacuation is performed so that an atmosphere inside the vacuum chamber has a degree of vacuum that is over $1\times10^{-8}$ Pa and less than or equal to $1\times10^{-5}$ Pa, and then hydrogen gas or a rare gas is introduced to generate plasma.

13. The manufacturing method of a semiconductor device according to claim 9, wherein hydrogen gas or a rare gas is introduced to generate plasma after the substrate is introduced into the vacuum chamber.

14. The manufacturing method of a semiconductor device according to claim 9, wherein:
    a semiconductor film containing an n-type impurity element is formed over the buffer layer;
    source and drain electrodes are formed over the semiconductor film containing an n-type impurity element;
    the semiconductor film containing an n-type impurity element is etched to form source and drain regions; and
    a portion of the buffer layer is etched and removed such that regions overlapping the source and drain regions are left remaining.

15. The manufacturing method of a semiconductor device according to claim 9, wherein the second high-frequency power source is pulse oscillated.

16. The manufacturing method of a semiconductor device according to claim 9, wherein the source gas for forming the microcrystalline semiconductor film contains silane gas, hydrogen gas, and trimethyl boron gas.

17. The manufacturing method of a semiconductor device according to claim 9, wherein the first film formation condition is a film formation condition under which a substrate temperature is higher than or equal to 100° C. and lower than 300° C.

18. The manufacturing method of a semiconductor device according to claim 9, wherein the insulating film is formed in the vacuum chamber by generating glow discharge plasma by superposed application of a first high-frequency power having a frequency with a wavelength of 10 m or longer and a second high-frequency power having a frequency with a wavelength of shorter than 10 m, to an electrode that generates glow discharge plasma.

19. The manufacturing method of a semiconductor device according to claim 9, wherein the insulating film is formed in the vacuum chamber by generating glow discharge plasma by superposed application of the first high-frequency power of 3 MHz to 30 MHz and the second high-frequency power of 30 MHz to 300 MHz, to an electrode that generates glow discharge plasma.

20. The manufacturing method of a semiconductor device according to claim 9, wherein the first film formation condition is superposed application of the first high-frequency power and the second high-frequency power which has more power than the first high-frequency power,
    wherein the second film formation condition is superposed application of a third high-frequency power which has more power than the first high-frequency power and a fourth high-frequency power which has less power than the third high-frequency power,
    wherein the third high-frequency power has the same frequency as the first high-frequency power, and
    wherein the fourth high-frequency power has the same frequency as the second high-frequency power.

21. The manufacturing method of a semiconductor device according to claim 9, wherein the first film formation condition is superposed application of the first high-frequency power and the second high-frequency power,
    wherein the second film formation condition is application of a third high-frequency power which has the same frequency as the first high-frequency power, and not superposed application.

* * * * *